(12) United States Patent
Liaw et al.

(10) Patent No.: US 9,583,438 B2
(45) Date of Patent: Feb. 28, 2017

(54) INTERCONNECT STRUCTURE WITH MISALIGNED METAL LINES COUPLED USING DIFFERENT INTERCONNECT LAYER

(71) Applicant: TAIWAN SEMICONDUCTOR MANUFACTURING COMPANY LTD., Hsinchu (TW)

(72) Inventors: Jhon Jhy Liaw, Hsinchu County (TW); Yen-Huei Chen, Hsinchu County (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

(21) Appl. No.: 14/978,487

(22) Filed: Dec. 22, 2015

(65) Prior Publication Data
US 2016/0190065 A1 Jun. 30, 2016

Related U.S. Application Data

(60) Provisional application No. 62/096,978, filed on Dec. 26, 2014.

(51) Int. Cl.
H01L 23/48 (2006.01)
H01L 23/528 (2006.01)
H01L 23/522 (2006.01)
H01L 23/532 (2006.01)
H01L 27/02 (2006.01)
H01L 27/11 (2006.01)

(52) U.S. Cl.
CPC ...... *H01L 23/5283* (2013.01); *H01L 23/5226* (2013.01); *H01L 23/5286* (2013.01); *H01L 23/53238* (2013.01); *H01L 27/0207* (2013.01); *H01L 27/1104* (2013.01); *H01L 2924/0002* (2013.01)

(58) Field of Classification Search
CPC ............. H01L 23/5283; H01L 27/0207; H01L 27/1104
USPC ........................................ 257/751
See application file for complete search history.

(56) References Cited

U.S. PATENT DOCUMENTS 9,385,088 B2 * 7/2016 Or-Bach ............. H01L 23/5386
2016/0079167 A1 * 3/2016 Zhu ....................... H01L 21/768
257/390

* cited by examiner

Primary Examiner — Anthony Ho
(74) Attorney, Agent, or Firm — WPAT, P.C.; Anthony King

(57) ABSTRACT

In some embodiments, an interconnect structure includes a first metal line, a second metal line and a first connection structure. The first metal line is formed in a first interconnect layer, extends in length substantially along a first direction and ends at a first end portion. The second metal line is formed in the first interconnect layer, starts from a second end portion and extends in length substantially along the first direction. The second metal line is misaligned with the first metal line in the first direction. The first connection structure couples the first metal line to the second metal line. The first connection structure includes a first end-to-end portion formed in a second interconnect layer different from the first interconnect layer, and is overlapped with the first end portion and the second end portion.

24 Claims, 59 Drawing Sheets

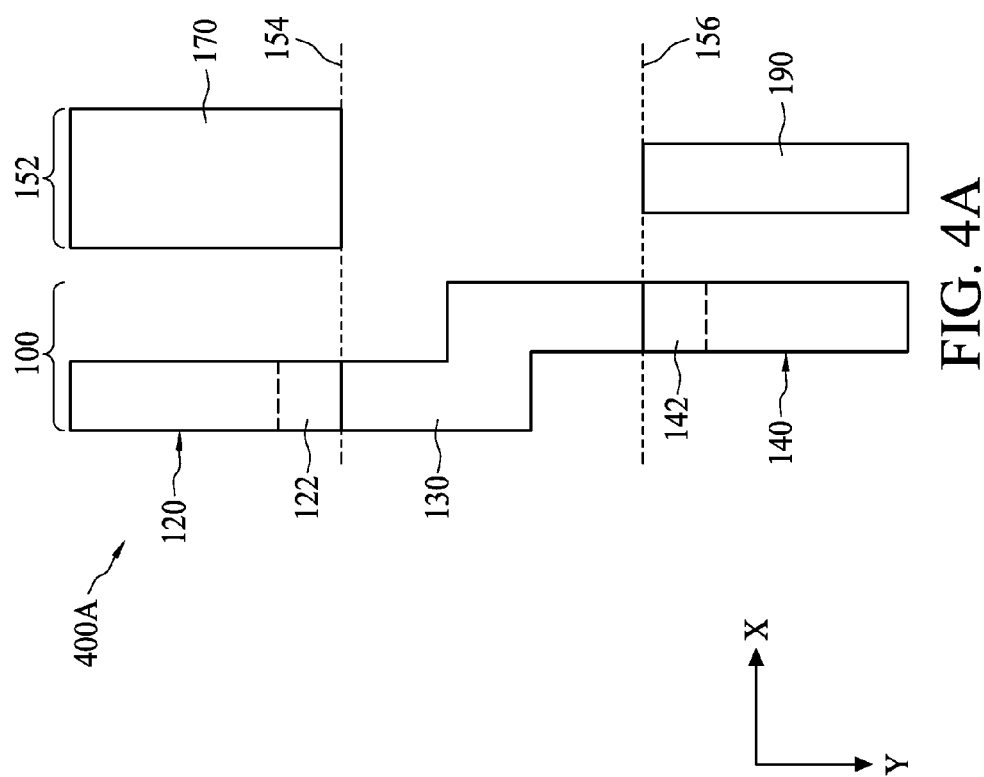

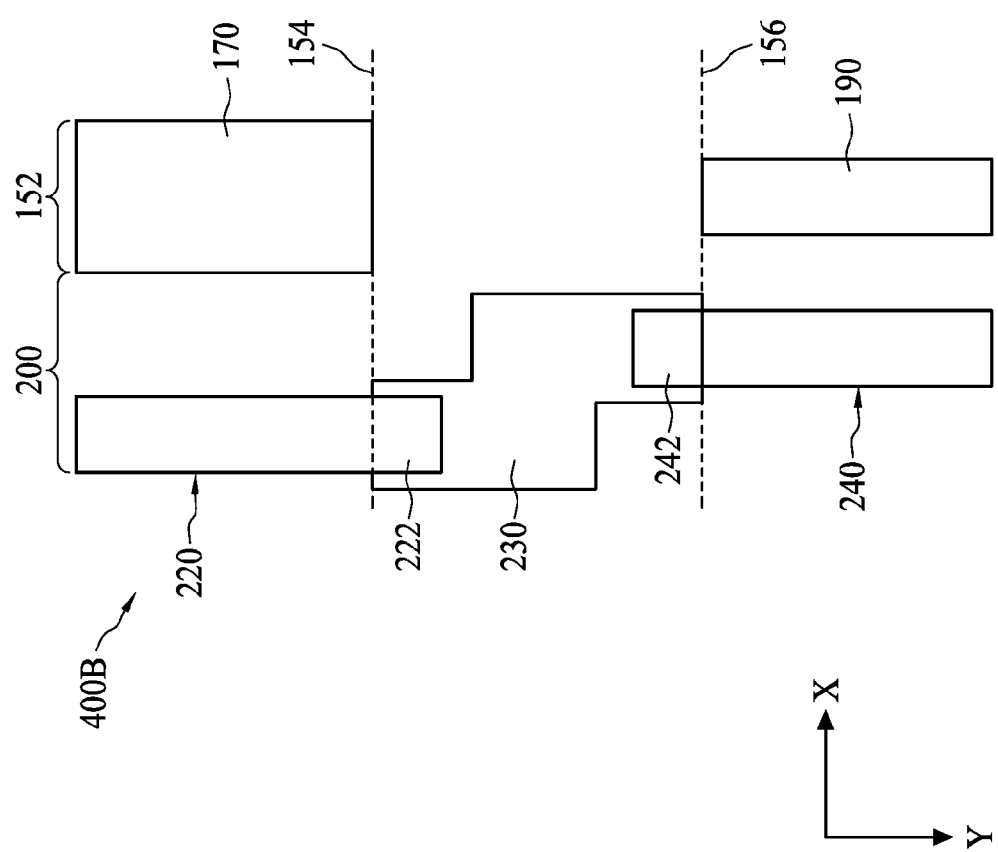

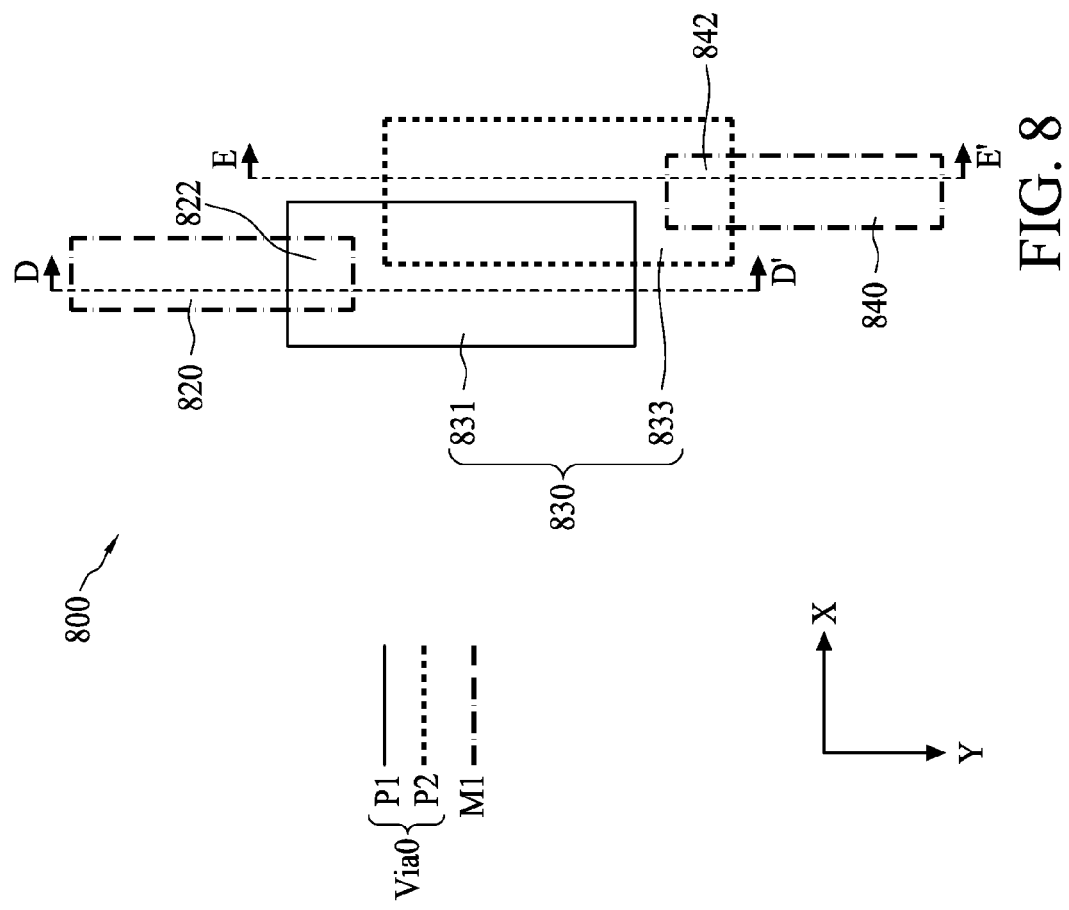

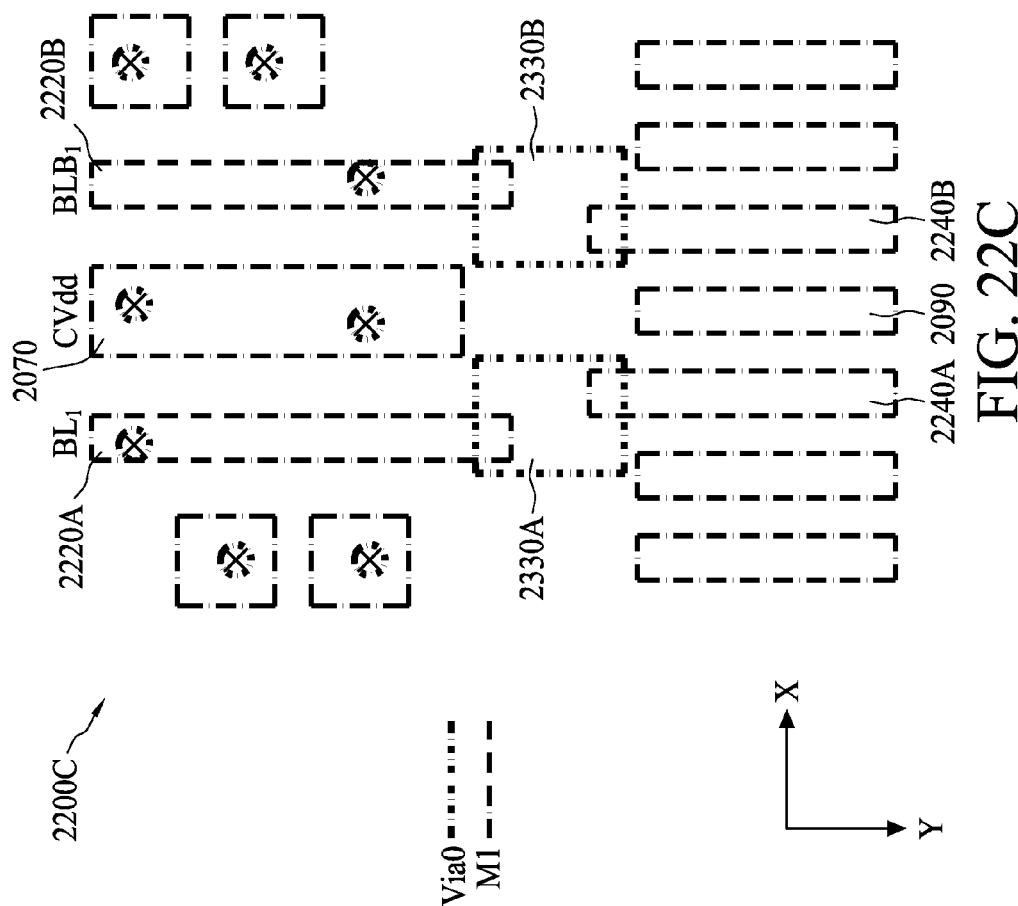

INTERCONNECT STRUCTURE WITH MISALIGNED METAL LINES COUPLED USING DIFFERENT INTERCONNECT LAYER

BACKGROUND

A semiconductor chip includes circuit blocks that provide different functions and communicate to achieve a purpose. For example, a single-bank static random access memory (SRAM) chip includes circuit blocks such as an array of array cells, a word line decoding circuit and an input/output (TO) circuit. The array of array cells functions to store data at addressable locations. The word line decoding circuit functions to select a row in the array of array cells for access in accordance with a row address. The IO circuit functions to access a column in the selected row of array cells in accordance with a column address. An interconnect structure of the semiconductor chip includes metal line portions for the corresponding array of array cells, word line decoding circuit and IO circuit, etc. Each metal line extends from one portion to another portion. For example, a bit line and a complementary bit line running along a column of the array of array cells are extended to the IO circuit such that the IO circuit can access the selected array cell. The circuit blocks together with the coupled respective portions of the interconnect structure serves to store and restore data.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4A is a top-view diagram of an interconnect structure that has a twice bent and substantially non-widened end-to-end portion as shown in FIG. 2A which extends beyond ends of metal lines adjacent to corresponding metal lines and with which the end-to-end portion is overlapped, in accordance with some embodiments.

FIG. 4B is a top-view diagram of another interconnect structure that has a twice bent and widened end-to-end portion as shown in FIG. 2B which is not substantially extended beyond ends of metal lines adjacent to corresponding metal lines with which the end-to-end portion is overlapped, in accordance with some embodiments.

FIG. 8 is a diagram of a layout for forming the interconnect structure shown in FIG. 2B, in accordance with some embodiments.

FIG. 22C is a diagram of another layout including the layers upto the metal layer M1 of the circuit in the BEOL portion shown in FIG. 23, in accordance with some embodiments.

DETAILED DESCRIPTION

Figure 1A:
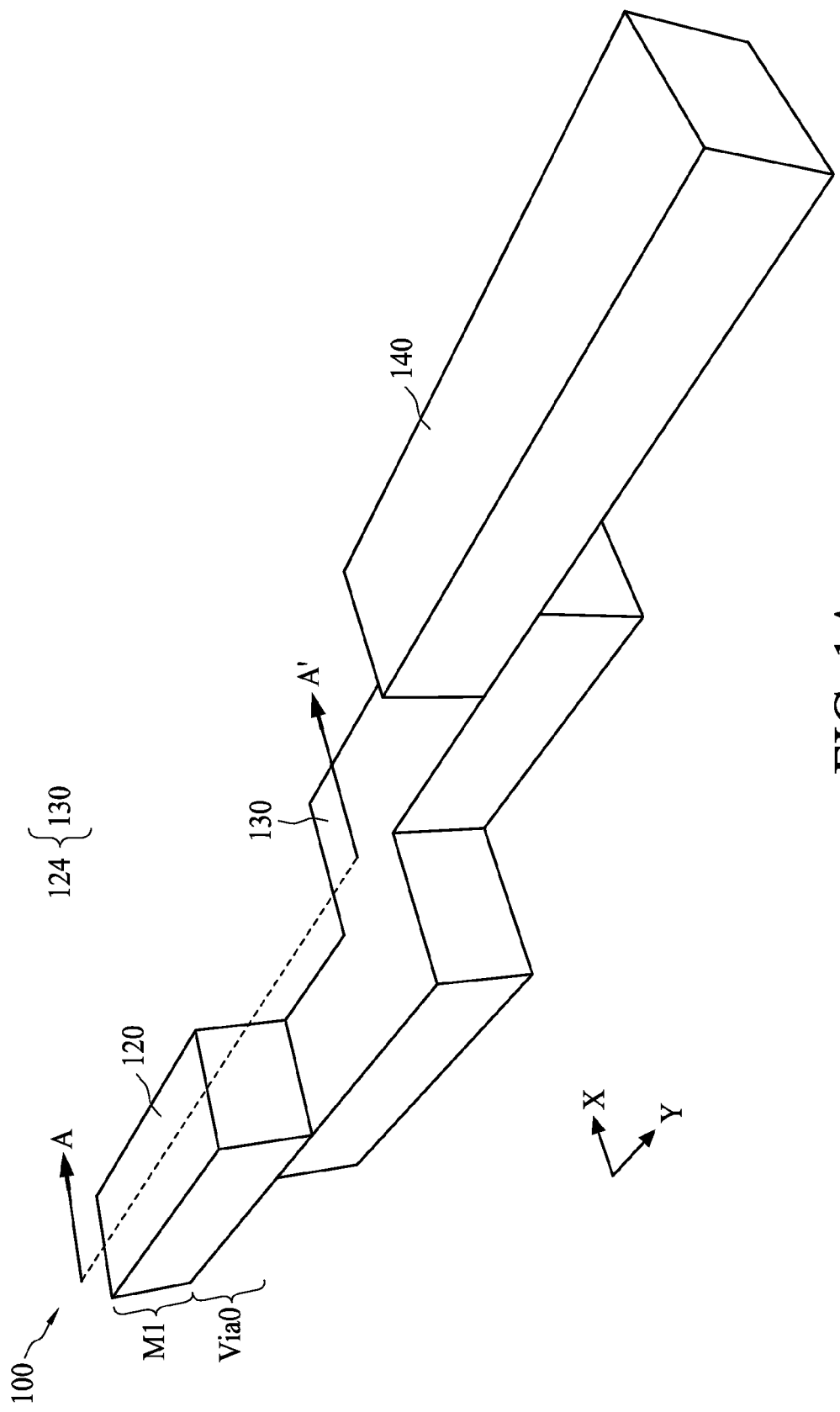
FIG. 1A is a perspective diagram of an interconnect structure with misaligned metal lines and coupled using an under interconnect layer, in accordance with some embodiments.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Same elements are labeled with the same reference numerals throughout the present disclosure.

In some embodiments, the phrase "A and/or B" is used to describe a set including only A, only B, and A and B.

In some embodiments, spatially relative terms, such as "an X direction" and "a Y direction," "a direction opposite the X direction" and "the Y direction," "the X direction" and "a direction opposite the Y direction," and "the direction opposite the X direction" and "the direction opposite the Y direction," "start" and "end," "behind" and "beyond," "over" and "under," and the like, may be used for ease of description to describe one element or one feature's relationship to another element(s) or another feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, when an element is referred to as being "connected to" or "coupled to" another element, it may be directly connected to or coupled to the other element, or intervening elements may be present.

Interconnect Structure with Misaligned Metal Lines Coupled Using Under Layer

As widths for metal lines in a semiconductor chip keep shrinking such as to 10 nm or below, more restrictive routing rules are applied for chip design to accommodate to the situation in which difficulties in metal line patterning arise due to limitations in existing lithography tools. An example of such restrictive routing rules is a uni-directional routing rule and a fixed pitch environment for metal lines in some of the metal layers. Under these restrictive routing rules, no bent or jog is allowed in a metal line in a metal layer. Therefore, a strategy for chip area reduction that routes a portion of a metal line on-grid, bents the metal line and routes another portion of the metal line not on-grid as in other approaches cannot be adopted. To remedy such limitation, in some embodiments, misaligned metal lines in a first interconnect layer, i.e., a portion of the metal line routed on grid and another portion of the metal line routed not on-grid, are connected by a connection structure including an end-to-end portion in a second interconnect layer under the first interconnect layer. The connection structure is a single damascene structure and therefore is formed separately from the misaligned metal lines which are subject to the restrictive routing rules for the first interconnect layer.

In some embodiments, the term "routing" refers to a stage in forming a layout corresponding to a netlist, in which given a placement of cells, the netlist and technology information, the necessary wiring to connect the cells is determined with an optimizing objective such as minimizing total wire length under constraints such as design rules and routing resources.

FIG. 1A is a perspective diagram of an interconnect structure 100 with misaligned metal lines 120 and 140 coupled using an under interconnect layer, in accordance with some embodiments. FIG. 1A illustrates a connection structure 124 of the misaligned metal lines 120 and 140 that includes an end-to-end portion 130 in a via layer via0 under a metal layer M1 in which the metal lines 120 and 140 reside. In some embodiments, the interconnect structure 100 includes the metal lines 120 and 140 and the connection structure 124 coupling the metal line 120 to the metal line 140. The metal line 120 is formed in the metal layer M1 and extends in length substantially along a Y direction. The metal line 140 is also formed in the same interconnect layer as the metal line 120 and extends in length substantially along the Y direction. The metal line 120 is misaligned with the metal line 140 along the Y direction. In other words, the metal line 140 is shifted along an X direction substantially orthogonal to the Y direction with respect to the metal line 120. The connection structure 124 includes the end-to end portion 130. The end-to-end portion 130 is formed in the via layer via0 under the metal layer M1, and overlaps with the metal lines 120 and 140.

In some embodiments, the term "substantially along," "substantially parallel" or "substantially orthogonal" for a first direction and a second direction refers to the first direction within a deviation angle such as 5 degrees, 10 degrees, and 15 degrees, etc., from a reference direction. For "substantially along" or "substantially parallel," the reference direction is the second direction, and for "substantially orthogonal," the reference direction is 90 degrees from the second direction. Other ways to determine the first direction being "substantially along,", "substantially parallel" or "substantially orthogonal" to the second direction are within the contemplated scope of the present disclosure. For example, a ratio of a deviation angle of the first direction from a first reference direction and a deviation angle of the second direction from a second reference direction is greater than a percentage such as 85%, 90% and 95%, etc. For "substantially along" or "substantially parallel", the first reference direction is the same as the second reference direction, and for "substantially orthogonal", the first reference direction is 90 degrees from the second reference direction. For another example, a difference between a deviation angle of the first direction from the first reference direction and a deviation angle of the second direction from the second reference direction is less than a percentage such as 5%, 10% and 15%, etc., of the deviation angle of the second direction from the second reference direction.

Figure 1B:
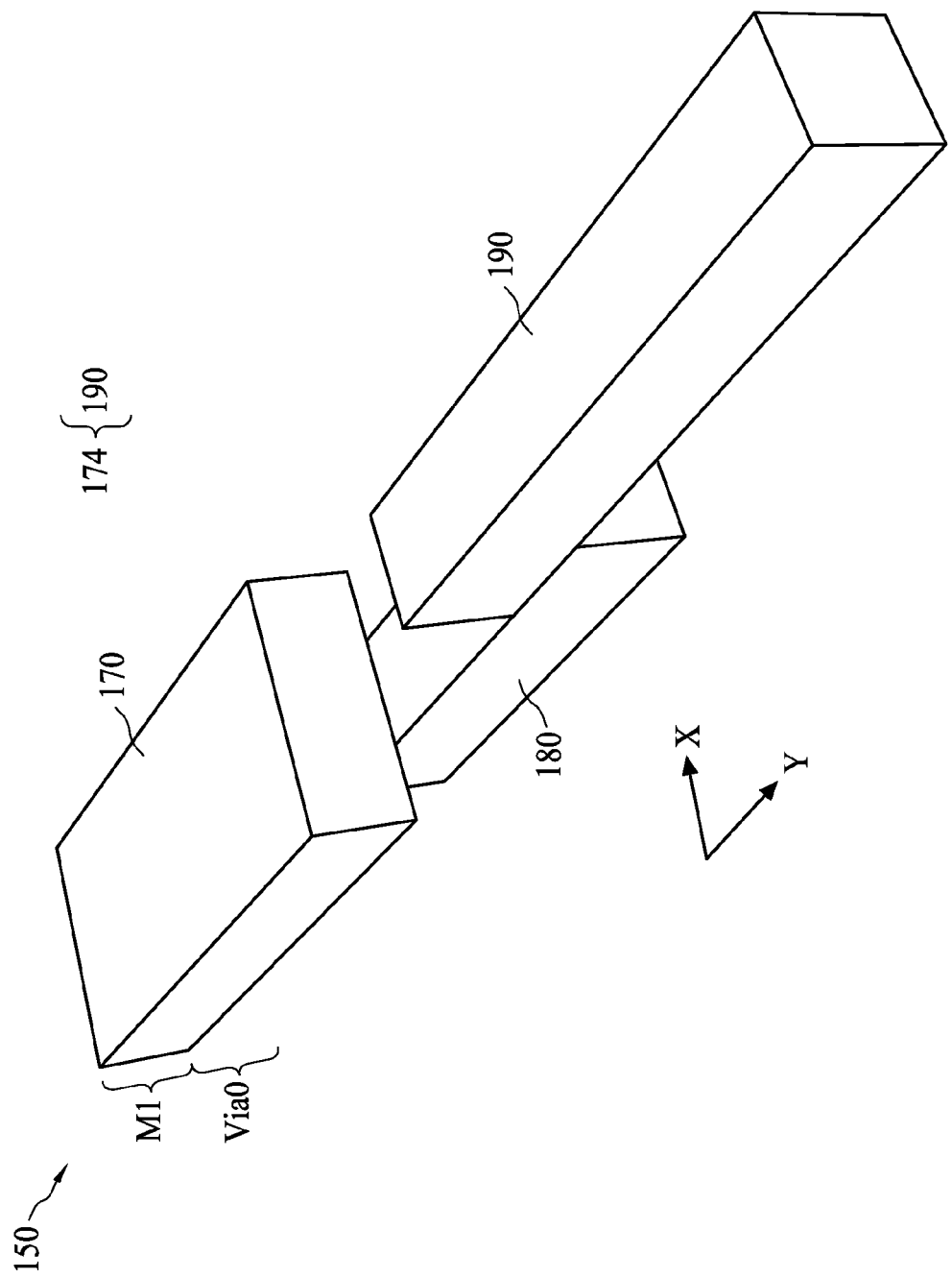
FIG. 1B is a perspective diagram of another interconnect structure with aligned metal lines and coupled using an under interconnect layer, in accordance with some embodiments.

FIG. 1B is a perspective diagram of another interconnect structure 150 with aligned metal lines 170 and 190 coupled using an under interconnect layer, in accordance with some embodiments. Similar to the metal lines 120 and 140 in FIG. 1A, the metal lines 170 and 190 are extended in length substantially along the Y direction. Compared to the interconnect structure 100 shown in FIG. 1A, the metal lines 170 and 190 formed in the metal layer M1 are aligned with each other in the Y direction. The interconnect structure 150 includes the metal lines 170 and 190 and the connection structure 174 coupling the metal line 170 to the metal line 190. Similar to the connection structure 124 described with reference to FIG. 1A, the connection structure 174 includes an end-to-end portion 190 formed in the via layer via0 under the metal layer M1, and overlaps with the metal lines 170 and 190.

The interconnect structure 100 or 150 formed in a metal layer M1 and a via layer via0 is exemplary. Interconnect structures formed in other interconnect layers such as an interconnect structure formed in a metal layer M2 and a via layer via1, an interconnect structure formed in a metal layer M3 and a via layer via1, an interconnect structure formed in a metal layer M4 and a via layer via3, etc. are within the contemplated scope of the present disclosure.

Figure 2A:
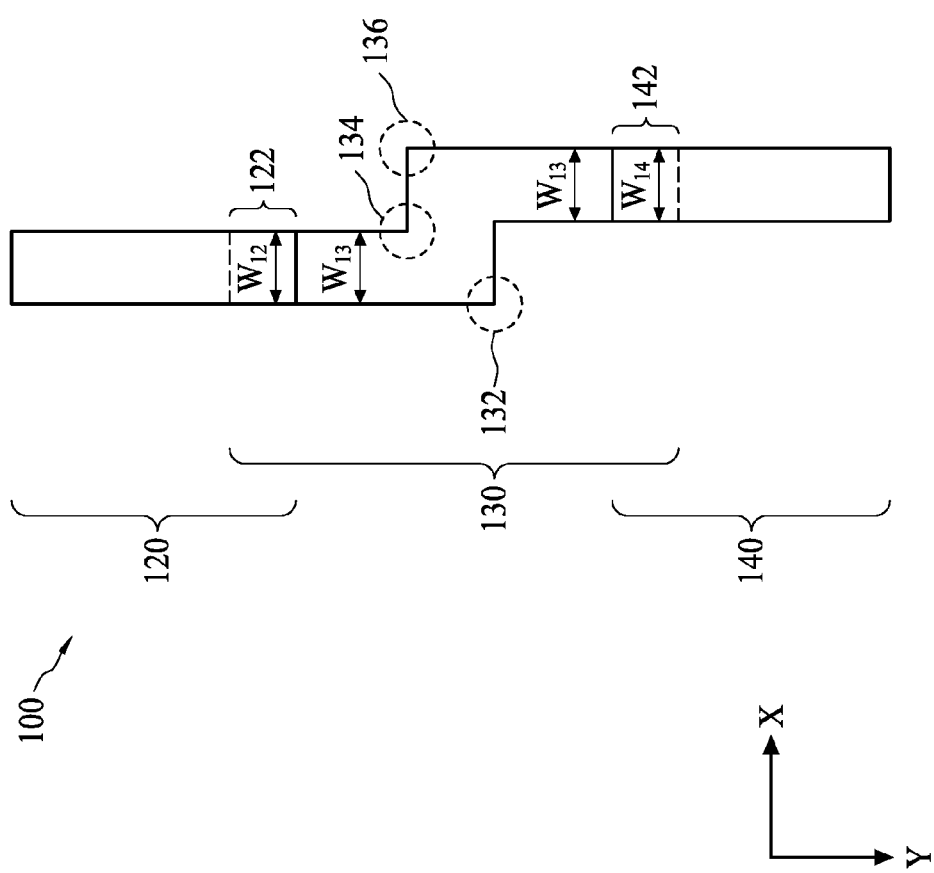
FIG. 2A is a top-view diagram of the interconnect structure shown in FIG. 1A having a twice bent and substantially non-widened end-to-end portion, in accordance with some embodiments.

FIG. 2A is a top-view diagram of the interconnect structure 100 shown in FIG. 1A having a twice bent and substantially non-widened end-to-end portion 130, in accordance with some embodiments. FIG. 2A illustrates the end-to-end portion 130 overlapped with an end portion 122 of the metal line 120 and an end portion 142 of the metal line 140 and having a twice bent shape. In some embodiments, the metal line 120 extends in length substantially along the Y direction and ends at the end portion 122. The metal line 140 starts at the end portion 142 and extends in length substantially along the Y direction. The end-to-end portion 130 is overlapped with the end portion 122 and the end portion 142. Furthermore, in some embodiments, the end-to-end portion 130 has the twice bent shape that runs substantially along the Y direction to overlap with the end portion 122, bends into running substantially along the X direction and bends again into running substantially along the Y direction to overlap with the end portion 142. Therefore, the end-to-end portion 130 has at least a corner 132, a corner 134 and a corner 136. The corner 132 bends from substantially along the Y direction to substantially along the X direction or equivalently bends from substantially along a direction opposite the X direction to a direction opposite the Y direction. The corner 134 bends from substantially along the Y direction to substantially along the X direction. The corner 136 bends from substantially along the X direction to substantially along the Y direction. The equivalent description for the corner 132 also applies to the corners 134 and 136.

In some embodiments, a width $W_{13}$ of the end-to-end portion 130 at where the end-to-end portion 130 is in contact with the end portion 122 is not substantially wider than a width $W_{12}$ of the end portion 122 to avoid interfering with other vias in the same interconnect layer such as the via layer via0. Similarly, the width $W_{13}$ of the end-to-end portion 130 at where the end-to-end portion 130 is in contact with the end portion 142 is not substantially wider than a width $W_{14}$ of the end portion 142.

In some embodiments, the end portion 122 of the metal line 120 and the end portion 142 of the metal line 140 have uniform widths. As a result, the width $W_{12}$ and the width $W_{14}$ are the uniform widths. In other embodiments, the end portion 122 of the metal line 120 and the end portion 142 of the metal line 140 have non-uniform widths such as those for tapered line ends. Therefore, each of the width $W_{12}$ and the width $W_{14}$ is the maximum width of the respective end portion 122 or 142. The way the width $W_{12}$ of the end portion 122 is defined can be similarly used throughout the present disclosure.

In some embodiments, the phrase "the end-to-end portion 130 at where the end-to-end portion 130 is overlapped with the end portion 122" refers to a portion of the end-to-end portion 130 that extends from the top of the end portion 122 along the Y direction to the bottom of the end portion 122 along the Y direction. The above phrase in which "at where" is used to define a portion of the end-to-end portion 130 can be similarly used throughout the present disclosure.

In some embodiments, the end-to-end portion 130 at where the end-to-end portion 130 is overlapped with the end portion 122 and the end portion 142 has a uniform width. As a result, the width $W_{13}$ is the uniform width. In other embodiments, the end-to-end portion 130 at where the end-to-end portion 130 is overlapped with the end portion 122 and the end portion 142 has a non-uniform width. Therefore, the width $W_{13}$ is the maximum width at where the end-to-end portion 130 is overlapped with the end portion 122 or the end portion 142. The way the width $W_{13}$ of the end-to-end portion 130 at where the end-to-end portion 130 is overlapped with the end portion 122 is defined can be similarly used throughout the present disclosure.

In the embodiments shown in FIG. 2A, the end-to-end portion 130 has the same width $W_{13}$ at where the end-to-end portion 130 is overlapped with the end portion 122 and the end portion 142. Other embodiments such as the end-to-end portion 130 having different widths at where the end-to-end portion 130 is overlapped with the end portion 122 and the end portion 142 are within the contemplated scope of the present disclosure.

In some embodiments, the term "not substantially wider" used herein indicates a first width not wider than a second width by a percentage such as 5%, 10% and 15%, etc., of the first width. Other ways to determine the first width being "not substantially wider" than the second width are within the contemplated scope of the present disclosure. For example, a ratio of the second width to the first width being greater than a percentage such as 85%, 90%, or 95%, etc.

For another example, a difference of the first width from the second width is less than a number predetermined according to design specification.

In the embodiments described with reference to FIG. 2A, the end-to-end portion 130 bends twice to transition from overlapping with the end portion 122 into overlapping with the end portion 142. The end-to-end portion 130 that bends more than twice such as four times, six times are within the contemplated scope of the present disclosure.

Figure 2B:
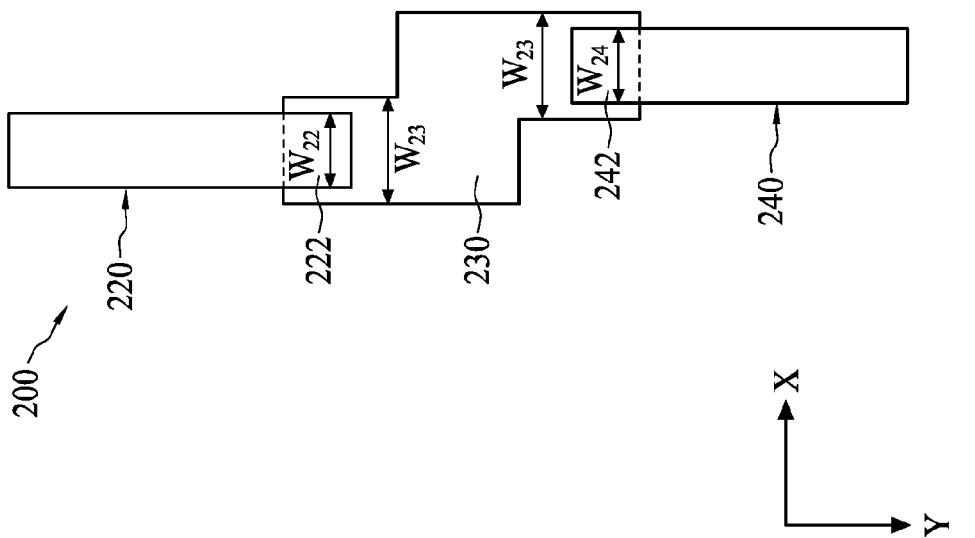
FIG. 2B is a top-view diagram of another interconnect structure having a twice bent and widened end-to-end portion, in accordance with some embodiments.

FIG. 2B is a top-view diagram of another interconnect structure 200 having a twice bent and widened end-to-end portion 230, in accordance with some embodiments. The interconnect structure 200 includes a metal line 220, a metal line 240 and an end-to-end portion 230 corresponds the corresponding metal line 120, metal line 140 and end-to-end portion 130 described with reference to FIG. 2A. The metal line 220 has an end portion 222 and the metal line 240 has an end portion 242 at where the end-to-end portion 230 overlaps with the corresponding metal lines 220 and 240. The end portions 222 and 242 correspond to the corresponding end portions 122 and 142 described with reference to FIG. 2A. Compared to the metal lines 120 and 140, the metal lines 220 and 240 extend further toward each other. Compared to the end-to-end portion 130, the end-to-end portion 230 has a wider width $W_{23}$ at where the end-to-end portion 230 is in contact with the end portion 222 than a width $W_{22}$ of the end portion 222, and/or has the wider width $W_{23}$ at where the end-to-end portion 230 is in contact with the end portion 242 than a width $W_{24}$ of the end portion 242. In some embodiments, the width $W_{23}$ is wider than the width $W_{22}$ and/or the width $W_{24}$ by a first factor equal to about 30% to reduce a resistance of the end-to-end portion 230. A lower limit of the first factor is higher than about 10% so that the width $W_{23}$ is wider than the width $W_{22}$ and/or the width $W_{24}$ considering variability in the widths $W_{23}$ and $W_{22}$, and/or the widths $W_{23}$ and $W_{24}$ introduced by process variations. An upper limit of the first factor is set such that minimum spacing is maintained with adjacent structures in the via layer via0.

In the embodiments shown in FIG. 2B, the end-to-end portion 230 has the same width $W_{23}$ at where the end-to-end portion 230 is overlapped with the end portion 222 and the end portion 242. Other embodiments such as the end-to-end portion 230 having different widths at where the end-to-end portion 230 is overlapped with the end portion 222 and the end portion 242 are within the contemplated scope of the present disclosure.

In some embodiments, the term "about" refers to an absolute difference between a first number from a second number that the first number is equal to about being within a percentage such as 5%, 10% or 15% of the second number. Other ways to determine the first number being equal to "about" the second number are within the contemplated scope of the present disclosure. For example, a ratio of the smaller of the first number and the second number to the larger of the first number to the second number is greater than a percentage such as 85%, 90% and 95%, etc. For another example, an absolute difference between the first number and the second number is less than a number predetermined according to design specification.

Figure 2C:
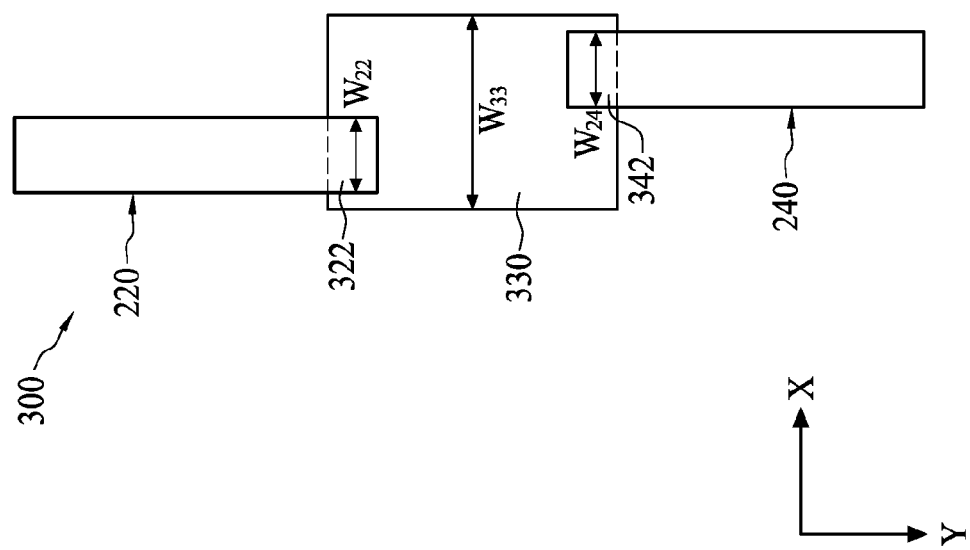
FIG. 2C is a top-view diagram of another interconnect structure having a substantially rectangular end-to-end portion, in accordance with some embodiments.

FIG. 2C is a top-view diagram of another interconnect structure 300 having a substantially rectangular end-to-end portion 330, in accordance with some embodiments. Elements in the interconnect structure 300 that are labeled with the same reference numerals as those of the elements in the interconnect structure 200 are the same as the elements in the interconnect structure 200 shown in FIG. 2B. The metal line 220 has an end portion 322, and the metal line 240 has an end portion 342. The end portions 322 and 342 correspond to the corresponding end portions 222 and 242 described with reference to FIG. 2B. Compared to the interconnect structure 200 described with reference to FIG. 2B, the interconnect structure 300 includes an end-to-end portion 330 that has substantially a rectangular shape instead of a twice bent shape. In some embodiments, the end-to-end portion 330 having substantially the rectangular shape has a width $W_{33}$ across a width $W_{22}$ of the end portion 322 and a width $W_{24}$ of the end portion 324. In some embodiments, the width $W_{22}$ is overlapped with the width $W_{24}$, and therefore the width $W_{33}$ across the widths $W_{22}$ and $W_{24}$ is at least the sum of the widths $W_{22}$ and $W_{24}$ with the overlapped portion of the widths $W_{22}$ and $W_{24}$ subtracted off. In other embodiments, the width $W_{22}$ is not overlapped with the width $W_{24}$, and therefore the width $W_{33}$ across the width $W_{22}$ and $W_{24}$ is the sum of the widths $W_{22}$ and $W_{24}$ and a width of a non-overlapped portion between the widths $W_{22}$ and $W_{24}$. In other embodiments, the end-to-end portion 330 is wider at where it overlapped with the metal lines 220 and 240. Further, the end-to-end portion 330 is not extended as far as the end-to-end portion 230 substantially along a direction opposite the Y direction and the Y direction. Therefore, compared to the end portions 222 and 242 described with reference to FIG. 2B, the end portions 322 and 342 have smaller areas.

In some embodiments, the term "substantially a rectangular shape" or "substantially rectangular" refers to the opposite sides of the shape being "substantially parallel" to each other. In addition, corners of the shape are sharp or rounded.

Figure 2D:
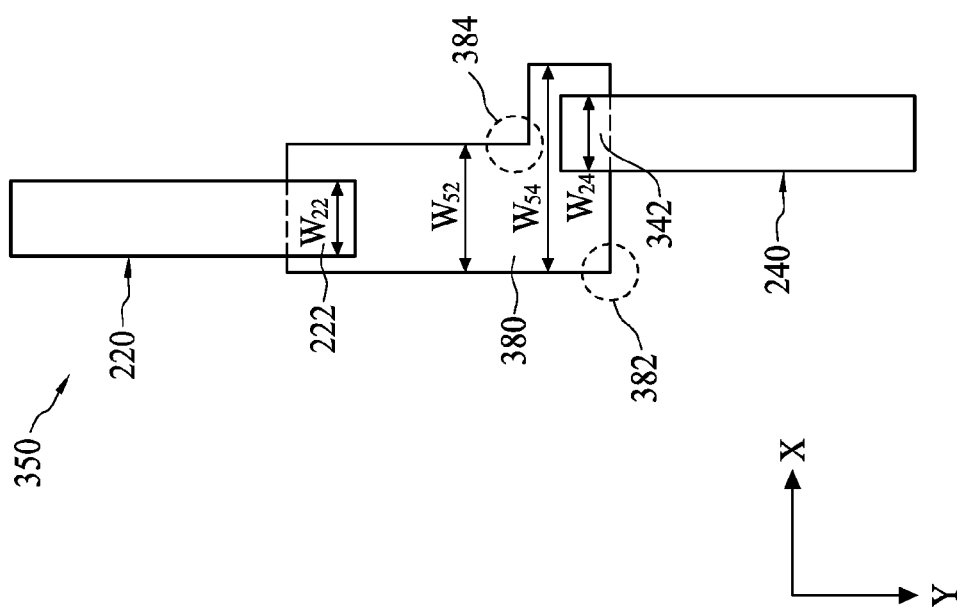
FIG. 2D is a top-view diagram of another interconnect structure having a one-time bent and substantially widened end-to-end portion, in accordance with some embodiments.

FIG. 2D is a top-view diagram of another interconnect structure 350 having a one-time bent and substantially widened end-to-end portion 380, in accordance with some embodiments. Elements in the interconnect structure 350 that are labeled with the same reference numerals as those of the elements in the interconnect structure 300 shown in FIG. 2C are the same as the elements in the interconnect structure 300. Compared to the interconnect structure 300 described with reference to FIG. 2C, the interconnect structure 350 includes an end-to-end portion 380 having a one-time bent shape that runs substantially along the Y direction and bends into running substantially along the X direction. In some embodiments, the one-time bent shape has at least a corner 382 and a corner 384. Similar to the corners 132 and 134 of the twice bent shape of the end-to-end portion 130, the corresponding corners 382 and 384 of the one-time bent shape bend from substantially along the Y direction to substantially along the X direction.

In some embodiments, the end-to-end portion 380 that runs substantially along the Y direction is overlapped with the end portion 222, and the end-to-end portion 380 that runs substantially along the X direction is overlapped with the end portion 342. In some embodiments, similar to the width $W_{23}$ of the end-to-end portion 230 and the width $W_{22}$ of the end portion 222 shown in FIG. 2B, a width $W_{52}$ of the end-to-end portion 380 at where the end-to-end portion 380 is overlapped with the end portion 222 is wider than a width $W_{22}$ of the end portion 222 by the first factor. Similar to the width $W_{33}$ of the end-to-end portion 330 in FIG. 2C, the width $W_{54}$ of the end-to-end portion 380 at where the end-to-end portion 380 is overlapped with the end portion 342 is across the widths $W_{22}$ and $W_{24}$.

The interconnect structure 350 having the one-time bent and substantially widened end-to-end portion 380 as shown in FIG. 2D is exemplary. Other ways to implement an end-to-end portion are within the contemplated scope of the present disclosure. For example, a widened width similar to the width $W_{23}$ shown in FIG. 2B can be applied at where the end-to-end portion is overlapped with an end portion of the metal line 240, and a width across the widths $W_{22}$ and $W_{24}$ of the corresponding metal lines 220 and 240 similar to the width $W_{33}$ of the end-to-end portion 330 shown in FIG. 2C can be applied at where the end-to-end portion is overlapped with an end portion of the metal line 220.

Figure 3:
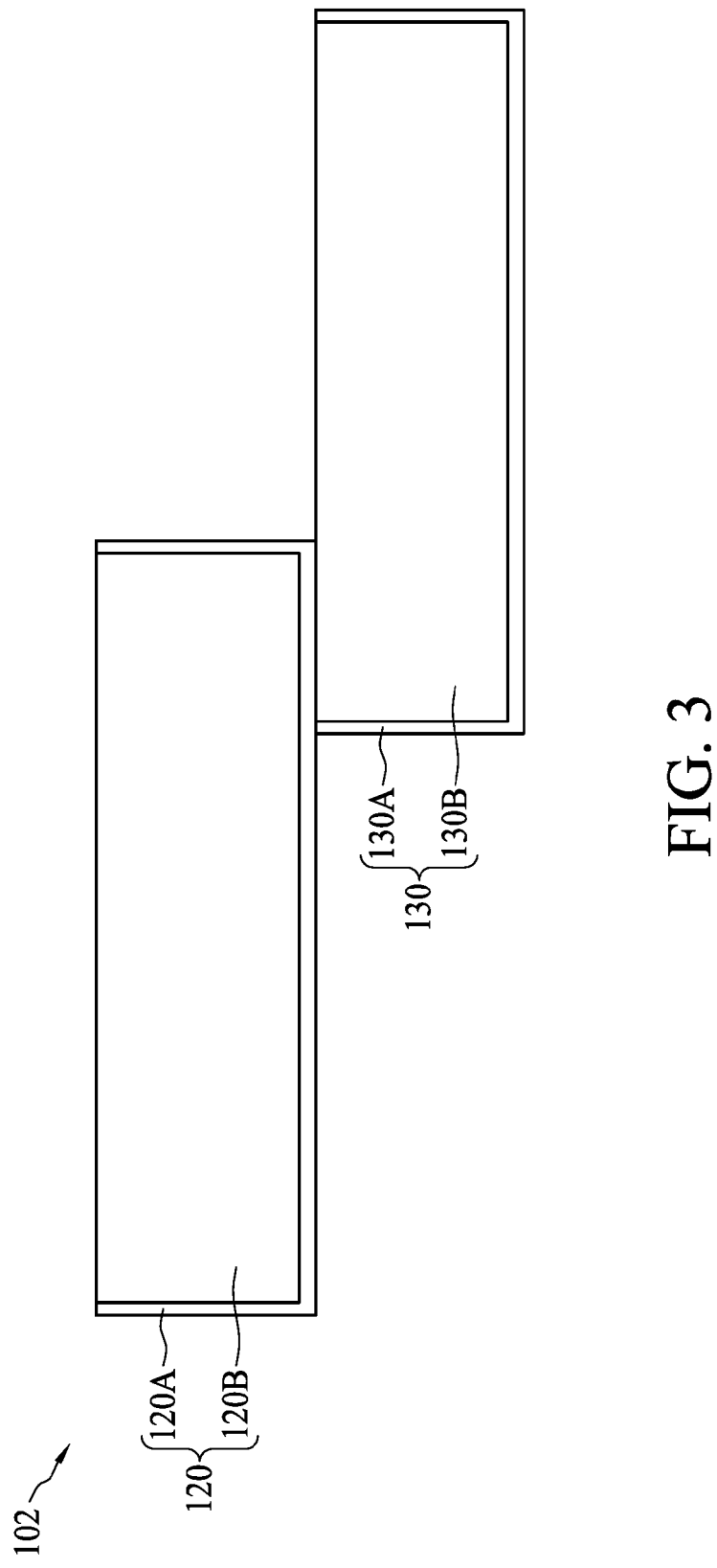
FIG. 3 is a cross-sectional diagram of the interconnect structure along line A-A' shown in FIG. 1A, in accordance with some embodiments.

FIG. 3 is a cross-sectional diagram of the interconnect structure 100 along line A-A' shown in FIG. 1A, in accordance with some embodiments. FIG. 3 illustrates a single damascene interconnect structure 102 that includes the end-to-end portion 130 and the metal line 120 over and in contact with the end-to-end portion 130. The end-to-end portion 130 is also referred to as a single damascene via. The formation of the single damascene interconnect structure 102 will be described with references to FIGS. 7A to 7E. The end-to-end portion 130 includes a diffusion barrier layer 130A and a conductive layer 130B. The diffusion barrier layer 130A forms side walls and a bottom of the end-to-end portion 130. The conductive layer 130B fills space wrapped around by the diffusion barrier layer 130A. The metal line 120 includes a diffusion barrier layer 120A and a conductive layer 120B. The diffusion barrier layer 120A forms side walls and a bottom of the metal line 120 and the conductive layer 120B fills space wrapped around by the diffusion barrier layer 120A. In some embodiments, in the single damascene interconnect structure 102, the diffusion barrier layer 120A at the bottom of the metal line 120 overlaps with a top of the conductive layer 130B of the end-to-end portion 130.

FIG. 4A is a top-view diagram of an interconnect structure 400A that has a twice bent and substantially non-widened end-to-end portion 130 as shown in FIG. 2A which extends beyond ends of metal lines 170 and 190 adjacent to corresponding metal lines 120 and 140 with which the end-to-end portion 130 is overlapped, in accordance with some embodiments. The ends of metal lines 170 and 190 are shown coincided with the corresponding lines 154 and 156. The interconnect structure 400A includes the interconnect structure 100 described with reference to FIG. 2A, and an adjacent interconnect structure 152. Elements in the interconnect structure 152 that are labeled with the same reference numerals as those of the elements in the interconnect structure 150 described with reference to FIG. 1B are the same as the elements in the interconnect structure 150. In some embodiments, the metal line 170 is formed adjacent to the metal line 120, and the metal line 190 is formed adjacent to the metal line 140. The metal line 120 and the metal line 170 end along the Y direction at substantially the same line 154. The metal line 140 and the metal line 190 start along the Y direction at substantially the same line 156. The end-to-end portion 130 extends along the direction opposite the Y direction beyond the line 154 to reach the end portion 122 on the side of the metal line 170 with respect to the line 154 and extends along the Y direction beyond the line 156 to reach the end portion 142 on the side of the metal line 190 with respect to the line 156. In some embodiments described with reference to FIG. 2A, the end-to-end portion 130 is not substantially widened at where the end-to-end portion 130 is in contact with the end portions 122 and 142 compared to the corresponding end portions 122 and 142 to avoid interfering with other vias in the same interconnect layer such as the via layer via0.

In some embodiments, the term "substantially non-widened" refers to a first width of a first shape being "not substantially wider" than a second width of a second shape.

In some embodiments, when the first metal line starts or ends "substantially at the same line" as the second metal line, a first distance of the first metal line behind or exceeding the line that coincides with an end of the second metal line is within a percentage such as 5%, 10% and 15% of the largest length of the first metal line in parallel to the first distance. Other ways to determine the first metal line that starts or ends "substantially at the same line" as the second metal line are within the contemplated scope of the present disclosure. For example, a ratio of a first distance of the first metal line behind or exceeding the line and a second distance of the second metal line behind or exceeding the line is greater than a percentage such as 85%, 90% and 95%, etc. For another example, a difference between a first distance of the first metal line behind or exceeding the line and a second distance of the second metal line behind or exceeding the line is less than a number predetermined according to design specification.

FIG. 4B is a top-view diagram of another interconnect structure 400B that has a twice bent and widened end-to-end portion 230 as shown in FIG. 2B which is not substantially extended beyond ends of metal lines 170 and 190 adjacent to corresponding metal lines 220 and 240 with which the end-to-end portion 230 is overlapped, in accordance with some embodiments. The ends of metal lines 170 and 190 are shown coincided with the corresponding lines 154 and 156. Compared to the interconnect structure 400A described with reference to FIG. 4A, the interconnect structure 400B includes the interconnect structure 200 described with reference to FIG. 2B instead of the interconnect structure 100 described with reference to FIG. 2A. Compared to the metal line 120 of the interconnect structure 100, the metal line 220 extends in length substantially along the Y direction and beyond the line 154 at which the metal line 170 ends. Compared to the metal line 140 of the interconnect structure 100, the metal line 240 starts substantially along the Y direction behind the line 156 at which the metal line 190 starts and extends substantially along the Y direction. Compared to the end-to-end portion 130 of the interconnect structure 100, the end-to-end portion 230 is not substantially extended beyond the line 154 along the direction opposite the Y direction and is not substantially extended beyond the line 156 along the Y direction. The end-to-end portion 230 is overlapped with the end portion 222 on the opposite side of the metal line 170 with respect to the line 154 and with the end portion 242 on the opposite side of the metal line 190 with respect to the line 156. Without being extended beyond the lines 154 and 156, the end-to-end portion 230 is not adjacent to other vias in the same interconnect layer such as the via layer via0. When a first shape is not adjacent to a second shape in the same interconnect layer, none of the edges of the first shape faces any edge of the second shape. Therefore, in some embodiments described with reference to FIG. 2B, the end-to-end portion 230 is widened at where the end-to-end portion 230 is in contact with the end portions 222 and 242 compared to the corresponding end portions 222 and 242.

In some embodiments, the term "not substantially extended beyond the line" for a shape refers to a first distance of an end of the shape behind or exceeding the line within a percentage such as 5%, 10% and 15% of the largest length of the shape in parallel to the first distance. Other ways to determine the shape being "not substantially extended beyond the line" are within the contemplated scope of the present disclosure. For example, a first distance of an end of the shape behind or exceeding the line is less than a number predetermined according to design specification.

Figure 4C:
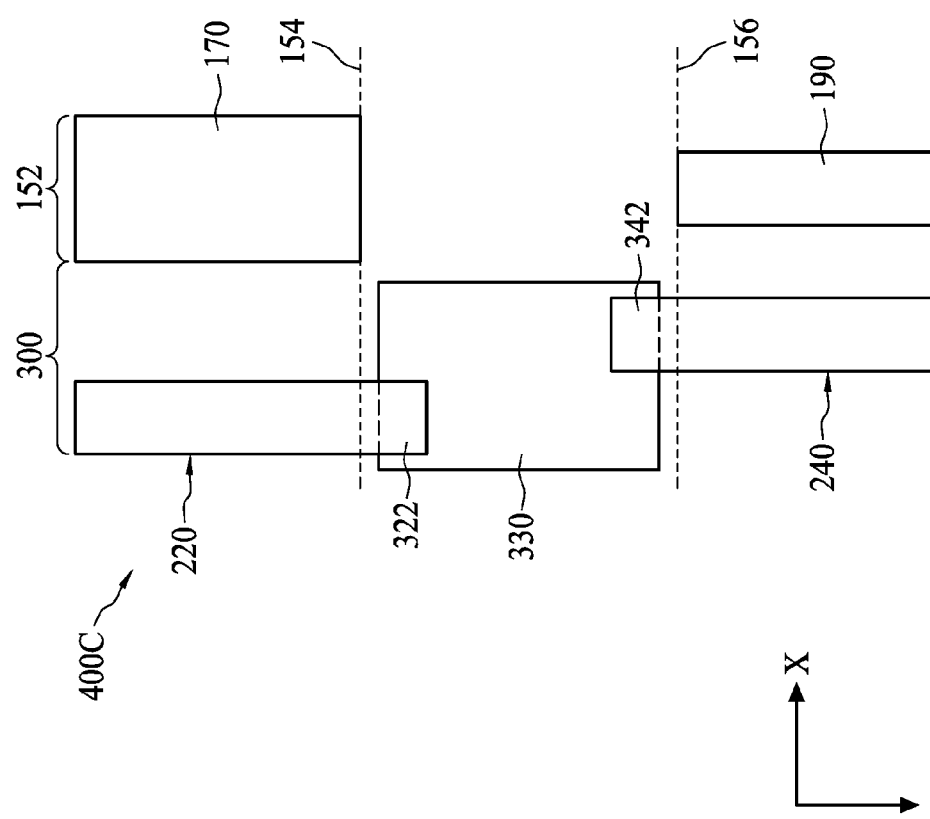
FIG. 4C is a top-view diagram of another interconnect structure that has a substantially rectangular end-to-end portion as shown in FIG. 2C which is not substantially extended beyond ends of metal lines adjacent to corresponding metal lines with which the end-to-end portion is overlapped, in accordance with some embodiments.

FIG. 4C is a top-view diagram of another interconnect structure 400C that has a substantially rectangular end-to-end portion 330 as shown in FIG. 2C which is not substantially extended beyond ends of metal lines 170 and 190 adjacent to corresponding metal lines 220 and 240 with which the end-to-end portion 330 is overlapped, in accordance with some embodiments. The ends of metal lines 170 and 190 are shown coincided with the corresponding lines 154 and 156. Compared to the interconnect structure 400B described with reference to FIG. 4B, the interconnect structure 400C includes the interconnect structure 300 described with reference to FIG. 2C instead of the interconnect structure 200. Compared to the end-to-end portion 230 of the interconnect structure 200 which has the twice bent shape, the end-to-end portion 330 of the interconnect structure 300 has substantially a rectangular shape. In some embodiments described with reference to FIG. 2C, the end-to-end portion 330 has the width $W_{33}$ that extends across the widths $W_{22}$ of the metal line 220 and the width $W_{24}$ of the metal line 240. The width $W_{33}$ can be obtained because the end-to-end portion 330 is not substantially extended beyond the line 154 along the direction opposite the Y direction and the line 156 along the Y direction. In some embodiments, compared to the end-to-end portion 230, the end-to-end portion 330 is not extended as far as the end-to-end portion 230 substantially along the direction opposite the Y direction and the Y direction to avoid touching the metal lines 170 and 190.

Figure 4D:
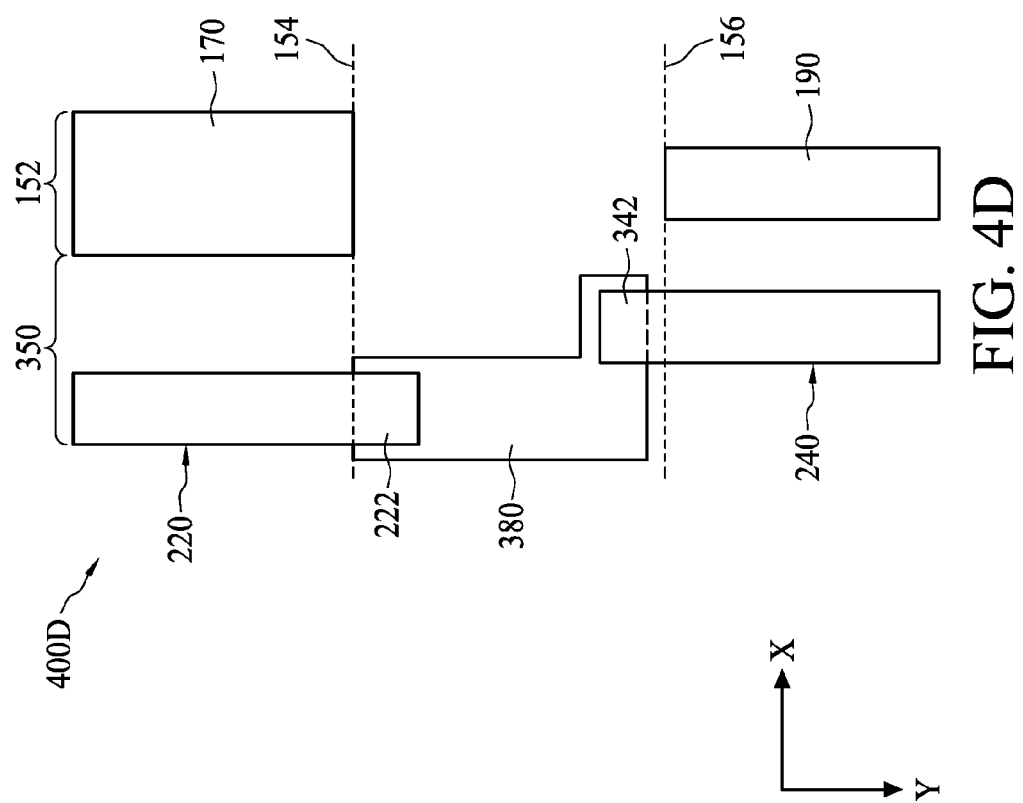
FIG. 4D is a top-view diagram of another interconnect structure that has a one-time bent and substantially widened end-to-end portion as shown in FIG. 2D which is not substantially extended beyond ends of metal lines adjacent to corresponding metal lines with which the end-to-end portion is overlapped, in accordance with some embodiments.

FIG. 4D is a top-view diagram of another interconnect structure 400D that has a one-time bent and substantially widened end-to-end portion 380 as shown in FIG. 2D which is not substantially extended beyond ends of metal lines 170 and 190 adjacent to corresponding metal lines 220 and 240 with which the end-to-end portion 380 is overlapped, in accordance with some embodiments. The ends of metal lines 170 and 190 are shown coincided with the corresponding lines 154 and 156. Compared to the interconnect structure 400C described with reference to FIG. 4C, the interconnect structure 400D includes the interconnect structure 350 described with reference to FIG. 2D instead of the interconnect structure 300 described with reference to FIG. 2C. Compared to the end-to-end portion 230 of the interconnect structure 200 which has the substantially rectangular shape, the end-to-end portion 330 of the interconnect structure 300 has a one-time bent shape. In some embodiments described with reference to FIG. 2D, a width $W_{52}$ of the end-to-end portion 380 at where the end-to-end portion 380 is overlapped with the end portion 222 is wider than a width $W_{22}$ of the end portion 222 by the first factor and the width $W_{54}$ of the end-to-end portion 380 at where the end-to-end portion 380 is overlapped with the end portion 342 is across the widths $W_{22}$ and $W_{24}$. Similar to the embodiments described with reference to FIG. 4B, the end-to-end portion 380 can be widened at where the end-to-end portion 380 is overlapped with the end portion 222 because the end-to-end portion 380 is not expended beyond the line 154 and therefore is not adjacent to other vias in the same interconnect layer such as the via layer via0. Similar to the embodiments described with reference to FIG. 4C, the width $W_{54}$ can be obtained because the end-to-end portion 380 is not substantially extended beyond the line 156 along the Y direction. Similarly, the end-to-end portion 380 is only extended as far as the end-to-end portion 330 substantially along the Y direction to avoid touching the metal lines 190.

The interconnect structure 400D having the one-time bent and substantially widened end-to-end portion 380 which is not substantially extended beyond ends of metal lines 170 and 190 adjacent to the corresponding metal lines 220 and 240 with which the end-to-end portion 380 is overlapped as shown in FIG. 4D is exemplary. Other ways to implement an end-to-end portion not substantially extended beyond ends of metal lines adjacent to metal lines with which the end-to-end portion is overlapped are within the contemplated scope of the present disclosure. For example, a widened width similar to the width $W_{52}$ as shown in FIG. 2D can be applied at where the end-to-end portion is overlapped with an end portion of the metal line 240, and a width across the widths $W_{22}$ and $W_{24}$ of the corresponding metal line 220 and 240 similar to the width $W_{54}$ of the end-to-end portion 380 as shown in FIG. 2D can be applied at where the end-to-end portion is overlapped with an end portion of the metal line 220.

Figure 5:
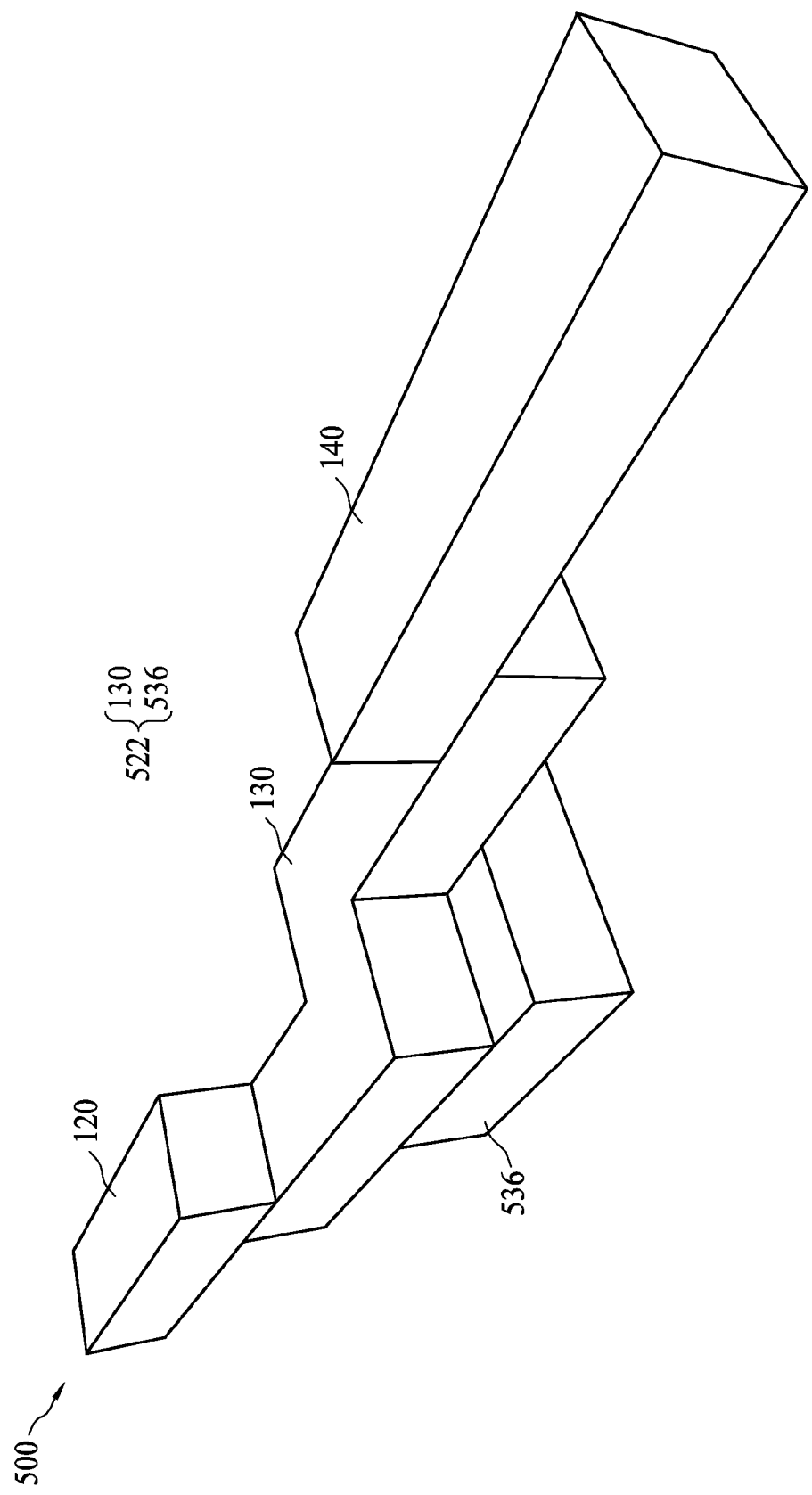
FIG. 5 is a perspective diagram of another interconnect structure that has an additional portion formed under and coupled to the end-to-end portion as shown in FIG. 1A, in accordance with some embodiments.

FIG. 5 is a perspective diagram of another interconnect structure 500 that has an additional portion 536 formed under and coupled to the end-to-end portion 130 as shown in FIG. 1A, in accordance with some embodiments. Compared to the connection structure 124 of the interconnect structure 100 shown in FIG. 1A, the connection structure 522 further includes the additional portion 536 in a first interconnect layer such as a contact layer under a second interconnect layer such as the via layer via0 in which the end-to-end portion 130 resides. Further, the additional portion 536 is in contact with the end-to-end portion 130. Elements in the interconnect structure 500 that are labeled with the same reference numerals as those of the elements in the interconnect structure 100 described with reference to FIG. 1A are the same as the elements in the interconnect structure 100. In some embodiments, the additional portion 536 has a rectangular shape having a width across the width $W_{12}$ (labeled in FIG. 2A) of the metal line 120 and the width $W_{14}$ (labeled in FIG. 2A) of the metal line 140. The additional portion 536 serves to decrease a resistance of the connection structure 522.

Each interconnect structure in this section includes the connection structure under a metal line and is formed in a set of via layer under a metal layer. For example, the set is a via layer via0 under a metal layer M1. Other interconnect structures including a connection structure under a metal line and formed in another set of via layer under a metal layer are within the contemplated scope of the present disclosure. For example, the other set includes a via layer via1 under a metal layer M2, and a via layer via2 under a metal layer M3, etc. Furthermore, other interconnect structures including a connection structure over a metal line and formed in another set of via layer over a metal line are within the contemplated scope of the present disclosure. For example, the other set includes a via layer via1 over a metal layer M1, and a via layer via2 over a metal layer M2, etc.

Figure 6:
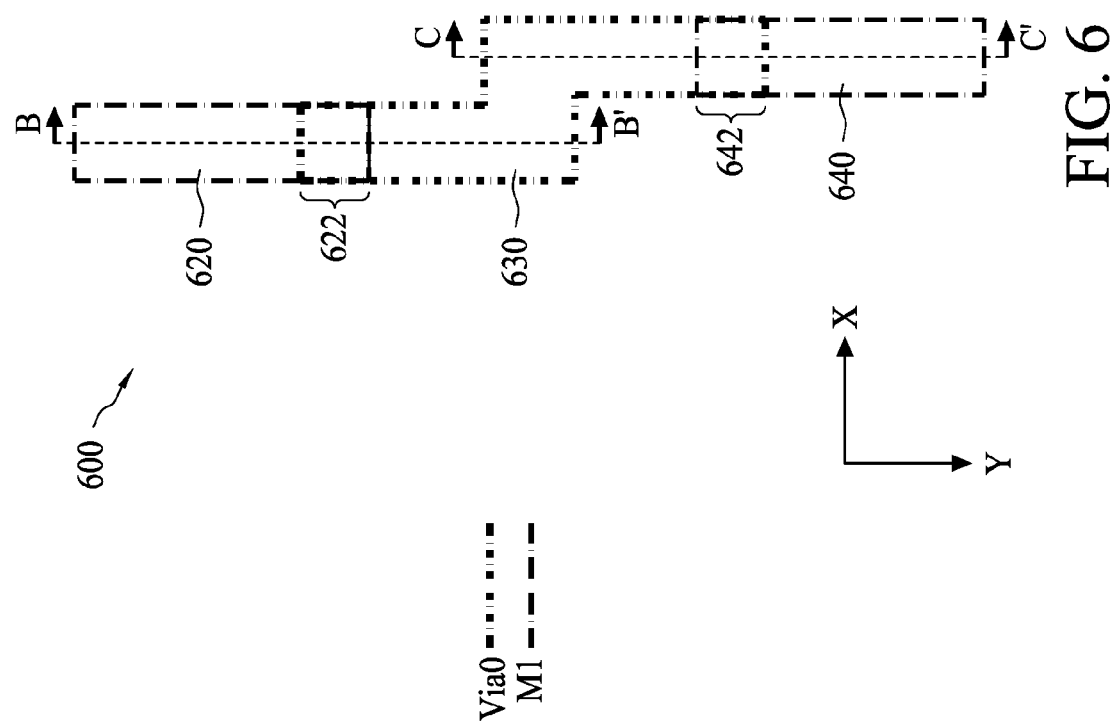
FIG. 6 is a diagram of a layout for forming the interconnect structure shown in FIG. 1A, in accordance with some embodiments.

Method for Forming Interconnect Structure with Misaligned Metal Lines Coupled Using Under Layer FIG. 6 is a diagram of a layout 600 for forming the interconnect structure 100 shown in FIG. 1A, in accordance with some embodiments. FIG. 6 illustrates the layout 600 for forming the end-to-end portion 130 shown in FIG. 1A using single patterning. In some embodiments, the layout 600 includes a metal layer M1 and a via layer via0 under the metal layer M1. The metal layer M1 includes a metal line 620 and a metal line 640. The metal line 620 extends in length substantially along a Y direction and ends at an end portion 622. The metal line 640 starts from an end portion 642 and extends in length substantially along the Y direction. The metal line 640 is misaligned with the metal line 620 in the Y direction.

The layout 600 including a metal layer M1 and via layer via0 as shown in FIG. 6 is exemplary. Layouts including other interconnect layers such as a layout including a metal layer M2 and a via layer via1, a layout including a metal layer M3 and a via layer via1, and a layout including a metal layer M4 and a via layer via3, etc. are within the contemplated scope of the present disclosure.

In some embodiments, the via layer via0 includes a shape 630 overlapping with the end portion 622 and the end portion 642. The shape 630 is a twice bent shape that is directed to forming the end-to-end portion 130 shown in FIG. 2A using single patterning. The shape 630 overlaps with both the end portion 622 and the end portion 642. The twice bent shape has been described with reference to FIG. 2A. Layouts for forming interconnect structures 200 and 300 which have a corresponding widened twice and a one-time bent shape and a rectangular shape are within the contemplated scope of the present disclosure.

FIGS. 7A to 7E are cross-sectional diagrams illustrating a single patterning method for fabricating the interconnect structure 100 in FIG. 1 using the layout 600 in FIG. 6, in accordance with some embodiments. FIGS. 7A to 7E are the cross-sectional diagrams taken corresponding to line B-B' in the layout 600. Since the shape 630 is directed to forming the end-to-end portion 130 in FIG. 2A using single patterning, the cross-sectional diagrams taken corresponding to line C-C' in the layout 600 are in substantially symmetrical correspondence to the cross-sectional diagrams taken corresponding to line B-B' in the layout 600. Elements in the FIGS. 7A to 7E that are labeled with the same reference numerals as those of the elements in the interconnect structure 100 are the same as the elements in the interconnect structure 100.

Figure 7A:
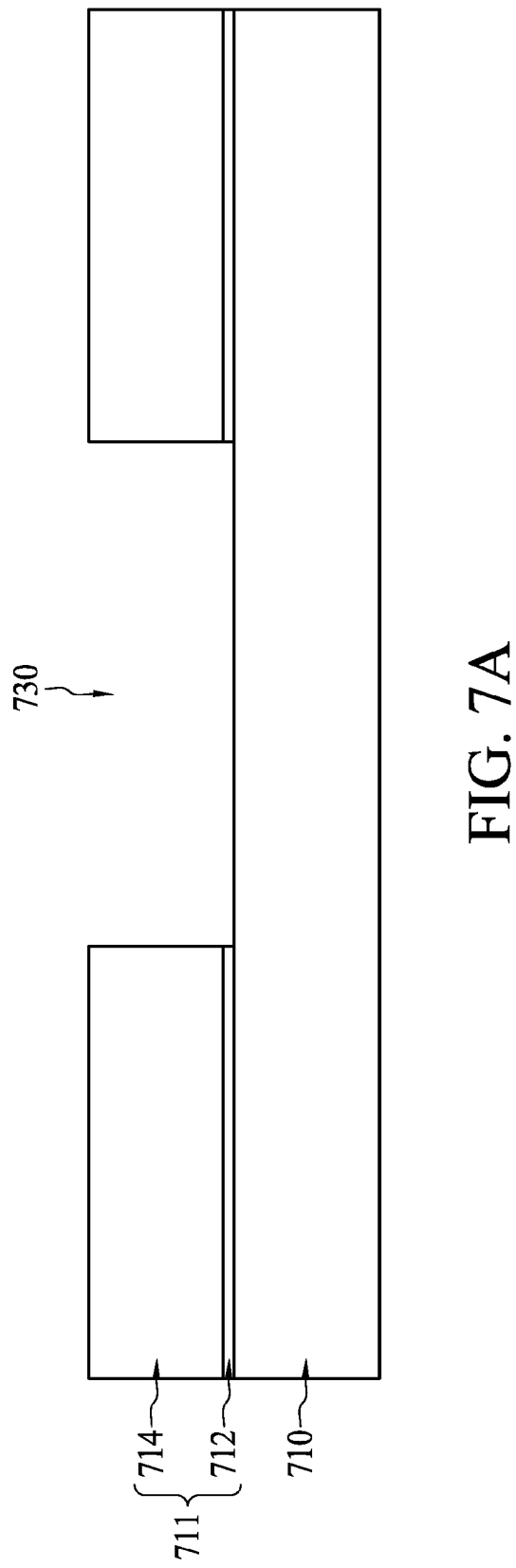
FIGS. 7A to 7E are cross-sectional diagrams illustrating a single patterning method for fabricating the interconnect structure shown in FIG. 1 using the layout shown in FIG. 6, in accordance with some embodiments.

Referring to FIG. 7A, in some embodiments, a dielectric layer 710 is provided to serve as a base for a stack of dielectric layers 711 in which a via opening 730 corresponding to the shape 630 in FIG. 6 is to be formed. In some embodiments, the dielectric layer 710 is formed over a substrate (not shown) in and/or on which devices are formed. In some embodiments, the dielectric layer 710 includes a stack of dielectric layers, such as an ILD layer stacked over an etch stop layer as will be described with respect to the ILD layer 714 and the etch stop layer 712.

In some embodiments, a stack of dielectric layers 711 including the etch stop layer 712 and the ILD layer 714 is formed over the dielectric layer 710. In some embodiments, the etch stop layer 712 serves to protect the underlying structure when the ILD layer 714 is being structured. In some embodiments, the etch stop layer 712 includes silicon carbide, silicon nitride, silicon oxy-nitride or other suitable materials. In some embodiments, the ILD layer 714 includes one or more low-k dielectric materials for reducing intra-layer or inter-layer parasitic capacitances. Exemplary low-k dielectric materials include silicon oxide, borophosphosilicate glass (BPSG), tetraethyl orthosilicate (TEOS), spin-on-glass (SOG), undoped silicate glass (USG), organo-silicate glass (OSG), fluorinated silicate glass (FSG), high-density plasma (HDP) oxide, plasma-enhanced TEOS (PETEOS). In some embodiments, the etch stop layer 712 and the ILD layer 714 are deposited using, for example, chemical vapor deposition (CVD), plasma enhanced chemical vapor deposition (PECVD), high density plasma chemical vapor deposition (HDP-CVD) and atmospheric pressure chemical vapor deposition (APCVD).

In some embodiments, the via opening 730 corresponding to the shape 630 in FIG. 6 is formed in the stack of dielectric layers 711. In some embodiments, the via opening 730 is formed by first employing photolithography techniques to create a pattern with an opening corresponding to the shape 630 in FIG. 6 and then transferring the pattern to the stack of dielectric layers 711. During transferring of the pattern, the ILD layer 714 is etched by using, for example, reactive ion etching (RIE). In some embodiments, the ILD layer 714 is etched using a process chemistry selected from the group consisting of $CF_4$, $CHF_3$, $CH_2F_2$, $C_4F_8$, $C_5F_8$ and $C_4F_6$, and is combined with ambient gas mixture selected from the group consisting of Ar, $O_2$, $N_2$, CO and He. In some embodiments, the etch stop layer 712 exposed after the ILD layer 714 is etched, and is therefore removed, using, for example, ion bombardment. In some embodiments, the bombarding ions include argon ions.

Figure 7B:
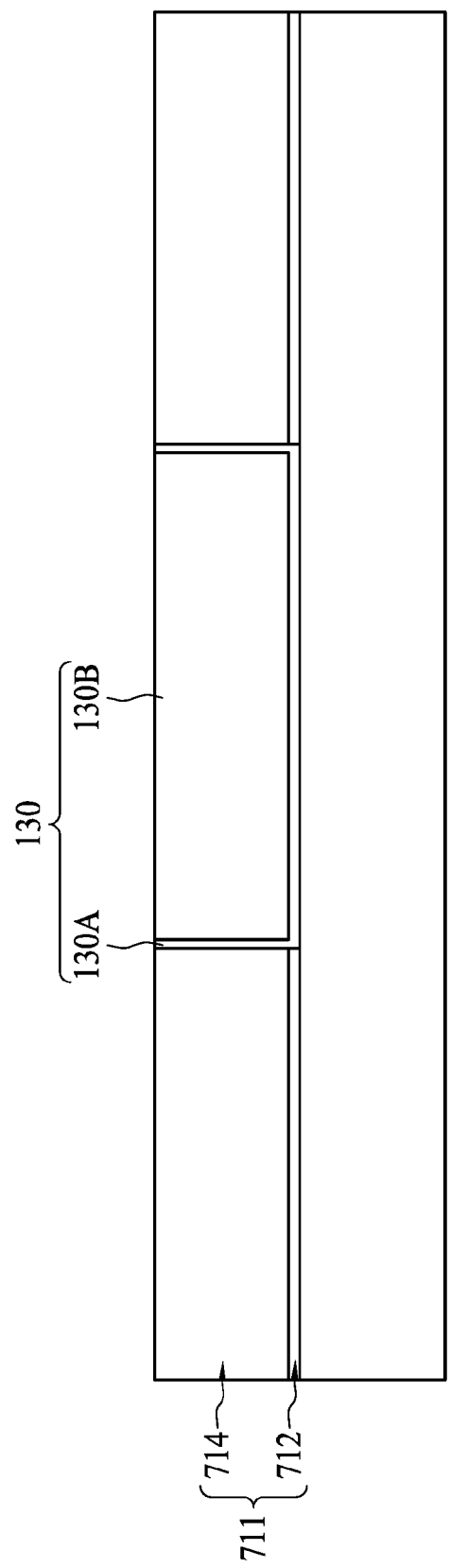

Referring to FIG. 7B, in some embodiments, the diffusion barrier layer 130A described with reference to FIG. 3 is conformally deposited on side walls and a bottom of the via opening 730 in FIG. 7A. In some embodiments, the diffusion barrier layer 130A includes tantalum (Ta), tantalum nitride (TaN), titanium (Ti), titanium nitride (TiN), or multiple layers of these materials. In some embodiments, the diffusion barrier layer 130A is deposited using, for example, sputtering.

In some embodiments, the conductive layer 130B described with reference to FIG. 3 is deposited to fill the remaining space of via opening 730. In some embodiments, the conductive layer 130B includes copper. In order to fill the via opening 730 with, for example, copper, a copper seed layer is deposited over the diffusion barrier layer 130A. Then, a copper plating process is performed to fill the via opening 730. In some embodiments, the via opening 730 is filled such that the copper exceeds a top surface of the stack of dielectric layers 711.

In some embodiments, a planarization process is performed to remove the copper beyond the top surface of the stack of dielectric layers 711. In some embodiments, the planarization process is a chemical mechanical polishing (CMP) process. Therefore, the end-to-end portion 130 of the single damascene interconnect structure 102 (shown in FIG. 3) is formed in the via opening 730.

Figure 7C:
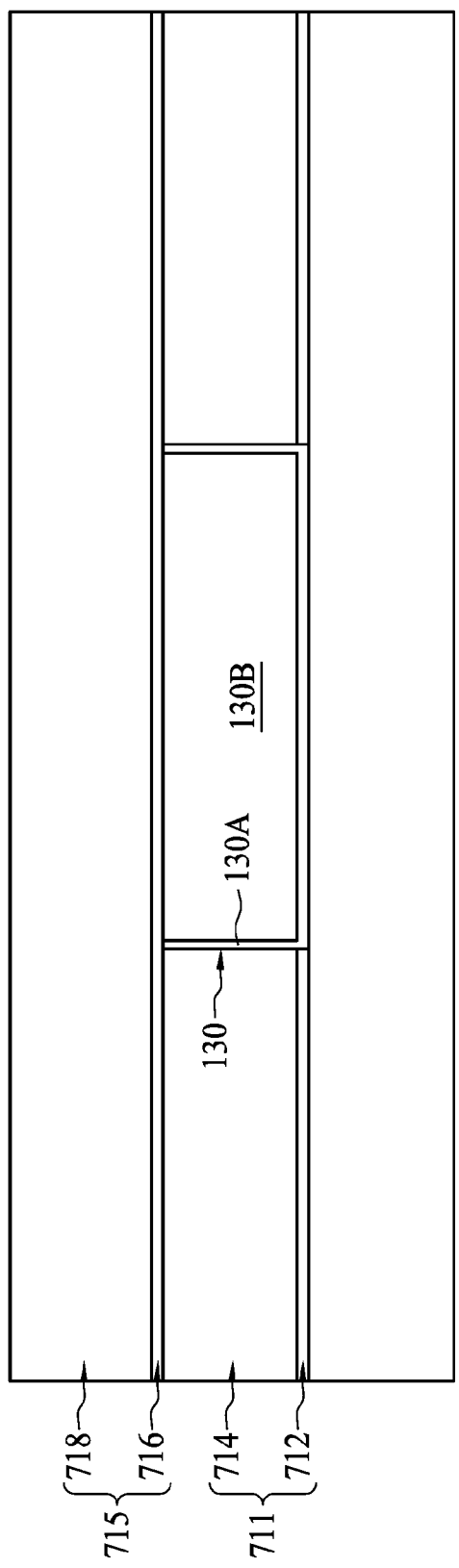

Referring to FIG. 7C, a stack of dielectric layers 715 in which a trench 720 (shown in FIG. 7D) corresponding to the metal line 620 in FIG. 6 is to be formed is formed over the stack of dielectric layers 711 and the end-to-end portion 130. The stack of dielectric layers 715 includes an etch stop layer 716 and an inter-metal dielectric (IMD) layer 718. Exemplary materials and deposition methods of the etch stop layer 716 and the IMD layer 718 have been described with respect to the corresponding etch stop layer 712 and the ILD layer 714 in FIG. 7A.

Figure 7D:
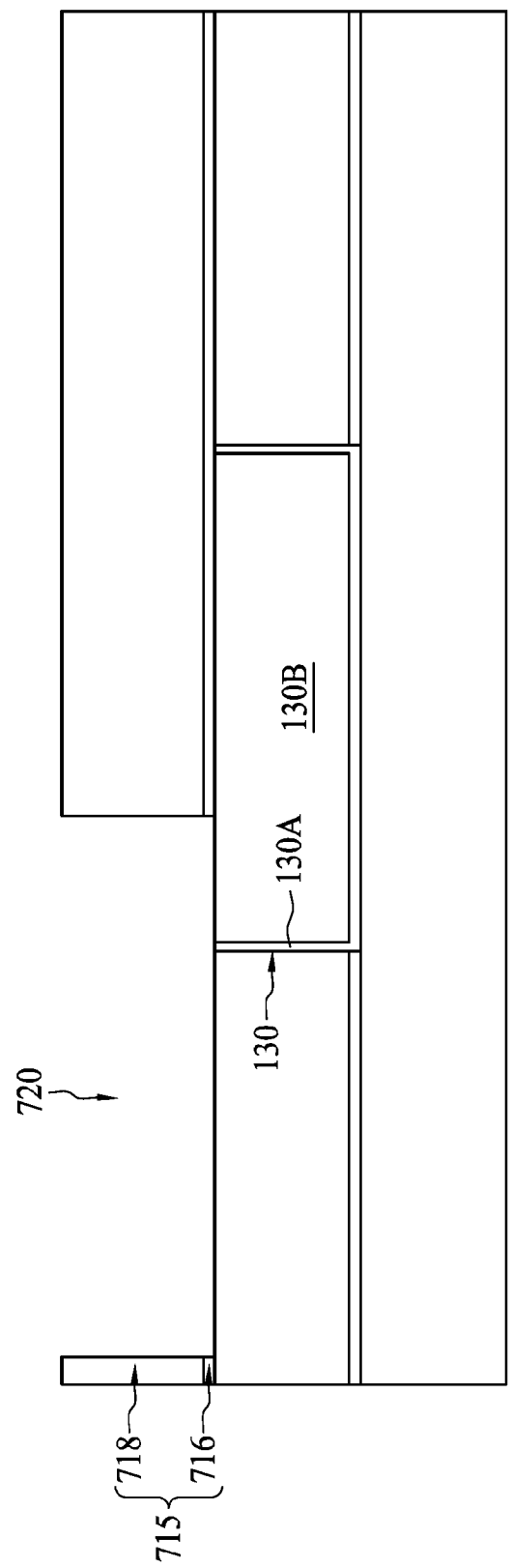

Referring to FIG. 7D, the trench 720 corresponding to the metal line 620 in FIG. 6 is formed in the stack of dielectric layers 715. The trench 720 exposes a portion of a top surface of the end-to-end portion 130. In some embodiments, the trench 720 is formed by first employing the photolithography techniques to create a pattern corresponding to the metal line 620 in FIG. 6 and then transferring the pattern to the stack of dielectric layers 715. Exemplary methods for transferring the pattern to the stack of dielectric layers 715 to form the trench 720 have been provided with respect to formation of the via opening 730 in FIG. 7A.

Figure 7E:
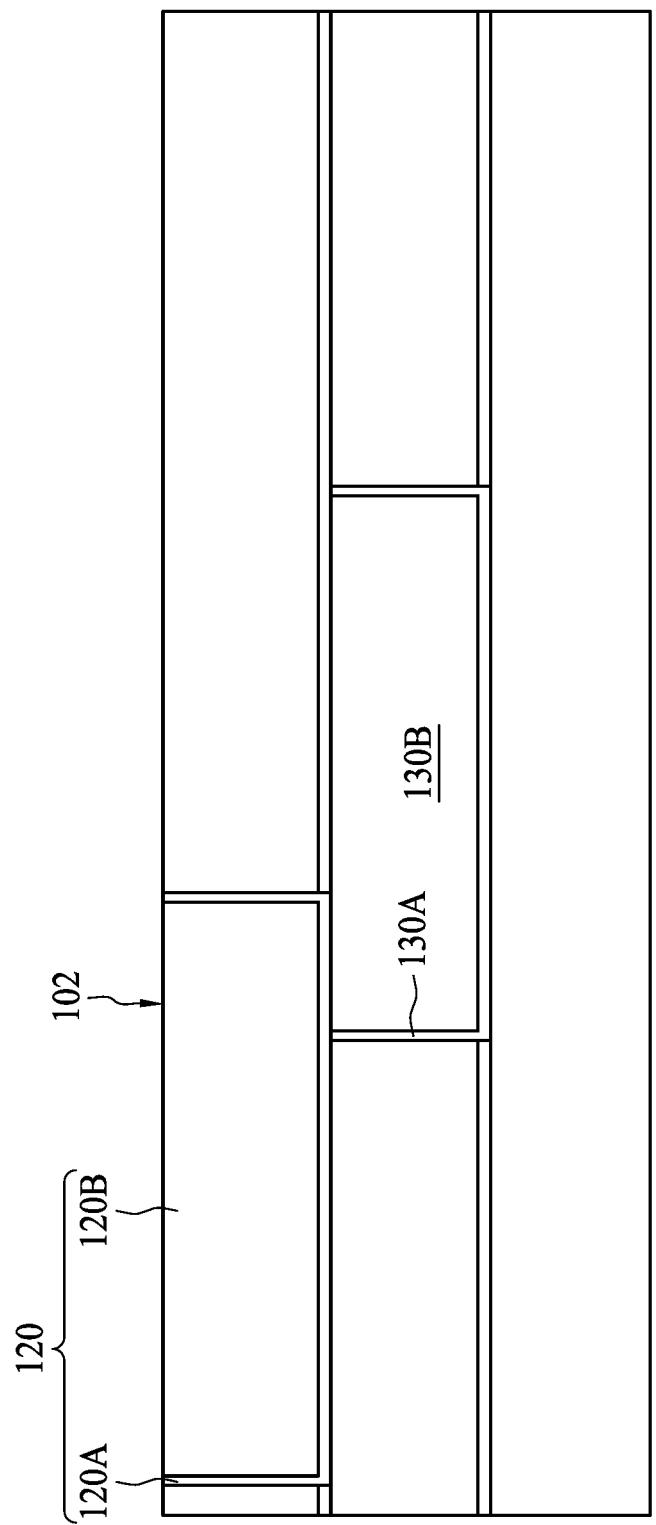

Referring to FIG. 7E, the diffusion barrier layer 120A described with reference to FIG. 3 is conformally deposited on side walls and a bottom of the trench 720 in FIG. 7D. A conductive layer 120B described with reference to FIG. 3 is deposited and planarized to fill the remaining space of the trench 720. Exemplary materials and formation methods of the diffusion barrier layer 120A and the conductive layer 120B have been described with respect to the corresponding diffusion barrier layer 130A and the conductive layer 130B in FIG. 7B. Hence, the metal line 120 of the single damascene interconnect structure 102 is formed in the trench 720. In some embodiments, the diffusion barrier layer 120A at the bottom of the trench 720 is overlapped with and is in contact with a top surface of the conductive layer 120B in the via opening 730 shown in FIG. 7A.

FIG. 8 is a diagram of a layout 800 for forming the interconnect structure 200 in FIG. 2B, in accordance with some embodiments. Compared to the layout 600 in FIG. 6, the layout 800 is to form the end-to-end portion 230 in FIG. 2B using multiple patterning. In some embodiments, the layout 800 includes the metal layer M1 and the via layer via0 under the metal layer M1. The metal layer M1 of the layout 800 includes a metal line 820 and a metal line 840. Compared to the metal lines 620 and 640, the metal lines 820 and 840 are extended further towards each other similar to the metal line 220 and 240 described with reference to FIG. 2B.

The layout 800 including the metal layer M1 and via layer via0 as shown in FIG. 8 is exemplary. The layout 800 including other interconnect layers such as a metal layer M2 and a via layer via1, a metal layer M3 and a via layer via1, a metal layer M4 and a via layer via3, etc., are within the contemplated scope of the present disclosure.

In some embodiments, the via layer via0 of the layout 800 includes patterning layers P1 and P2 for multiple patterning. The patterning layer P1 includes a shape 831 overlapping with an end portion 822 of the metal line 820. The patterning layer P2 includes a shape 833 overlapping with an end portion 842 of the metal line 840.

In some embodiments, as shown in FIG. 8, a union 830 of the shapes 831 and 833 is a twice bent shape. In some embodiments, the shape 831 does not overlap with the end portion 842, and the shape 833 does not overlap with the end portion 822. In other embodiments (not shown), the shape 831 overlaps partially with the end portion 842 but is not extended to where the shape 833 starts in the direction opposite the Y direction. The shape 833 overlaps partially with the end portion 822 but is not extended to where the shape 831 starts in the Y direction.

In other embodiments (not shown), the union 830 is substantially a rectangular shape. In some embodiments, the shape 831 overlaps partially with the end portion 842 and is extended to where the shape 833 starts in the direction opposite the Y direction. The shape 833 overlaps partially with the end portion 822 and is extended to where the shape 831 starts in the Y direction.

Figure 9A:
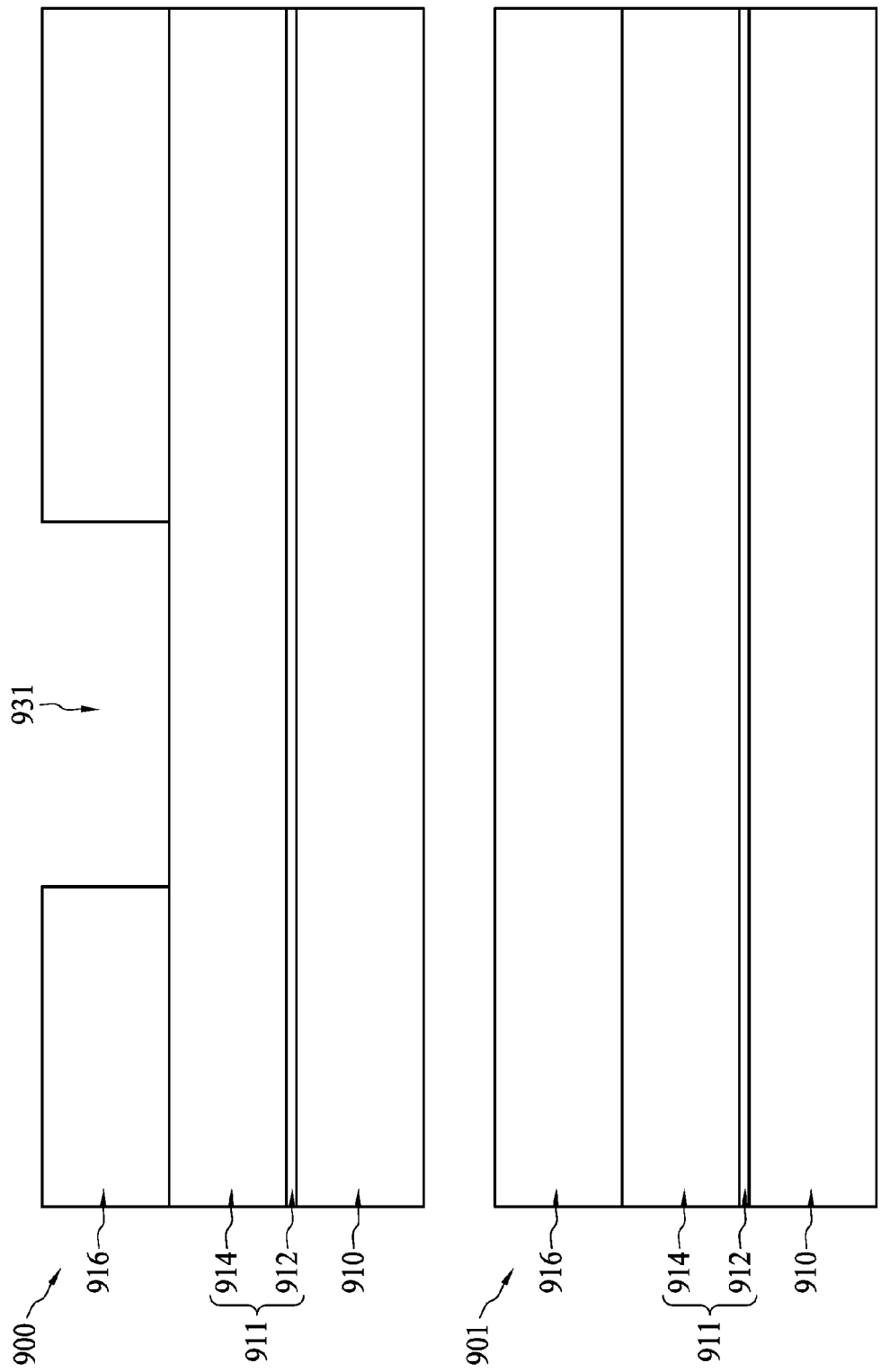
FIGS. 9A to 9C are cross-sectional diagrams illustrating a multiple patterning method for forming the end-to-end portion shown in FIG. 2B using the layout shown in FIG. 8, in accordance with some embodiments.
Figure 9B:
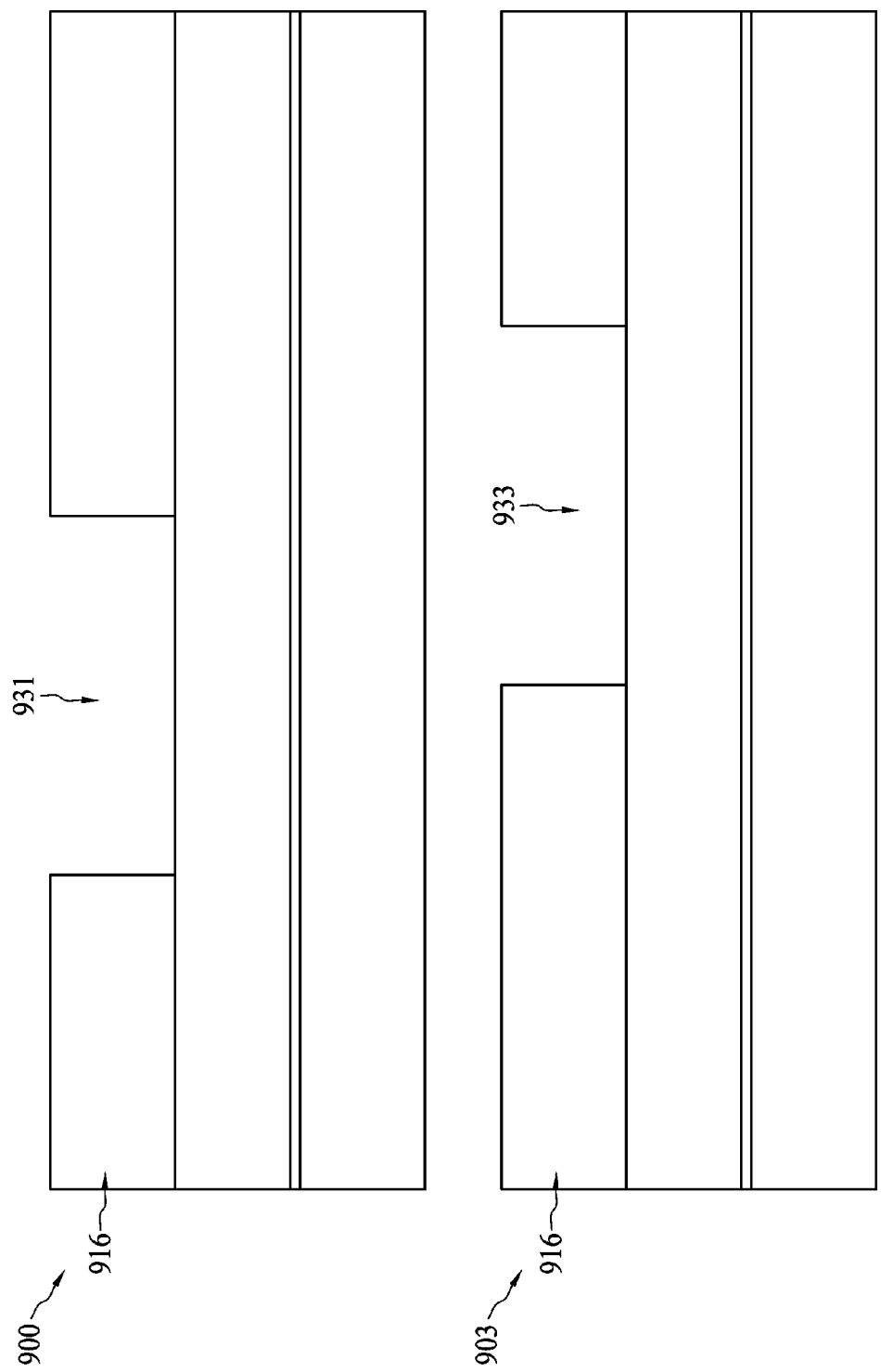
Figure 9C:
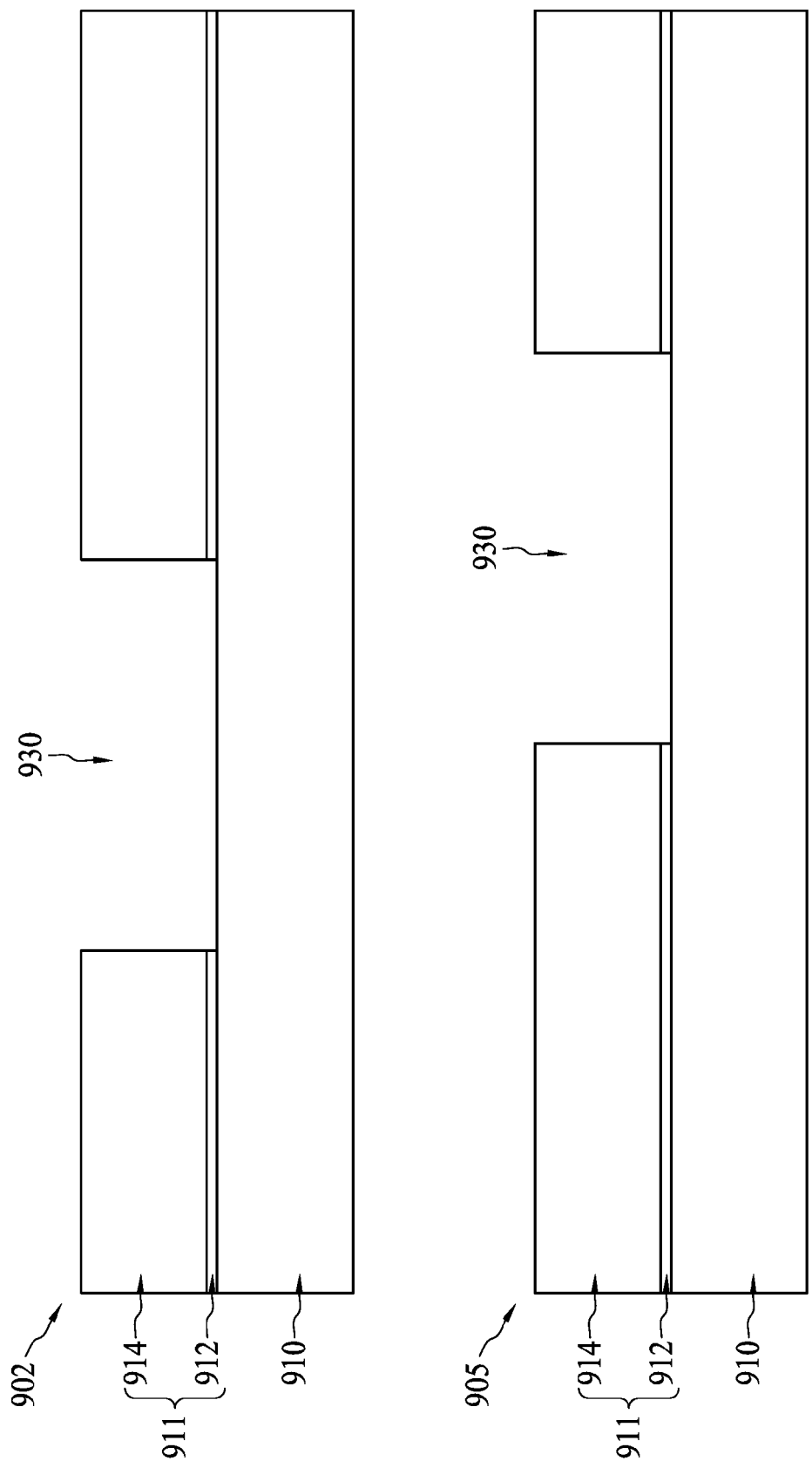

FIGS. 9A to 9C are cross-sectional diagrams illustrating a multiple patterning method for forming the end-to-end portion 230 shown in FIG. 2B using the layout 800 shown in FIG. 8, in accordance with some embodiments. The cross-sectional diagrams 900 and 902 shown at top portions of the corresponding FIGS. 9A to 9C are taken corresponding to line D-D' in the layout 800. The cross-sectional diagrams 901, 903 and 905 shown at bottom portions of the corresponding FIGS. 9A to 9C are taken corresponding to line E-E' in the layout 800. Compared to the via opening 730 shown in FIG. 7A having portions substantially along the corresponding lines B-B' and C-C' shown in FIG. 6 that are formed using single patterning, the via opening 930 shown in FIG. 9C has portions substantially along the corresponding lines D-D' and E-E' shown in FIG. 8 that are formed using multiple patterning.

Referring to FIG. 9A, in some embodiments, a dielectric layer 910 is provided to serve as a base for a stack of dielectric layers 911 in which a via opening 930 to be described with reference to FIG. 9C corresponding to the union 830 of shapes 831 and 833 shown in FIG. 8 is to be formed. The stack of dielectric layers 911 includes an etch stop layer 912 and an ILD layer 914 formed over the dielectric layer 910. Exemplary materials and methods for forming the dielectric layer 910, the etch stop layer 912 and the ILD layer 914 have been provided for similar elements 710, 712 and 714 shown in FIG. 7A.

In some embodiments, a hard mask layer 916 to be patterned, in accordance with the shapes 831 and 833 is formed over the stack of dielectric layers 911. By employing photolithography techniques, the hard mask layer 916 is patterned with an opening 931 corresponding to the shape 831 shown in FIG. 8 as shown in the cross-sectional diagram 900. Meanwhile, the hard mask layer 916 is not patterned with an opening 933 (shown in FIG. 9B) corresponding to the shape 833 shown in FIG. 8 as shown in the cross-sectional diagram 901. One or more materials of the hard mask layer 916 are selected such that the pattern in the hard mask layer 916 can be transferred to the underlying stack of dielectric layers 911 without substantially eroding the pattern in the hard mask layer 916.

Referring to FIG. 9B, in some embodiments, by employing the photolithography techniques, the hard mask layer 916 is patterned with the opening 933 corresponding to the shape 833 shown in FIG. 8 as shown in the cross-sectional diagram 903. The opening 931 is overlapped with the opening 933 and constitutes a single opening with a shape corresponding to the union 830 of the shapes 831 and 833.

Referring to FIG. 9C, the pattern in the hard mask layer 916 (shown in FIG. 9B) is transferred to the underlying stack of dielectric layers 911 to form the via opening 930 that correspond to the union 830 of shapes 831 and 833 shown in FIG. 8. Exemplary methods for transferring the pattern to the stack of dielectric layers 911 have been provided with reference to FIG. 7A.

Subsequent operations for forming the single damascene interconnect structure 102 shown in FIG. 3 are similar to those described with references to FIGS. 7B to 7E.

Each method in this section is for forming a corresponding interconnect structure including a connection structure under a metal line and formed in a set of via layer under a metal layer. For example, the set is a via layer via0 under a metal layer M1. Methods for forming other interconnect structures including a connection structure under a metal line and formed in another set of via layer under a metal layer are within the contemplated scope of the present disclosure. For example, the other set includes a via layer via1 under a metal layer M2, and a via layer via2 under a metal layer M3, etc. Furthermore, methods for forming other interconnect structures including a connection structure over a metal line and formed in another set of via layer over a metal layer are within the contemplated scope of the present disclosure. For example, the other set includes a via layer via1 over a metal layer M1, and a via layer via2 over a metal layer M2, etc.

Interconnect Structure with Misaligned Metal Lines Coupled Using Over Layer

As described with reference to FIG. 1A, the strategy that routes a portion of a metal line on-grid, bending the metal line and routing another portion of the metal line not on-grid as in other approaches cannot be adopted due to the unidirectional routing rule and the rule to maintain the fixed pitch environment for metal lines in some of the metal layers for advanced technology nodes. Some embodiments to remedy such limitation is to connect misaligned metal lines in a first interconnect layer by a connection structure including an end-to-end portion in a second interconnect layer over the first interconnect layer. In accordance with the unidirectional routing rule, a metal line in the first interconnect layer is running in a direction substantially orthogonal to that of a metal line in the second interconnect layer. For the end-to-end portion in the second interconnect layer to connect across the misaligned metal lines in the first interconnect layer, a metal line with a width wide enough to overlap with the misaligned metal lines is routed, and cut lines on opposite sides of the misaligned metal lines are imposed to shape the metal line in the second interconnect layer into the end-to-end portion.

Figure 10A:
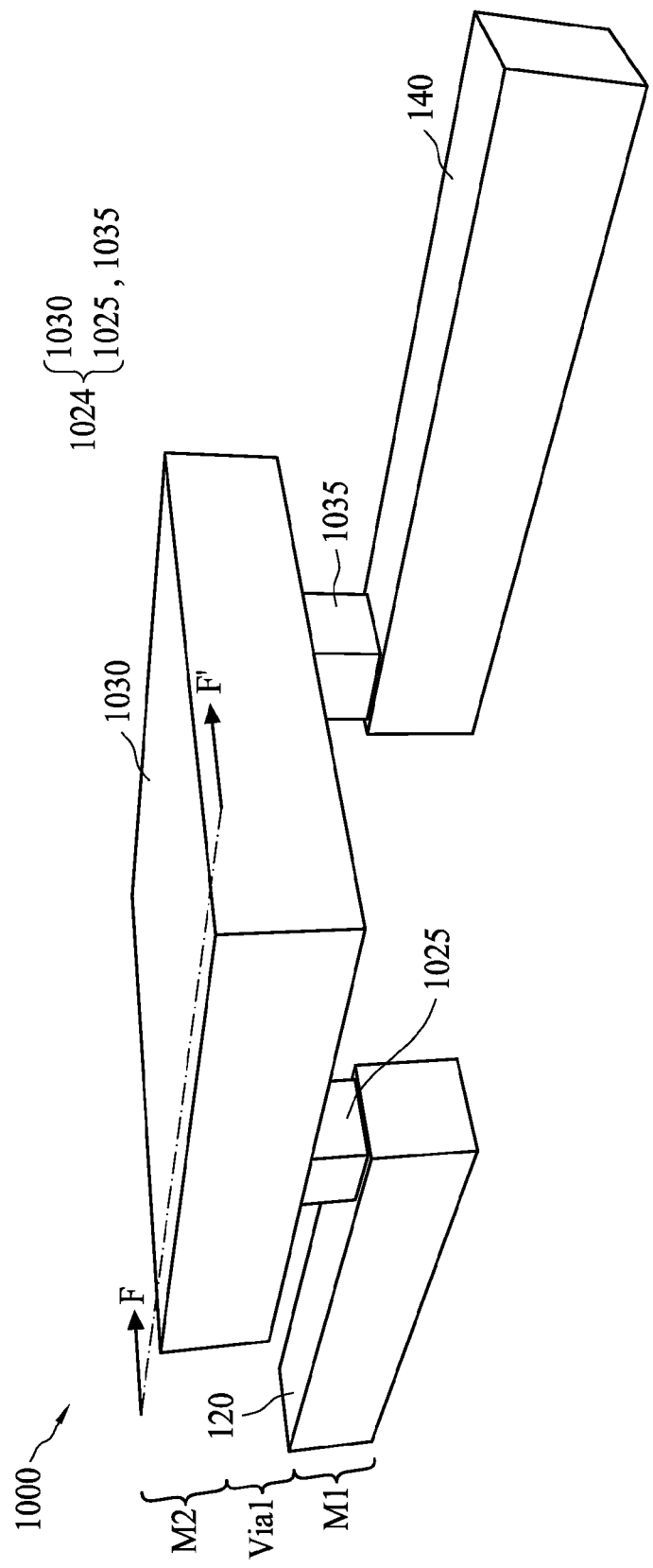
FIG. 10A is a perspective diagram of an interconnect structure with misaligned metal lines (same as those shown in FIG. 1A) coupled using an over interconnect layer, in accordance with some embodiments.

FIG. 10A is a perspective diagram of an interconnect structure 1000 with misaligned metal lines 120 and 140 (same as those shown in FIG. 1A) coupled using an over interconnect layer, in accordance with some embodiments. Compared to the interconnect structure 100 shown in FIG. 1A, the interconnect structure 1000 includes an end-to-end portion 1030 in a metal layer M2 over a metal layer M1 in which the misaligned metal lines 120 and 140 reside. In some embodiments, the interconnect structure 1000 includes the metal lines 120 and 140 and a connection structure 1024 coupling the metal line 120 to the metal line 140. Elements in the interconnect structure 1000 that are labeled with the same reference numerals as those of the elements in the interconnect structure 100 described with reference to FIG. 1A are the same as the elements in the interconnect structure 100. The connection structure 1024 includes the end-to-end portion 1030 and vias 1025 and 1035. The end-to-end portion 1030 is formed in the metal layer M2 and overlaps with the metal lines 120 and 140 in the metal layer M1. The vias 1025 and 1035 are formed in a via layer via1 between the metal layers M1 and M2. The vias 1025 and 1035 couple the end-to-end portion 1030 to the corresponding metal lines 120 and 140 at where the end-to-end portion 1030 overlaps with the corresponding metal lines 120 and 140.

Figure 10B:
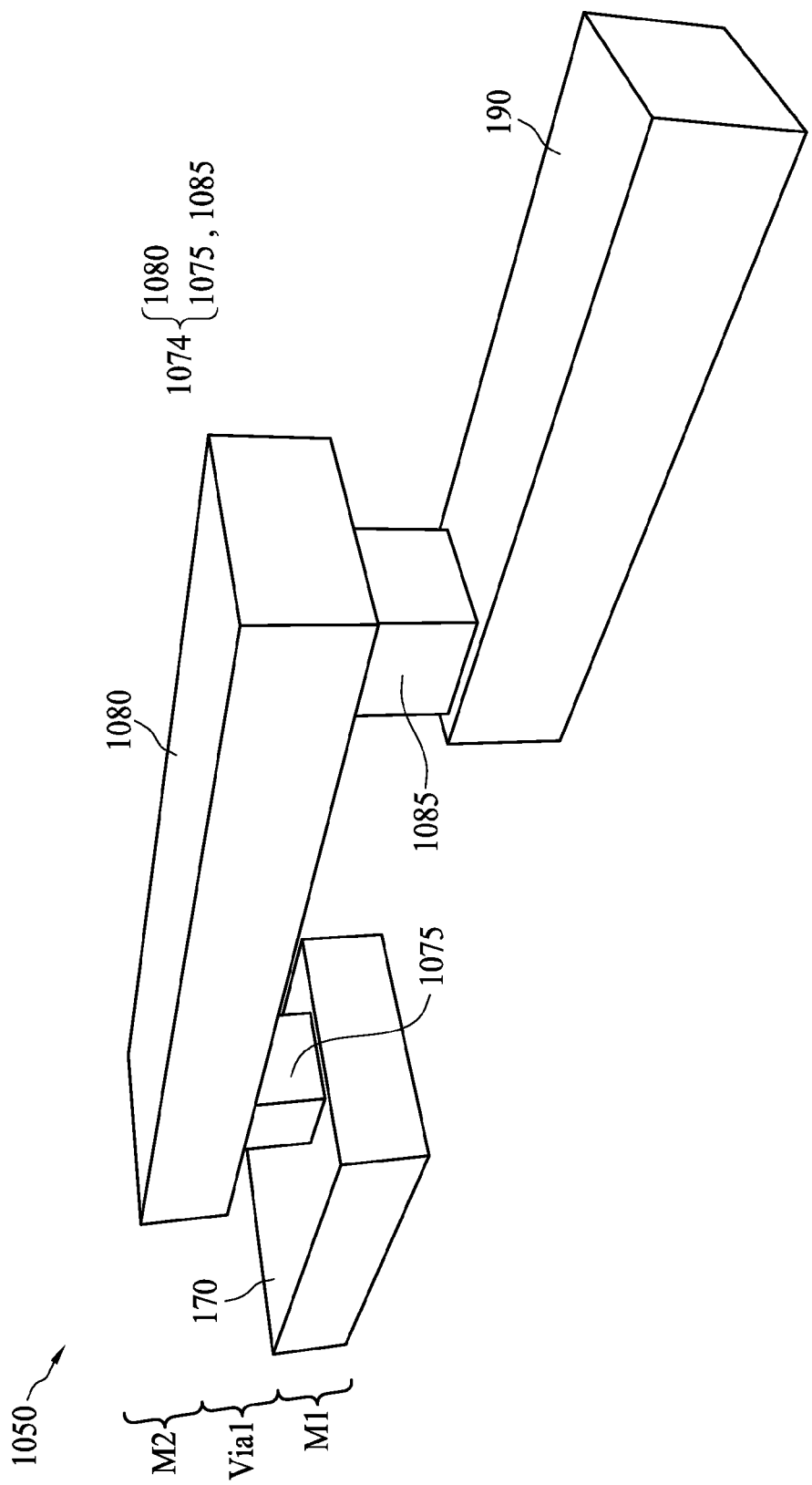
FIG. 10B is a perspective diagram of another interconnect structure with aligned metal lines (same as those shown in FIG. 1B) coupled using an over interconnect layer, in accordance with some embodiments.

FIG. 10B is a perspective diagram of another interconnect structure 1050 with aligned metal lines 170 and 190 (same as those shown in FIG. 1B) coupled using an over interconnect layer, in accordance with some embodiments. Compared to the interconnect structure 150 shown in FIG. 1B, the interconnect structure 1050 includes an end-to-end portion 1080 in the metal layer M2 over the metal layer M1 in which the aligned metal lines 170 and 190 reside. In some embodiments, the interconnect structure 1050 includes the metal lines 170 and 190, and a connection structure 1074 coupling the metal line 170 to the metal line 190. Elements in the interconnect structure 1050 that are labeled with the same reference numerals as those of the elements in the interconnect structure 150 described with reference to FIG. 1B are the same as the elements in the interconnect structure 150. Similar to the connection structure 1024 described with reference to FIG. 10A, the connection structure 1074 includes the end-to-end portion 1080 and vias 1075 and 1085. The end-to-end portion 1080 is formed in the metal layer M2 and overlaps with the metal lines 170 and 190 in the metal layer M1. The vias 1075 and 1085 are formed in the via layer via1 between the metal layers M1 and M2. The vias 1075 and 1085 couple the end-to-end portion 1080 to the corresponding metal lines 170 and 190 at where the end-to-end portion 1080 overlaps with the corresponding metal lines 170 and 190.

The interconnect structure 1000 or 1050 formed in a metal layer M1, a via layer via1 and a metal layer M2 are exemplary. Interconnect structures formed in other interconnect layers such as an interconnect structure formed in a metal layer M2, a via layer via1 and a metal layer M3, an interconnect structure formed in a metal layer M3, a via layer via3 and a metal layer M4, and an interconnect structure formed in a metal layer M4, a via layer via4 and a metal layer M5, etc. are within the contemplated scope of the present disclosure.

Figure 11A:
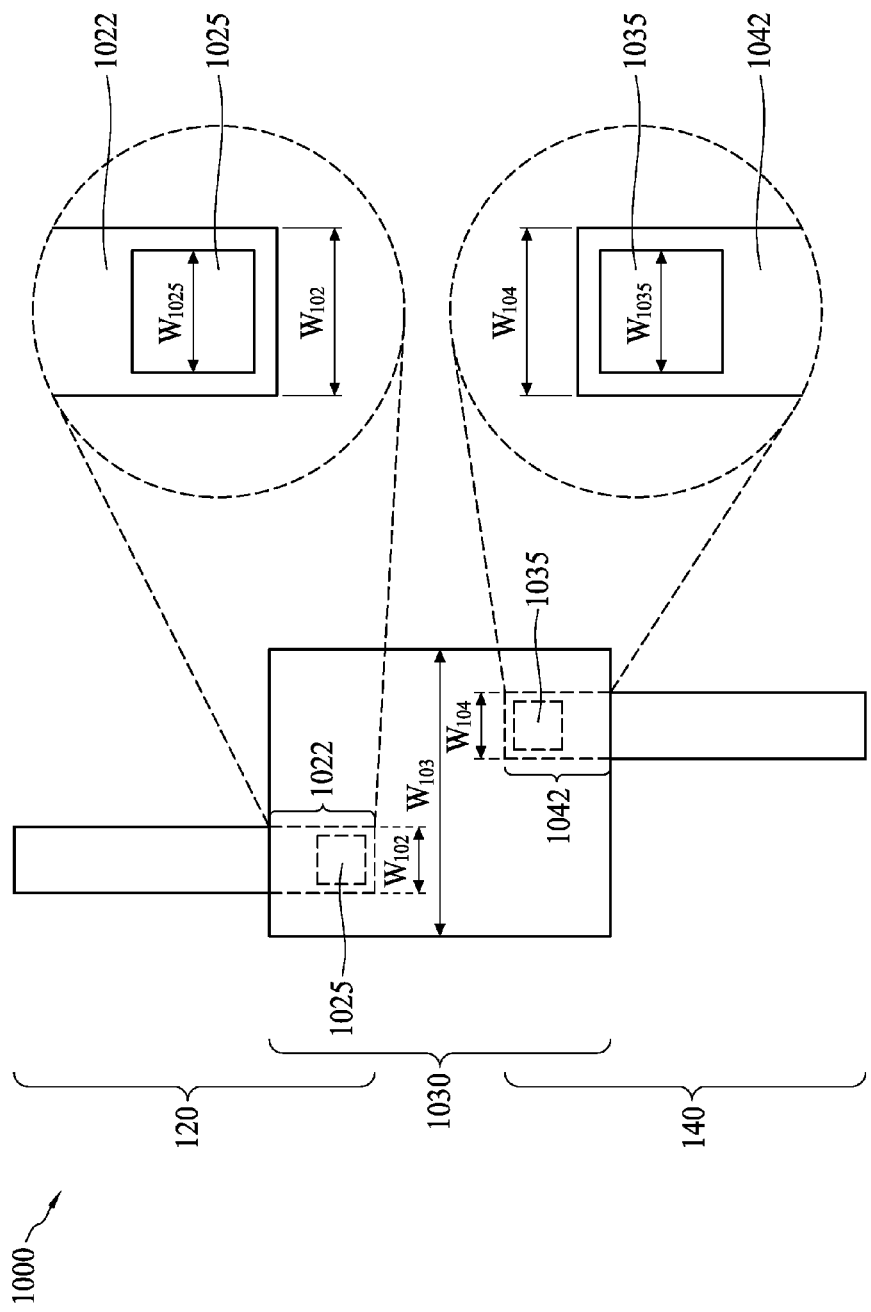
FIG. 11A is a top-view diagram of the interconnect structure shown in FIG. 10A having substantially non-widened vias, in accordance with some embodiments.

FIG. 11A is a top-view diagram of the interconnect structure 1000 shown in FIG. 10A having substantially non-widened vias, in accordance with some embodiments. FIG. 11A illustrates the end-to-end portion 1030 is overlapped with an end portion 1022 of the metal line 120 and an end portion 1042 of the metal line 140, and is coupled to the end portions 1022 and 1042 through the corresponding vias 1025 and 1035. The end-to-end portion 1030 has a substantially rectangular shape that overlaps with an end portion 1022 of the metal line 120 and an end portion 1042 of the metal line 140. The rectangular shape has a width $W_{103}$ across a width $W_{102}$ of the end portion 1022 and a width $W_{104}$ of the end portion 1042. In some embodiments, the width $W_{102}$ is overlapped with the width $W_{104}$. In other embodiments, the width $W_{102}$ is not overlapped with the width $W_{104}$. In some embodiments, the vias 1025 and 1035 are in contact with the corresponding end portions 1022 and 1042 and stand entirely within the corresponding end portions 1022 and 1042. In some embodiments, a width $W_{1025}$ of the via 1025 is at most substantially equal to the width $W_{102}$ of the end portion 1022. Similarly, a width $W_{1035}$ of the via 1035 is at most substantially equal to the width $W_{104}$ of the end portion 1042.

In some embodiments, the vias 1025 and 1035 have uniform widths. As a result, the width $W_{1025}$ and the width $W_{1035}$ are the uniform widths. In other embodiments, the vias 1025 and 1035 have non-uniform widths such as those for tapered line ends. Therefore, each of the width $W_{1025}$ and the width $W_{1035}$ is the maximum width of the respective vias 1025 and 1035. The way the width $W_{1025}$ of the via 1025 is defined can be similarly used throughout the present disclosure.

Figure 11B:
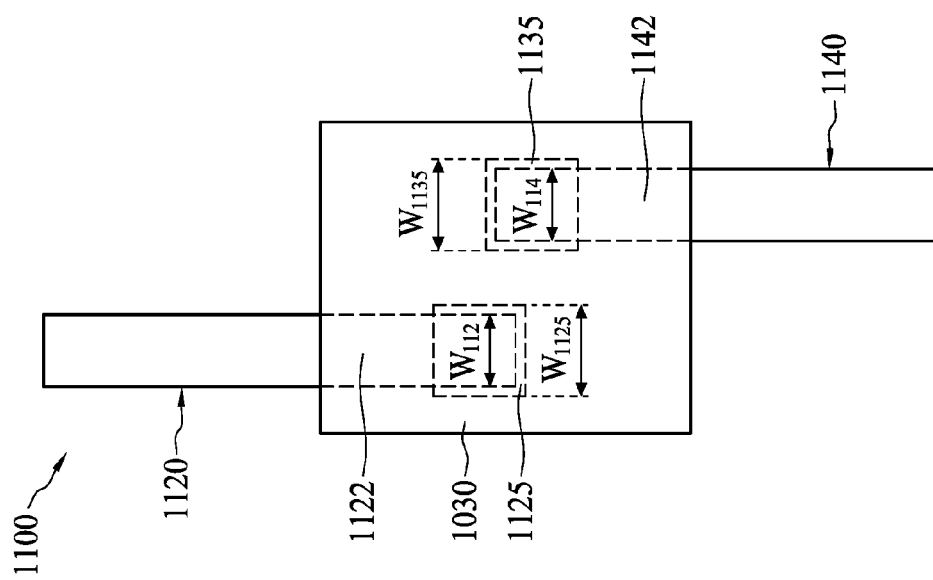
FIG. 11B is a top-view diagram of another interconnect structure having widened vias, in accordance with some embodiments.

FIG. 11B is a top-view diagram of another interconnect structure 1100 having widened vias, in accordance with some embodiments. The interconnect structure 1100 includes a metal line 1120, a metal line 1140, an end-to-end portion 1030 and vias 1125 and 1135 corresponding to the corresponding metal line 120, metal line 140, end-to-end portion 1030 and vias 1025 and 1035 described with reference to FIG. 11A. The metal line 1120 has an end portion 1122 and the metal line 1140 has an end portion 1142 at where the end-to-end portion 1140 overlaps with the corresponding metal lines 1120 and 1140. The end portions 1122 and 1142 correspond to the corresponding end portions 1022 and 1042 described with reference to FIG. 11A. Elements in the interconnect structure 1100 that are labeled with the same reference numerals as those of the elements in the interconnect structure 1000 shown in FIG. 11A are the same as the elements in the interconnect structure 1000. Compared to the metal lines 120 and 140, the metal lines 1120 and 1140 extend further toward each other. Compared to the vias 1025 and 1035, the vias 1125 and 1135 are widened and stand partially on the corresponding end portions 1122 and 1142. In some embodiments, a width $W_{1125}$ of the via 1125 is wider than a width $W_{112}$ of the end portion 1122 by a second factor equal to about 30% to reduce a resistance of the via 1125 and/or a width $W_{1135}$ of the via 1135 is wider than a width $W_{114}$ of the end portion 1124 by the second factor to reduce a resistance of the via 1135. A lower limit of the second factor is higher than about 10% so that the width $W_{1125}$ is wider than the width $W_{112}$ and/or the width $W_{1135}$ is wider than the width $W_{114}$ considering variability in the widths $W_{1125}$ and $W_{112}$, and/or the widths $W_{1135}$ and $W_{114}$ introduced by process variations. An upper limit of the second factor is set such that minimum spacing is maintained with adjacent structures in the via1 layer.

Figure 12:
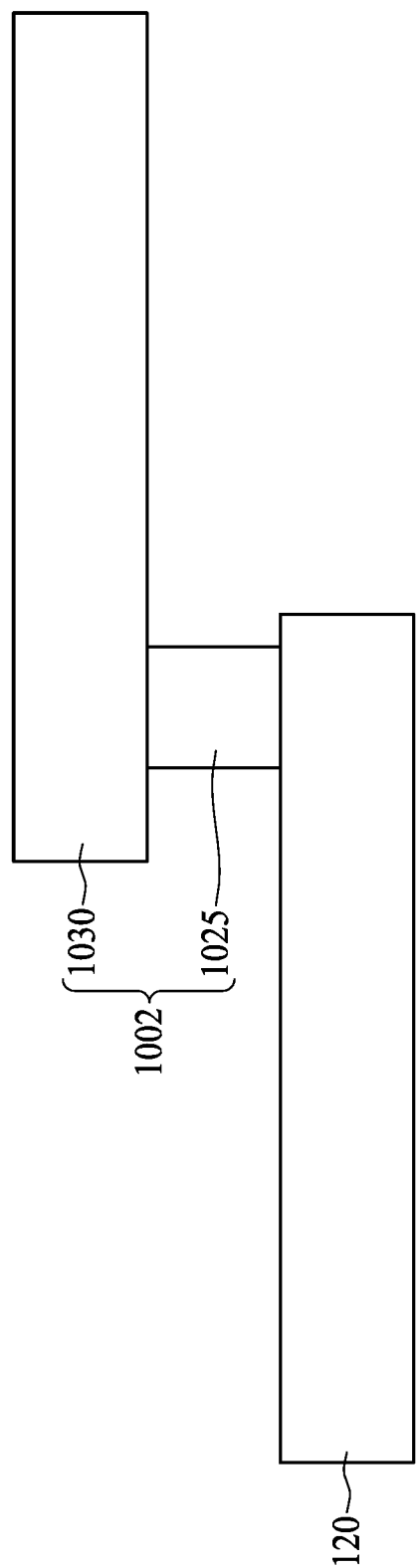
FIG. 12 is a cross-sectional diagram of the interconnect structure taken along line F-F' shown in FIG. 11A, in accordance with some embodiments.

FIG. 12 is a cross-sectional diagram of the interconnect structure 1000 taken along line F-F' shown in FIG. 11A, in accordance with some embodiments. FIG. 12 illustrates a damascene structure 1002 coupled to the metal line 120. The damascene structure 1002 includes the end-to-end portion 1030 formed in the metal layer M2 over the metal layer M1 which the metal line 120 resides and the via 1025 formed in the via layer via1 between the metal layers M1 and M2 to couple the end-to-end portion 1030 to the metal line 120. In some embodiments, the damascene structure 1002 is a dual damascene structure. In other embodiments, the damascene structure 1002 is a single damascene structure.

Figure 13A:
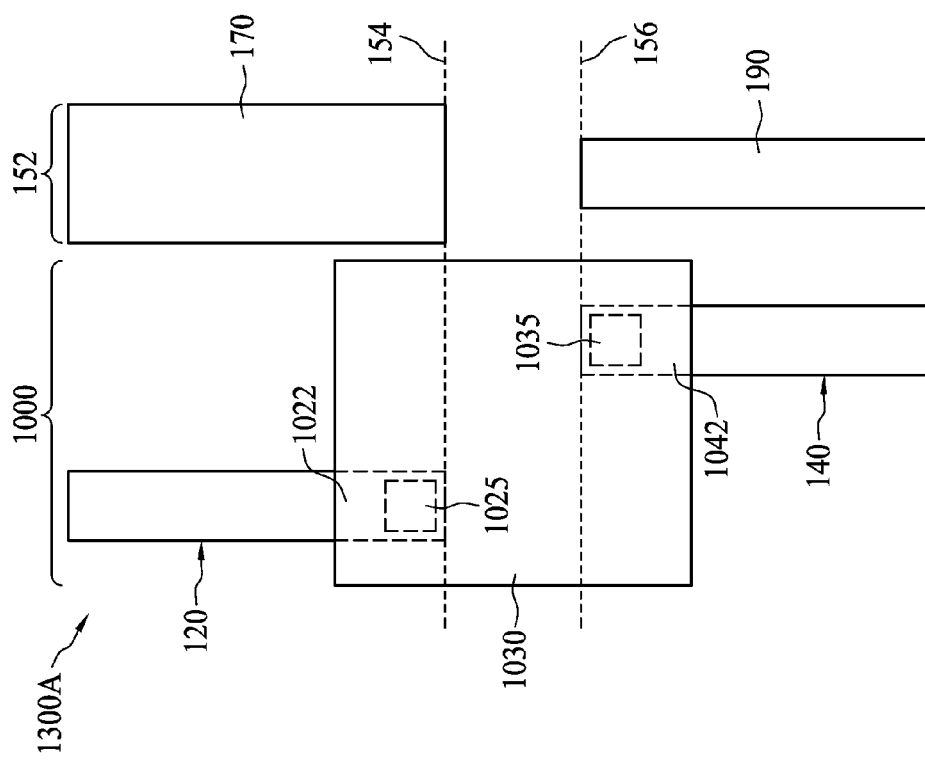
FIG. 13A is a top-view diagram of an interconnect structure that has the non-widened vias as shown in FIG. 11A which is coupled to the corresponding end portions not substantially extended beyond ends of metal lines adjacent to corresponding metal lines with which the end-to-end portion is overlapped, in accordance with some embodiments.

FIG. 13A is a top-view diagram of an interconnect structure 1300A that has non-widened vias 1025 and 1035 as shown in FIG. 11A, which are coupled to the corresponding end portions 1022 and 1042 not substantially extended beyond ends of metal lines 170 and 190 adjacent to corresponding metal lines 120 and 140, in accordance with some embodiments. The ends of metal lines 170 and 190 are shown coincided with the corresponding lines 154 and 156. The interconnect structure 1300A includes the interconnect structure 1000 described with reference to FIG. 11A, and the adjacent interconnect structure 152 described with reference to FIG. 4A. The end-to-end portion 1030 extends beyond the lines 154 and 156 to overlap with the end portion 1022 on the side of the metal line 170 and the end portion 1042 on the side of the metal line 190. The via 1025 is coupled between the end portion 1022 and the end-to-end portion 1030 beside the metal line 170, and the via 1025 is coupled between the end portion 1042 and the end-to-end portion 1030 beside the metal line 190. In some embodiments described with reference to FIG. 11A, the vias 1025 and 1035 are not substantially wider than the corresponding end portions 1022 and 1042 to avoid interfering with other vias in the via layer via1.

Figure 13B:
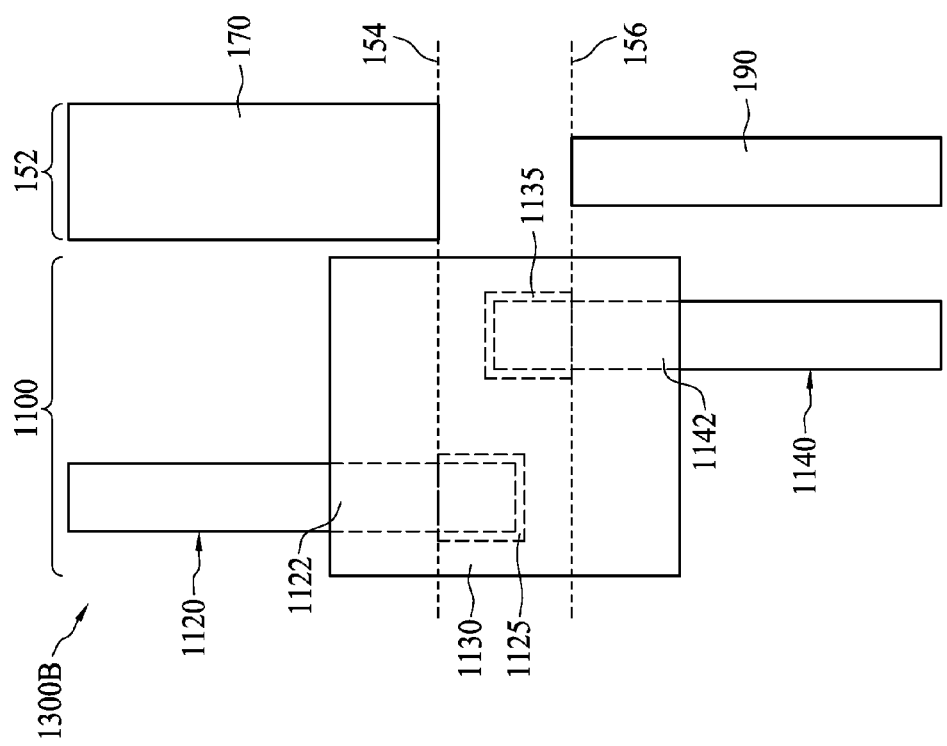
FIG. 13B is a top-view diagram of another interconnect structure that has widened vias as shown in FIG. 11B which is coupled to the corresponding end portions extended beyond ends of metal lines and adjacent to corresponding metal lines and with which the end-to-end portion is overlapped, in accordance with some embodiments.

FIG. 13B is a top-view diagram of another interconnect structure 1300B that has widened vias 1125 and 1135 as shown in FIG. 11B, which are coupled to the corresponding end portions 1122 and 1142 extended beyond ends of metal lines 170 and 190 adjacent to corresponding metal lines 1120 and 1140 and with which the end-to-end portion 1130 is overlapped, in accordance with some embodiments. Compared to the interconnect structure 1300A described with reference to FIG. 13A, the interconnect structure 1300B includes the interconnect structure 1100 described with reference to FIG. 11B instead of the interconnect structure 1000. Compared to the metal lines 120 and 140 of the interconnect structure 1000, the metal line 1120 runs in parallel with the metal line 170 and ends beyond a line 154 at which the metal line 170 ends, and the metal line 1140 starts behind a line 156 at which the metal line 190 starts and runs in parallel with the metal line 190. In some embodiments, the end-to-end portion 1130 overlaps with the end portion 1122 across the line 154 and the end portion 1142 across the line 156. Compared to the vias 1025 and 1035 of the interconnect structure 1000, the vias 1125 is located not on the side at which the metal line 170 reside with respect to the line 154, and the via 1135 is located not on the side at which the metal line 190 reside with respect to the line 156. In this way, the vias 1125 and 1135 are not adjacent to other vias in the via layer via1. Therefore, in some embodiments described with reference to FIG. 11B, the vias 1125 and 1135 are wider than the corresponding end portions 1122 and 1142.

Each interconnect structure in this section includes a connection structure over a metal line and is formed in a set of via layer and a second metal layer over a first metal layer. For example, the set is a via layer via1 and a metal layer M2 over a metal layer M1. Other interconnect structures including a connection structure over a metal line and formed in another set of via layer and a second metal layer over a first metal layer are within the contemplated scope of the present disclosure. For example, the other set includes a via layer via2 and a metal layer M3 over a metal layer M2, and a via layer via3 and a metal layer M4 over a metal layer M3, etc. Furthermore, other interconnect structures including a connection structure under a metal line and formed in another set of via layer and a second metal layer under a first metal layer are within the contemplated scope of the present disclosure. For example, the other set includes a via layer via1 and a metal layer M1 under a metal layer M2, and a via layer via2 and a metal layer M2 under a metal layer M3, etc.

Figure 14:
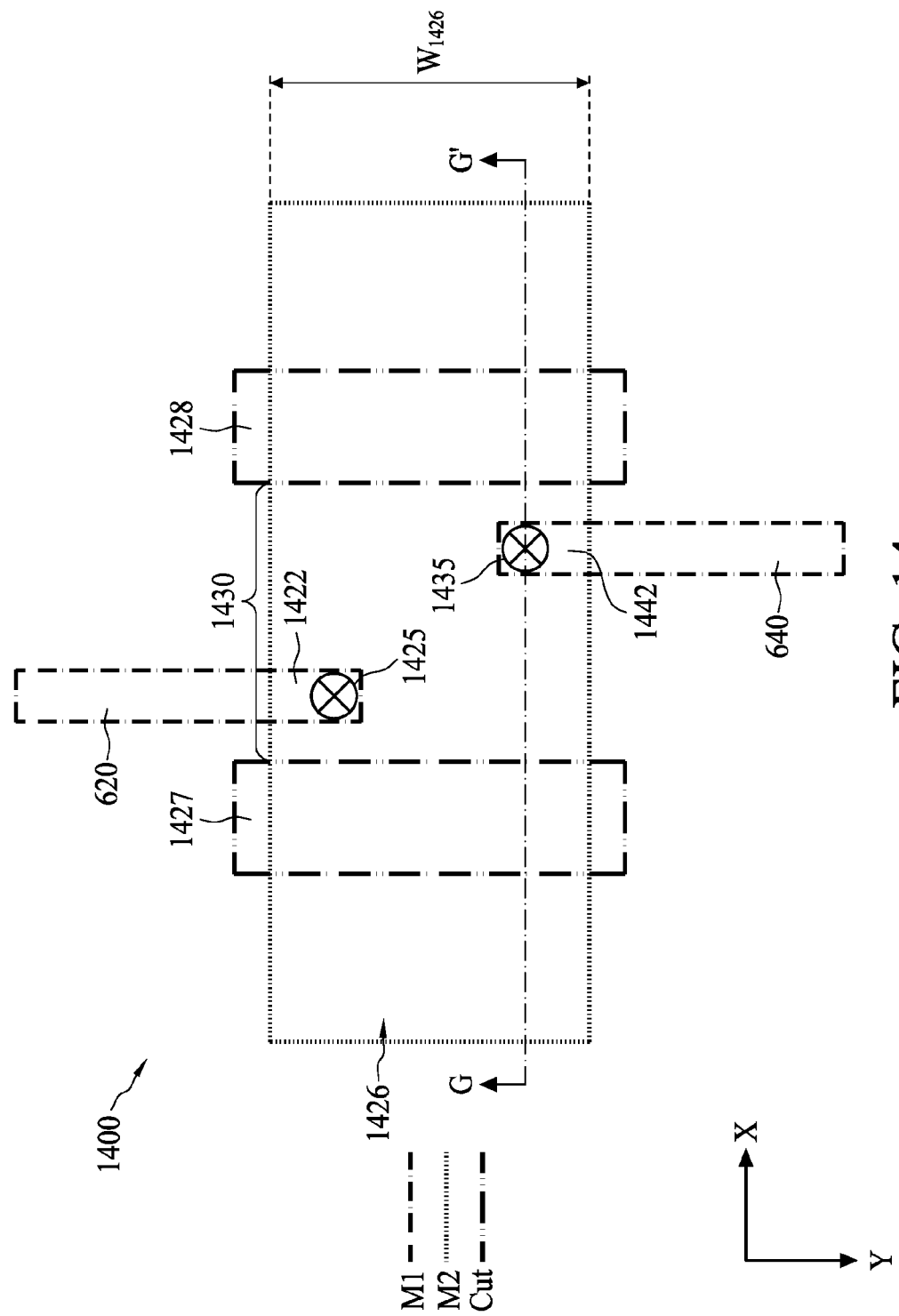
FIG. 14 is a diagram of a layout for forming the interconnect structure shown in FIG. 10A, in accordance with some embodiments.

Method for Forming Interconnect Structure with Misaligned Metal Lines Coupled Using Over Layer FIG. 14 is a diagram of a layout 1400 for forming the interconnect structure 1000 shown in FIG. 10A, in accordance with some embodiments. FIG. 14 illustrates the layout 1400 for forming the end-to-end portion 1030 shown in FIG. 10A by applying cut lines 1427 and 1428 on a metal line 1426 running substantially orthogonal to and overlapping with misaligned metal lines 620 and 640. The layout 1400 includes a metal layer M1, a metal layer M2 over the metal layer M1, a via layer via1 interposed between the metal layer M1 and the metal layer M2, and a cut layer imposed on the metal layer M2. The metal layer M1 includes the metal line 620 and the metal line 640. The metal line 620 extends in length substantially along a Y direction and ending at an end portion 1422. The metal line 640 starts from an end portion 1442 and extends in length substantially along the Y direction. The metal line 640 is misaligned with the metal line 620 in the Y direction.

The layout 1400 including a metal layer M1, a metal layer M2 over the metal layer M1, via layer via1 interposed between the metal layer M1 and metal layer M2, and a cut layer imposed on the metal layer M2 is exemplary. Layouts including other interconnect layers such as a layout including a metal layer M2, a metal layer M3 over the metal layer M2, a via layer via1 interposed between the metal layer M2 and metal layer M3, and a cut layer imposed on the metal layer M2, a layout including a metal layer M3, a metal layer M4 over the metal layer M3, a via layer via3 interposed between the metal layer M3 and metal layer M4, and a cut layer imposed on the metal layer M3, a layout including a metal layer M3, a metal layer M4 over the metal layer M3, a via layer via3 interposed between the metal layer M3 and metal layer M4, and a cut layer imposed on the metal layer M3, etc., is within the contemplated scope of the present disclosure.

In some embodiments, the metal layer M2 includes the metal line 1426 extends in length substantially along an X direction and has a width $W_{1426}$ such that the metal line 1426 overlaps with the end portion 1422 and the end portion 1442. The X direction is substantially orthogonal to the Y direction. The cut layer includes cut lines 1427 and 1428 that run across the width $W_{1426}$ of the metal line 1426 and are configured on opposite sides of the end portions 1427 and 1428. A portion 1430 of the metal line 1426 in between the cut lines 1427 and 1428 correspond to the end-to-end portion 1030 shown in FIG. 10A.

In some embodiments, the via layer via1 includes a via 1425 coupling the end portion 1422 in the metal layer M1 to the metal line 1426 in the metal layer M2, and a via 1435 coupling the end portion 1442 in the metal layer M1 to the metal line 1426 in the metal layer M2.

The layout 1400 including a metal layer M1, a via layer via1, a metal layer M2 and cut layers 1427 and 1428 is exemplary. Layouts formed in other interconnect layers are within the contemplated scope of the present disclosure.

FIGS. 15A to 15D are cross-sectional diagram illustrating a method for fabricating the interconnect structure 1000 shown in FIG. 10A using the layout 1400 shown in FIG. 14, in accordance with some embodiments. FIGS. 15A to 15D are the cross-sectional diagrams taken corresponding to line G-G' in the layout 1400. FIGS. 15A to 15D illustrate forming the end-to-end portion 1030 and the via 1035 shown in FIG. 10A using a via first dual damascene process and the cut lines 1427 and 1428 shown in FIG. 14. As labeled in FIG. 15C, for the via first dual damascene process, the formation of a dual damascene opening 1504 includes first etching a via opening 1535B and then etching a trench 1530. The cut lines 1427 and 1428 correspond to blocking structures 1527 and 1528 (shown in FIG. 15B) in an opening 1526 (shown in FIG. 15A) for creating the metal line 1426 shown in FIG. 14. Elements in the FIGS. 15A to 15D that are labeled with the same reference numerals as those of the elements in the interconnect structure 1000 are the same as the elements in the interconnect structure 1000.

Figure 15A:
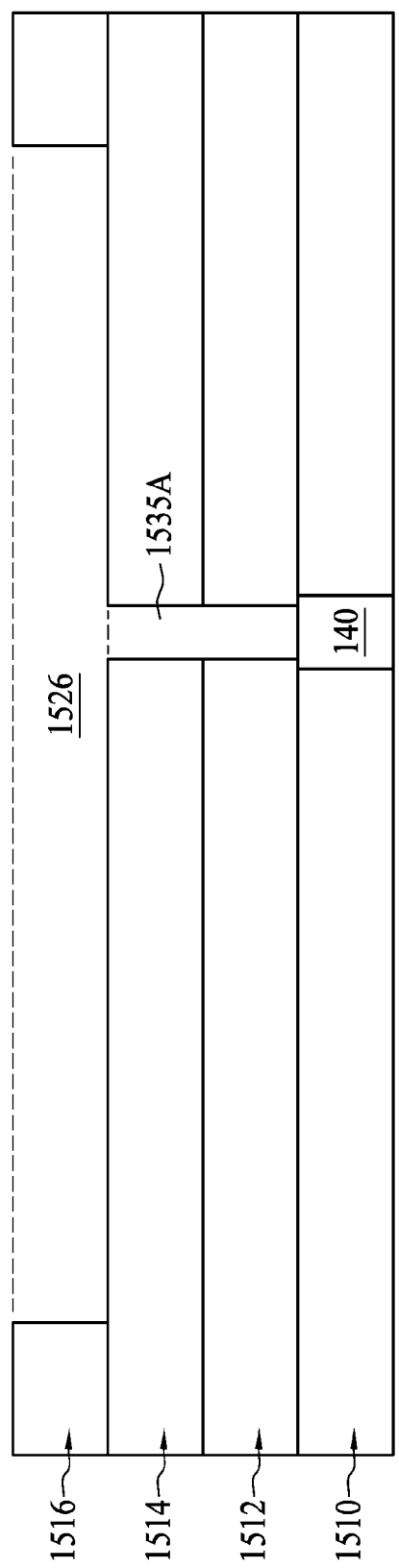
FIGS. 15A to 15D are cross-sectional diagram illustrating a method for fabricating the interconnect structure shown in FIG. 10A using the layout shown in FIG. 14, in accordance with some embodiments.

Referring to FIG. 15A, in some embodiments, a dielectric layer 1510 is provided. A metal line 140 is formed in the dielectric layer 1510. The metal line 140 is formed in accordance with the metal line 640 in the layout 1400 shown in FIG. 14. A dielectric layer 1512 is formed over the dielectric layer 1510. A dielectric layer 1514 is formed over the dielectric layer 1512. In some embodiments, each of the dielectric layers 1510, 1512 and 1514 is a stack of dielectric layers similar to the stack of dielectric layers 711 described with reference to FIG. 7A. An opening 1535A is formed in the dielectric layers 1512 and 1514 to expose a portion of the metal line 140. The opening 1535A is formed corresponding to the via 1435 in the layout 1400. A hard mask layer 1516 is formed over the dielectric layer 1514 and is patterned with an opening 1526 connected to the opening 1535A. The opening 1526 corresponds to the metal line 1426 in the layout 1400. In some embodiments, a protective coating (not shown) filling a portion of the opening 1535A is formed before depositing and patterning of the hard mask layer 1516 to protect exposed structure at a bottom of the opening 1535A. Exemplary materials and formation methods for each of the dielectric layers 1510, 1512 and 1514 have been provided with reference to FIG. 7A. Exemplary materials and formation methods for the metal line 140 have been provided with reference to FIGS. 7D and 7E. Exemplary formation methods for the opening 1535A have been provided with reference to FIG. 7A. Exemplary formation methods for patterning the hard mask layer 1516 to create an opening 1526 have been provided with reference to FIG. 9A.

Figure 15B:
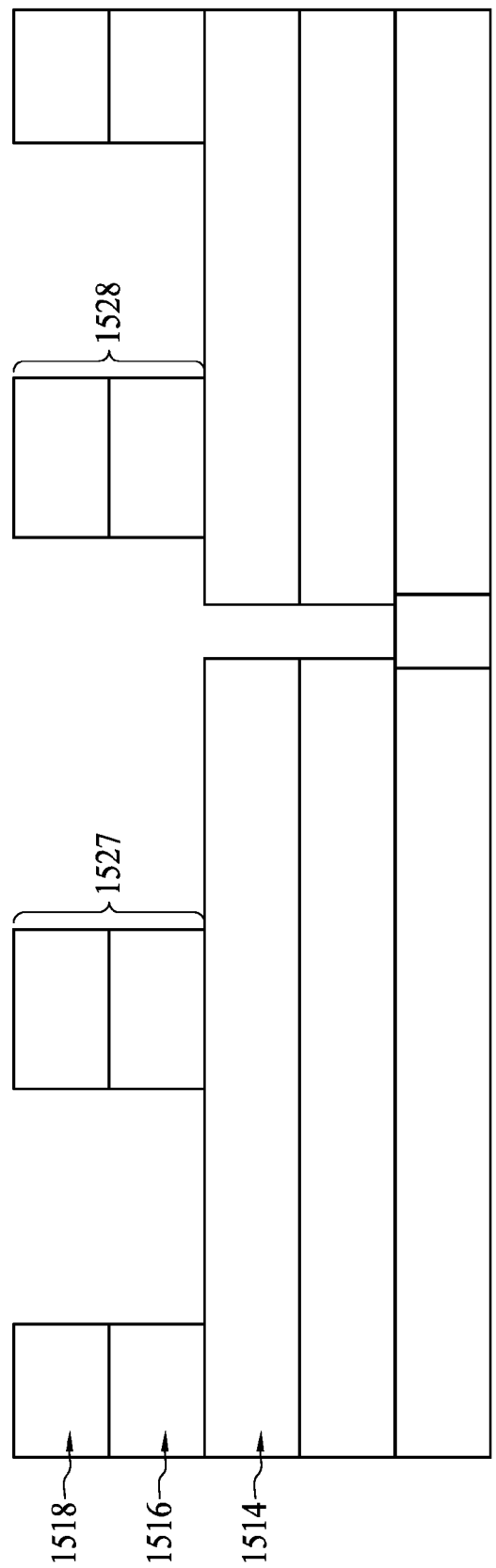

Referring to FIG. 15B, in some embodiments, a hard mask layer 1518 is formed over the hard mask layer 1516 and in the opening 1526 shown in FIG. 15A, and is patterned such that blocking structures 1527 and 1528 are formed in the opening 1526. The blocking structures 1527 and 1528 correspond to the corresponding cut lines 1427 and 1428 in the layout 1400. Exemplary formation methods for patterning the hard mask layer 1518 to form the block structures 1527 and 1528 have been provided with reference to FIG. 9A.

Figure 15C:
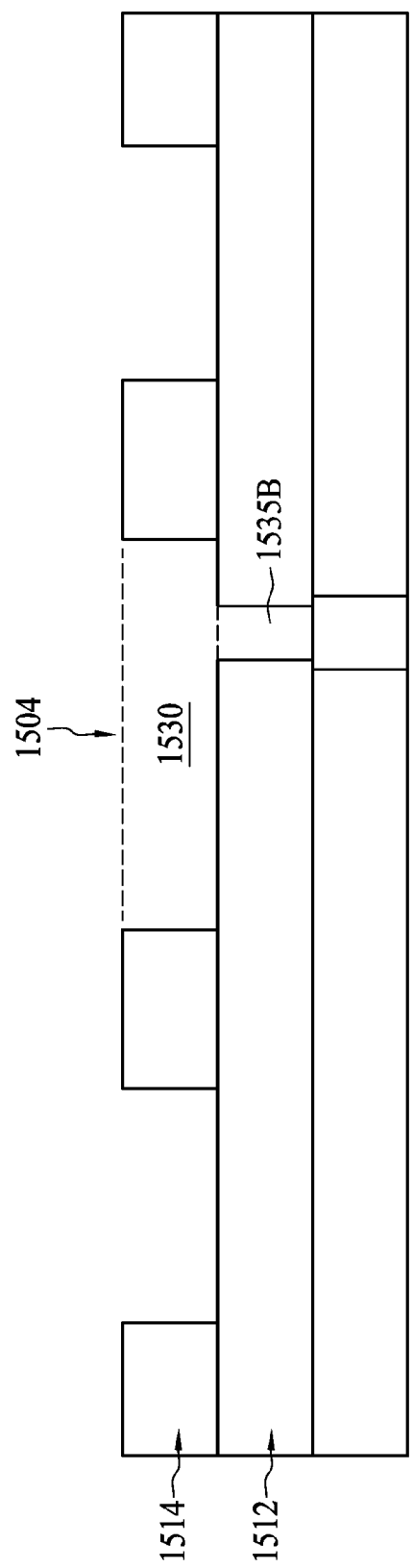

Referring to FIG. 15C, in some embodiments, the pattern formed collectively by the hard mask layers 1516 and 1518 shown in FIG. 15B is transferred to the underlying dielectric layer 1514 and thereby forms a dual damascene opening 1504 including the trench 1530 in the dielectric layer 1514 over the via opening 1535B in the dielectric layer 1512. The trench 1530 corresponds to the portion 1430 of the metal line 1426 in the layout 1400. The via opening 1535B corresponds to the via 1435 in the layout 1400. Exemplary methods for transferring the pattern to the dielectric layer 1514 have been provided with reference to FIG. 7A.

Figure 15D:
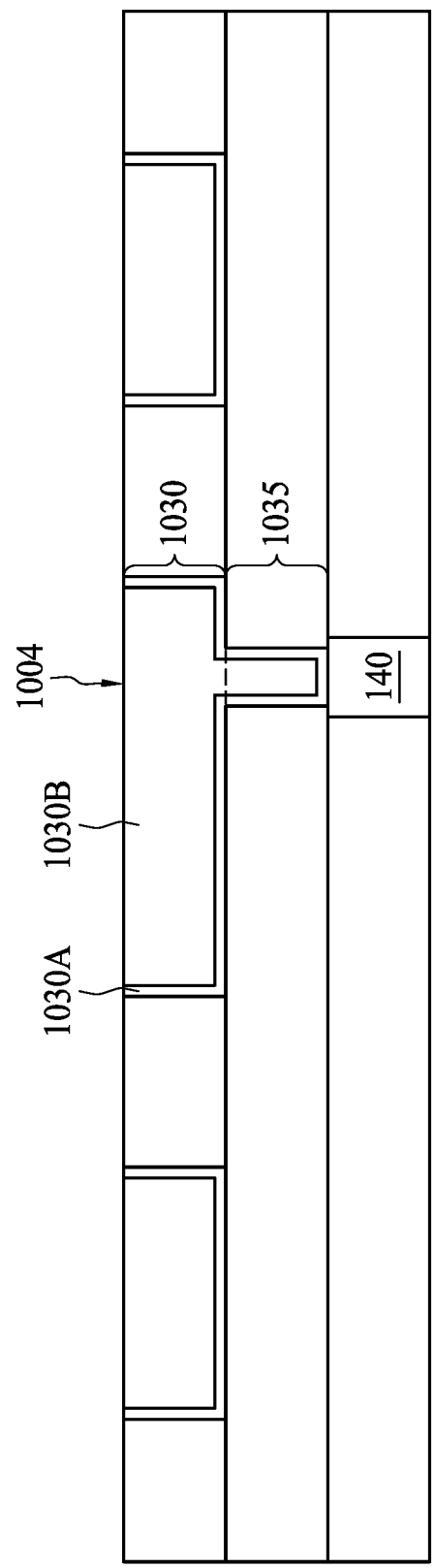

Referring to FIG. 15D, in some embodiments, a diffusion barrier layer 1030A is conformally deposited on side walls and a bottom of the dual damascene opening 1504 shown in FIG. 15C. A conductive layer 1030B is deposited to fill the remaining space of the dual damascene opening 1504. Exemplary materials and formation methods of the diffusion barrier layer 1030A and the conductive layer 1030B have been described with reference to FIG. 7B. The resulting structure is a dual damascene interconnect structure 1004 that includes the end-to-end portion 1030 and the via 1035. The via 1035 couples the underlying metal line 140 to the overlying end-to-end portion 1030.

The end-to-end portion 1030 and the via 1035 are formed using the via first dual damascene process. The end-to-end portion 1030 and the via 1035 formed using another dual damascene process or a single damascene process are within the contemplated scope of the present disclosure.

Each method in this section is for forming a corresponding interconnect structure including a connection structure over a metal line formed in a set of via layer and a second metal layer over a first metal layer. For example, the set is a via layer via1 and a metal layer M2 over a metal layer M1. Methods for forming other interconnect structures including a connection structure over a metal line and formed in another set of via layer and a second metal layer over a first metal layer are within the contemplated scope of the present disclosure. For example, the other set includes a via layer via2 and a metal layer M3 over a metal layer M2, and a via layer via3 and a metal layer M4 over a metal layer M3, etc. Furthermore, methods for forming other interconnect structures including a connection structure under a metal line and formed in another set of via layer and a second metal layer under a first metal layer are within the contemplated scope of the present disclosure. For example, the other set includes a via layer via1 and a metal layer M1 under a metal layer M2, and a via layer via2 and a metal layer M2 under a metal layer M3, etc.

Figure 16:
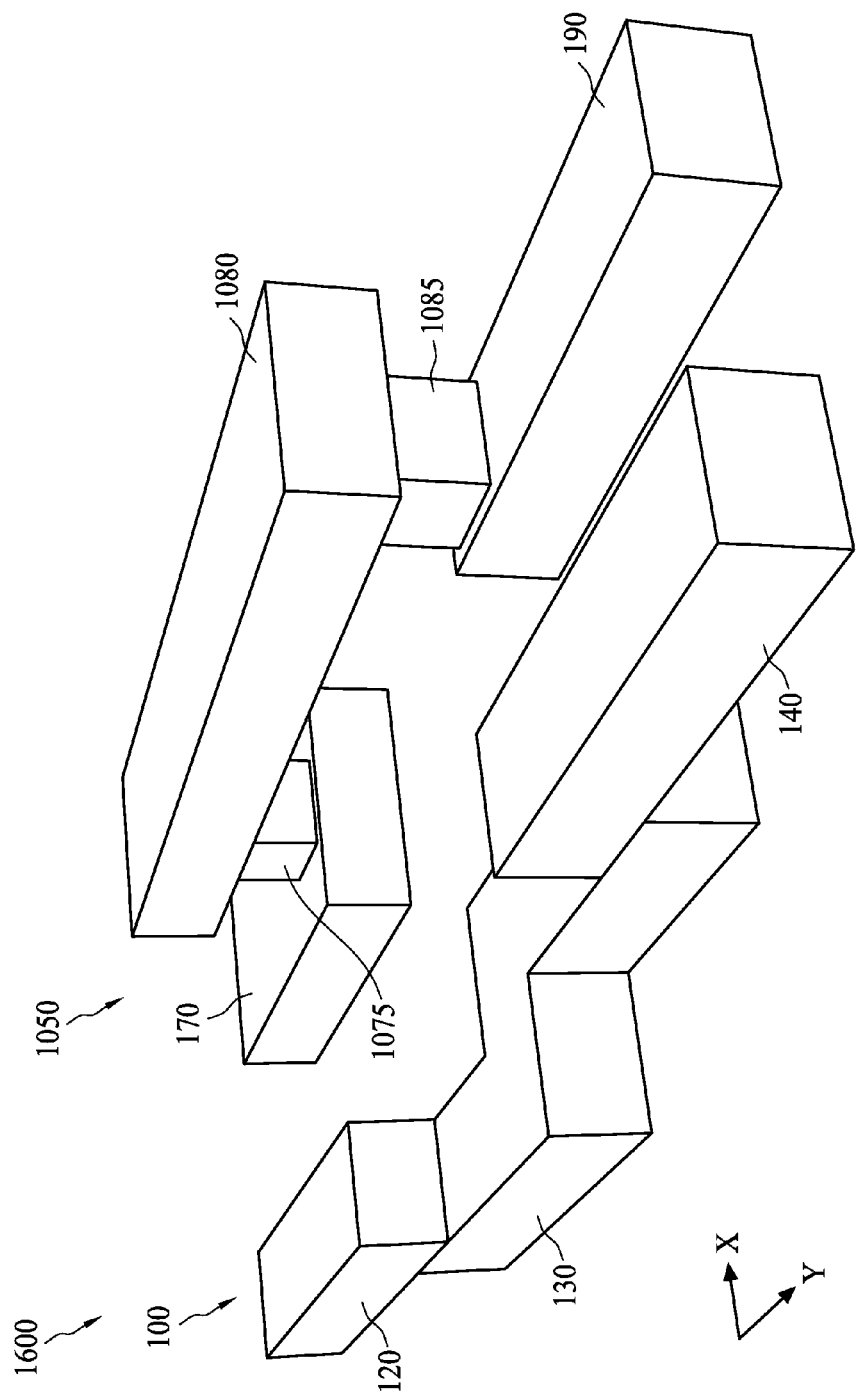
FIG. 16 is a perspective diagram of an interconnect structure including the interconnect structure shown in FIG. 1A and the interconnect structure shown in FIG. 10B formed adjacent to the interconnect structure, in accordance with some embodiments.

Interconnect Structure with Misaligned Metal Lines Coupled Using Under/Over Layer and Adjacent Metal Lines Coupled Using Over/Under Layer FIG. 16 is a perspective diagram of an interconnect structure 1600 including the interconnect structure 100 shown in FIG. 1A and the interconnect structure 1050 shown in FIG. 10B formed adjacent to the interconnect structure 100, in accordance with some embodiments. The metal lines 170 and 190 are formed in the same interconnect layer as the metal lines 120 and 140. The metal line 170 is formed adjacent to the metal line 120 and the metal line 190 is formed adjacent to the metal line 140. The metal lines 120 and 140 are coupled together using the end-to-end portion 130 in the interconnect layer under that of the metal lines 120 and 140. To avoid interfering with the end-to-end portion 130, the metal lines 170 and 190 are coupled to each other using the end-to-end portion 1080 in the interconnect layer over that of the metal lines 170 and 190 and vias 1075 and 1085 interposed between the corresponding metal lines 170 and 190 and the end-to-end portion 1080.

Figure 17:
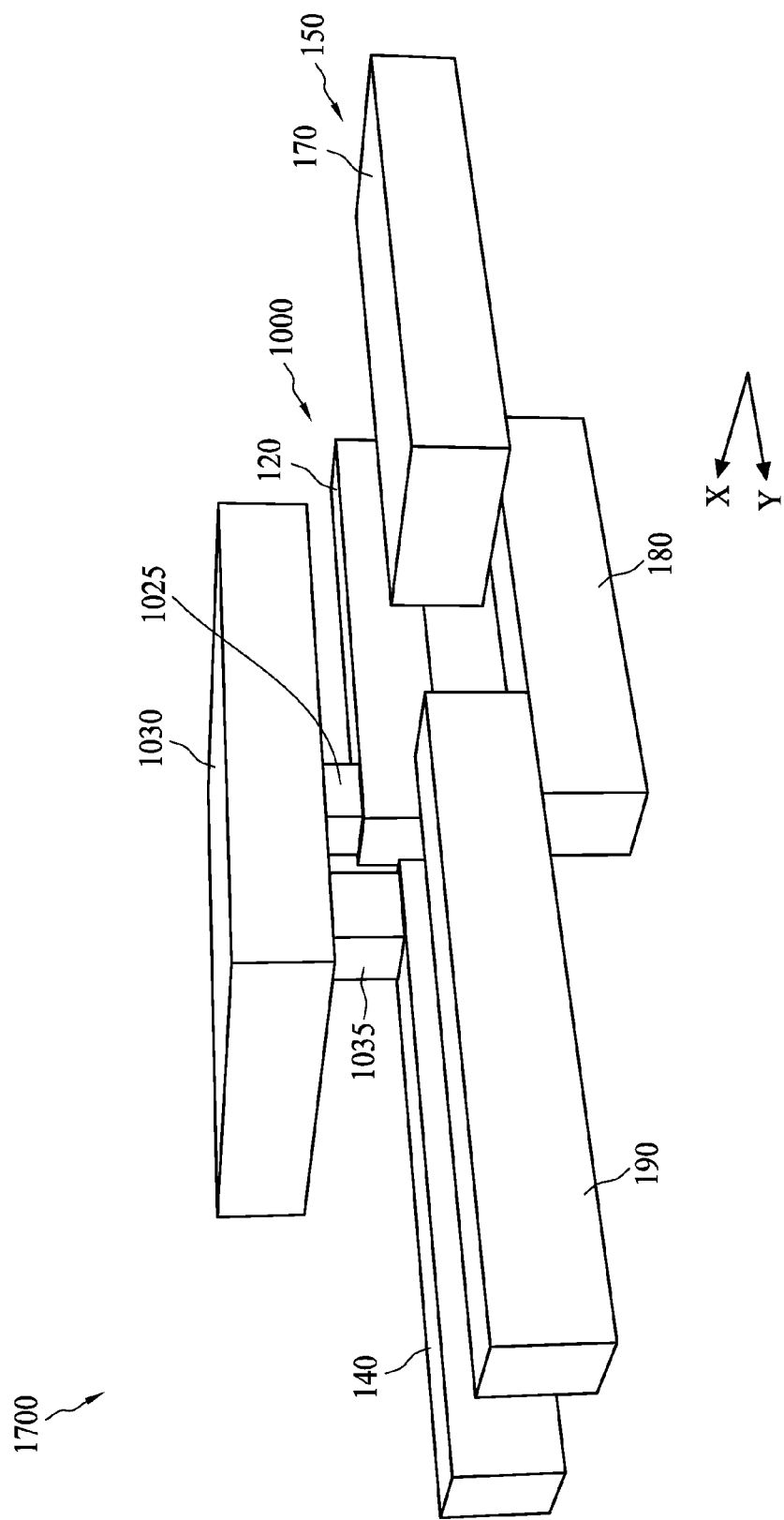
FIG. 17 is a perspective diagram of an interconnect structure including the interconnect structure shown in FIG. 10A and the interconnect structure shown in FIG. 1B formed adjacent to the interconnect structure, in accordance with some embodiments.

FIG. 17 is a perspective diagram of an interconnect structure 1700 including the interconnect structure 1000 shown in FIG. 10A and the interconnect structure 150 shown in FIG. 1B formed adjacent to the interconnect structure 1000, in accordance with some embodiments. The metal lines 170 and 190 are formed in the same interconnect layer as the metal lines 120 and 140. The metal line 170 is formed adjacent to the metal line 120 and the metal line 190 is formed adjacent to the metal line 140. To avoid interfering with the end-to-end portion 1030 and the vias 1025 and 1035 coupling the metal lines 120 and 140 together using the interconnect layers over that of the metal lines 120 and 140, the metal lines 170 and 190 are coupled to each other using an end-to-end portion 180 in the interconnect layer under that of the metal lines 170 and 190.

Single-Port SRAM Macro

An SRAM macro includes a portion for array of array cells that include metal lines which are routed not on-grid, and a portion for input and output (IO) circuit that includes metal lines that are routed on-grid to save area of the SRAM macro. Due to limitations of lithography tools, optical proximity correction (OPC) is performed on layouts in consideration of a distance between patterns or a combination of patterns of different shapes. In order for the number of combinations of patterns of different pattern shapes and pitches corrected by OPC to be bounded, the patterns are routed on-grid. For each pattern routed on-grid, the pattern is arranged based on grid points as intersections of grid lines. As a result, an exemplary pattern routed on-grid has a pattern border along a midline between grid lines. For the SRAM macro, the portion for the IC circuit is routed on grid to save execution time of the OPC. On the other hand, the portion of the array of array cells is not routed on-grid to save area. For each pattern not routed on-grid, the pattern is not arranged based on the grid points although following the corresponding wiring rule as each pattern routed on-grid. As a result, an exemplary pattern not routed on-grid has a pattern border off the midline between the grid lines. The embodiments described with references to FIGS. 1 to 17 are applied to the SRAM macro, and are described in the following.

Figure 18:
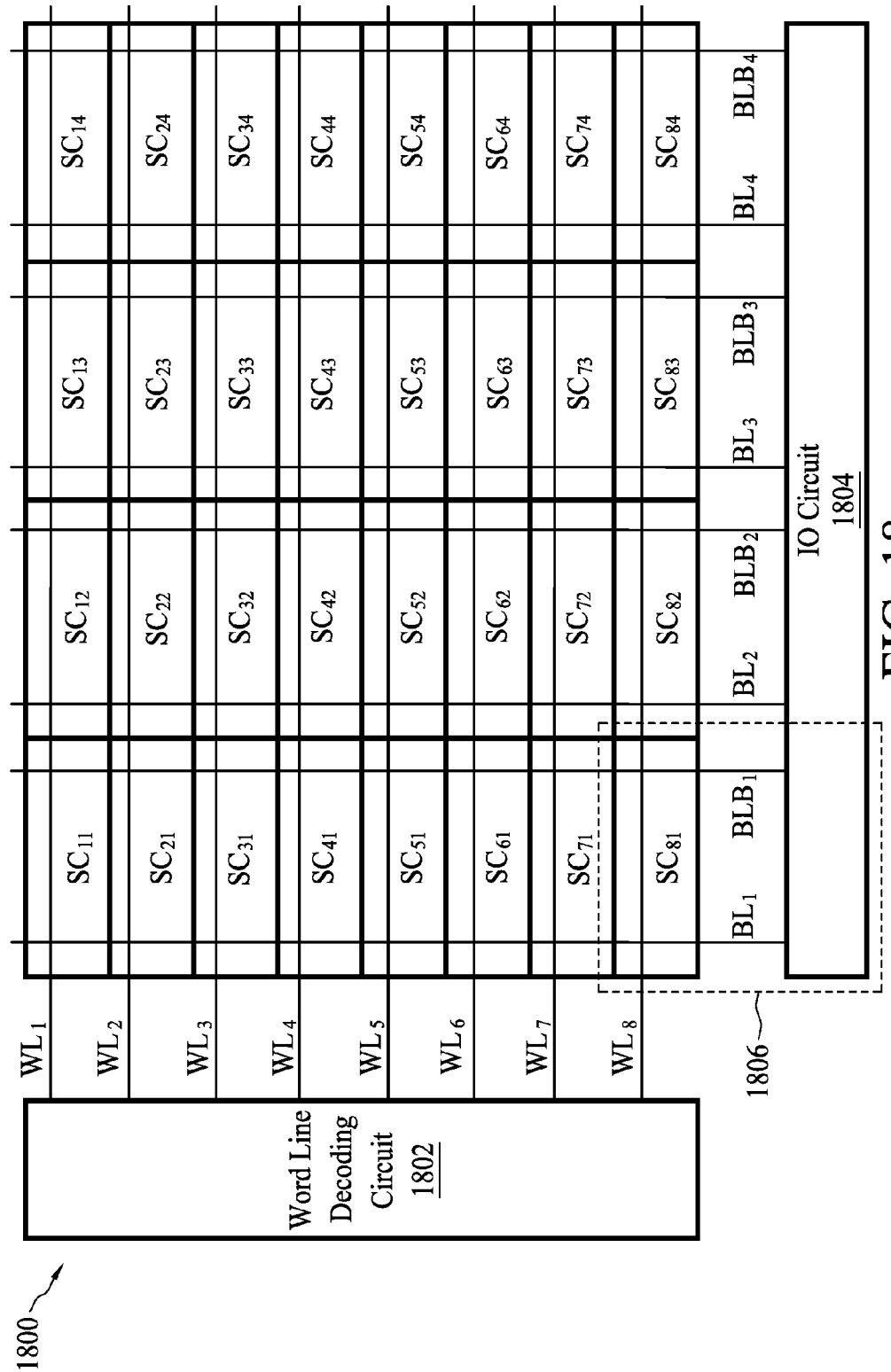
FIG. 18 is a block diagram of an SRAM macro in a semiconductor chip, in accordance with some embodiments.

FIG. 18 is a block diagram of an SRAM macro 1800 in a semiconductor chip, in accordance with some embodiments. Any of the connection structures 124 and 1024 described with references to corresponding FIGS. 1A, 2A to 5 and 10A, 11A to 13B is applicable to form connections between array cells $SC_{81}, \ldots$ to $SC_{84}$ and an IO circuit 1804 shown in FIG. 18.

The SRAM macro 1800 includes an array of array cells $SC_{11}, SC_{12}, \ldots$ and $SC_{84}$, a word line decoding circuit 1802 and an IO circuit 1804. Types of an accessing circuit includes the IO circuit 1804 and the word line decoding circuit 1802. The word line decoding circuit 1802 drives a plurality of word lines $WL_1$, $WL_2$, ... and $WL_8$ running along corresponding rows of array cells $SC_{11}$ to $SC_{14}$, $SC_{21}$ to $SC_{24}$, ... and $SC_{81}$ to $SC_{84}$. The IO circuit 1804 drives or receives a plurality of pairs of bit line and complementary bit line $BL_1$ and $BLB_1$, $BL_2$ and $BLB_2$, ... and $BL_4$ and $BLB_4$ running along corresponding columns of array cells $SC_{11}$ to $SC_{81}$, $SC_{12}$ to $SC_{82}$, ... and $SC_{14}$ to $SC_{84}$. Types of an accessing line includes the word line such as the plurality of word lines $WL_1$, $WL_2$, ... and $WL_8$, and the pair of bit line or complementary bit line such as the plurality of pairs of bit line and complementary bit line $BL_1$ and $BLB_1$, $BL_2$ and $BLB_2$, ... and $BL_4$ and $BLB_4$. The word line decoding circuit 1802 is configured to receive a row address, decode the row address and assert, for example, a corresponding one of the word lines $WL_1$, $WL_2$, ... and $WL_8$ such that a corresponding row of the array cells $SC_{11}$ to $SC_{14}$, $SC_{21}$ to $SC_{24}$, ... or $SC_{81}$ to $SC_{84}$ is selected for access. For a read operation, the IO circuit 1804 is configured to pre-charge and equalize the plurality of pairs of bit line and complementary bit line $BL_1$ and $BLB_1$, $BL_2$ and $BLB_2$, ... and $BL_4$ and $BLB_4$, sense data based on differential voltages received through the plurality of pairs of bit line and complementary bit line $BL_1$ and $BLB_1$, $BL_2$ and $BLB_2$, ... and $BL_4$ and $BLB_4$, and select sensed data in a column corresponding to a decoded column address and output the data. For a write operation, the IO circuit 1804 is configured to select a column corresponding to a decoded column address for inputting data and driving the selected pair of bit line and complementary bit line $BL_1$ and $BLB_1$, $BL_2$ or $BLB_2$, ... or $BL_4$ and $BLB_4$ in accordance with the input data such that the input data is stored in the array cell $SC_{11}$, $SC_{12}$ ... or $SC_{84}$. Circuitry including the word line decoding circuit 1802 and the IO circuit 1804 can be called a peripheral circuit.

For simplicity, the SRAM macro 1800 is exemplarily shown as a single-bank memory. In some embodiments, a single bank memory includes an array of array cells and accessing circuitry that access the array of array cells under a flat addressing scheme. Under the flat addressing scheme, each array cell in the array of array cell has a row address and a column address. In some embodiments, a multi-bank memory includes multiple arrays of array cells and global and local accessing circuitry that access the multiple arrays of array cells under a hierarchical addressing scheme. Under the hierarchical addressing scheme, each array cell in the multiple arrays of array cells has a bank address, a row address and a column address. A multi-bank memory that has a memory bank and its local accessing circuitry similar to the SRAM macro 1800 is within the contemplated scope of the present disclosure. As an example for illustration, the SRAM macro 1800 has 8 rows and 4 columns. Other numbers of rows and/or columns are within the contemplated scope of the present disclosure.

Figure 19:
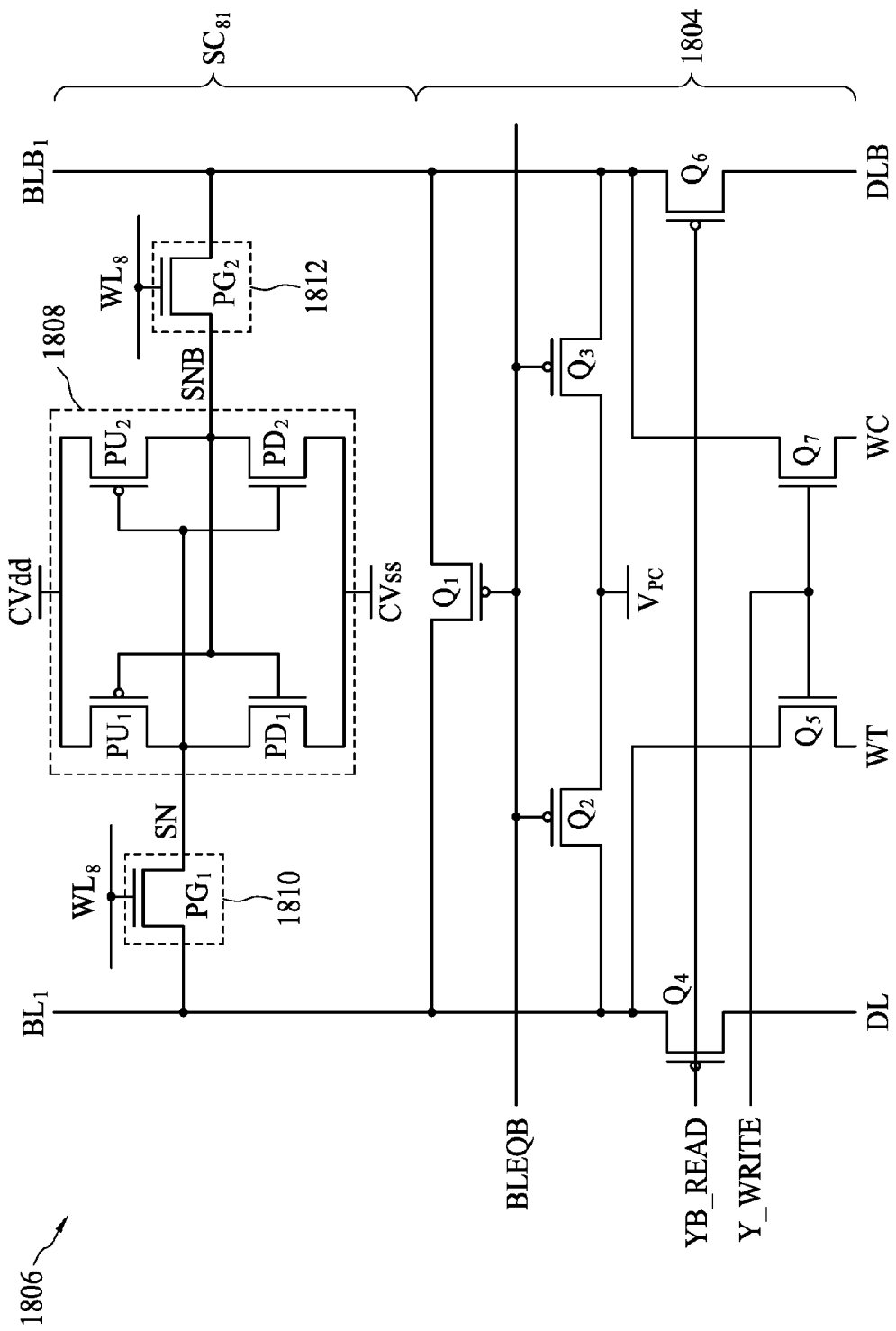
FIG. 19 is a circuit diagram of a circuit shown in FIG. 18, in accordance with some embodiments.

FIG. 19 is a circuit diagram of a circuit 1806 shown in FIG. 18, in accordance with some embodiments. FIG. 19 illustrates elements in the circuit 1806 and the connections between the elements. In some embodiments, the circuit 1806 includes the array cell $SC_{81}$ and a corresponding portion of the IO circuit 1804 (labeled in FIG. 18). Other array cells $SC_{82}$, $S_{83}$ ... and $S_{84}$ and the corresponding portions of the IO circuit 1804 are similar to the circuit 1806. The array cell $SC_{81}$ includes a cross-coupled inverter pair 1808 and pass gates 1810 and 1812. The inverter pair 1808 is configured to hold data at a storage node SN and a complementary storage node SNB. The pass gate 1810 is configured to couple the bit line $BL_1$ to the storage node SN in response to a signal at the word line $WL_8$. The pass gate 1812 is configured to couple the complementary bit line $BLB_1$ to the complementary storage node SNB in response to the signal at the word line $WL_8$.

In some embodiments, a first inverter of the inverter pair 1808 includes a P-type field effect transistor (P-FET) $PU_1$ and an N-FET $PD_1$. A source of the P-FET $PU_1$ is coupled to a higher power supply node CVdd. A source of the N-FET $PD_1$ is coupled to a lower power supply node CVss. Drains of the P-FET $PU_1$ and the N-FET $PD_1$ are coupled together to the storage node SN. Gates of the P-FET $PU_1$ and the N-FET $PD_1$ are coupled together to the storage node SNB. A second inverter of the inverter pair includes a P-FET $PU_2$ and an N-FET $PD_2$. A source of the P-FET $PU_2$ is coupled to the higher power supply node CVdd. A source of the N-FET $PD_2$ is coupled to the lower power supply node CVss. Drains of the P-FET $PU_2$ and the N-FET $PD_2$ are coupled together to the complementary storage node SNB. Gates of the P-FET $PU_2$ and the N-FET $PD_2$ are coupled together to the storage node SN.

The pass gate 1810 includes an N-FET $PG_1$ of which a gate is coupled to the word line $WL_8$, a first source or drain is coupled to the storage node SN and a second source or drain is coupled to the bit line $BL_1$. The pass gate 1812 includes an N-FET $PG_2$ of which a gate is coupled to the word line $WL_8$, a first source or drain is coupled to the complementary storage node SNB and a second source or drain is coupled to the complementary bit line $BLB_1$.

In some embodiments, the portion of the IO circuit 1804 corresponding to the array cell $SC_{81}$ includes a P-FET $Q_1$, a P-FET $Q_2$ and a P-FET $Q_3$ for a pre-charge and equalization operation, a P-FET $Q_4$ and a P-FET $Q_6$ for a read operation, and an N-FET $Q_5$ and an N-FET $Q_7$ for a write operation. For simplicity, circuitry for sensing data from the pair of bit line and complementary bit line $BL_1$ and $BLB_1$ for the read operation and driving the pair of bit line and complementary bit line $BL_1$ and $BLB_1$ for the write operation are not shown.

In some embodiments, a first source or drain and a second source or drain of the P-FET $Q_1$ are coupled to the corresponding bit line $BL_1$ and complementary bit line $BLB_1$ and a gate of the P-FET $Q_1$ is coupled to a control line BLEQB. Sources of the P-FETs $Q_2$ and $Q_3$ are coupled together to a pre-charge voltage $V_{PC}$, drains of the P-FETs $Q_2$ and $Q_3$ are coupled to the corresponding bit line $BL_1$ and complementary bit line $BLB_1$ and gates of the P-FETs $Q_2$ and $Q_3$ are coupled together to the control line BLEQB. During the equalization and pre-charge operation before the read operation, a signal at the control line BLEQB turns on the P-FETs $Q_1$, $Q_2$ and $Q_3$. While the P-FETs $Q_2$ and $Q_3$ pre-charge the bit line $BL_1$ and the complementary bit line $BLB_1$ to the pre-charge voltage $V_{PC}$, the P-FET $Q_1$ helps speeding up this process by equalizing the initial voltages on the bit line $BL_1$ and the complementary bit line $BLB_1$.

In some embodiments, during the read operation, the P-FETs $Q_4$ and $Q_6$ couple the corresponding bit line $BL_1$ and complementary bit line $BLB_1$ to a corresponding output data line DL and complementary output data line DLB in response to a signal at a control line YB_READ. In some embodiments, the signal at the control line YB_READ is generated in accordance with a decoded column address. In some embodiments, during the write operation, the N-FETs $Q_5$ and $Q_7$ couple a corresponding input data line WT and complementary input data line WC to the corresponding bit line $BL_1$ and complementary bit line $BLB_1$ in response to a signal at a control line Y_WRITE. In some embodiments, the signal at the control line Y_WRITE is generated in accordance with a decoded column address.

A bit line (e.g. $BL_1$) is also called a data line and a complementary bit line (e.g. $BLB_1$) is also called a complementary data line because the bit line $BL_1$ and the complementary bit line $BLB_1$ carry data for the array cell (e.g. $SC_{81}$).

Diagrams of Layouts and cross-sections of various embodiments of the circuit 1806 shown in FIG. 19 are shown below. In IC fabrication processes, front-end-of-line (FEOL) forms devices such as transistors and therefore covers device layers and a contact layer before a layer via0, and back-end-of-line (BEOL) forms a stack of interconnect layers for connecting the devices and hence covers stacked metal layers over the contact layer and a respective via layer interposed between each pair of stacked metal layers. As an example, a cross-section 2202 shown in FIG. 23 of the circuit 1806 includes an FEOL portion 2204 and a BEOL portion 2206 formed during the corresponding FEOL and BEOL of the IC fabrication processes. A layout 2000 shown in FIG. 20 include layers of the array cell $SC_{81}$ in the FEOL portion 2204, a layout 2002 shown in FIG. 21 include layers of the array cell $SC_{81}$ in the BEOL portion 2206 and the metal layer M3 of the array cell $SC_{81}$ not shown in the cross-section 2202. Further, a layout 2200A shown in FIG. 22A include layers upto the metal layer M1 of the array cell $SC_{81}$ and the IO circuit 1804 in the BEOL portion 2206. The layout 2000 further includes a via layer via0 in the BEOL portion 2206 for showing structural connections of the FEOL portion 2204 to the BEOL portion 2206. Similarly, the layers in the layout 2000 shown in FIG. 20, the layout 2002 shown in FIG. 21 and each of the layouts 2200B shown in FIG. 22B to 2200D shown in FIG. 22D, and 2400 shown in FIG. 24 can be mapped to those in the FEOL portion 2204 and BEOL portion 2206 shown in FIG. 23. The layers in the layout 2000 shown in FIG. 20, the layout 2002 shown in FIG. 21 and a layout 2500 shown in FIG. 25 can be mapped to those in the FEOL portion 2504 and BEOL portion 2506 shown in FIG. 26. Layers in a layout 2700 shown in FIG. 27, a layout 2702 shown in FIG. 28, a layout shown in FIG. 29 can be mapped to those in the FEOL portion 2904 and BEOL portion 2906 shown in FIG. 30. The layers in the layout 2700 shown in FIG. 27, the layout 2702 shown in FIG. 28 and a layout 3100 shown in FIG. 31 can be mapped to those in the FEOL portion 3104 and BEOL portion 3106 shown in FIG. 33.

Figure 20:
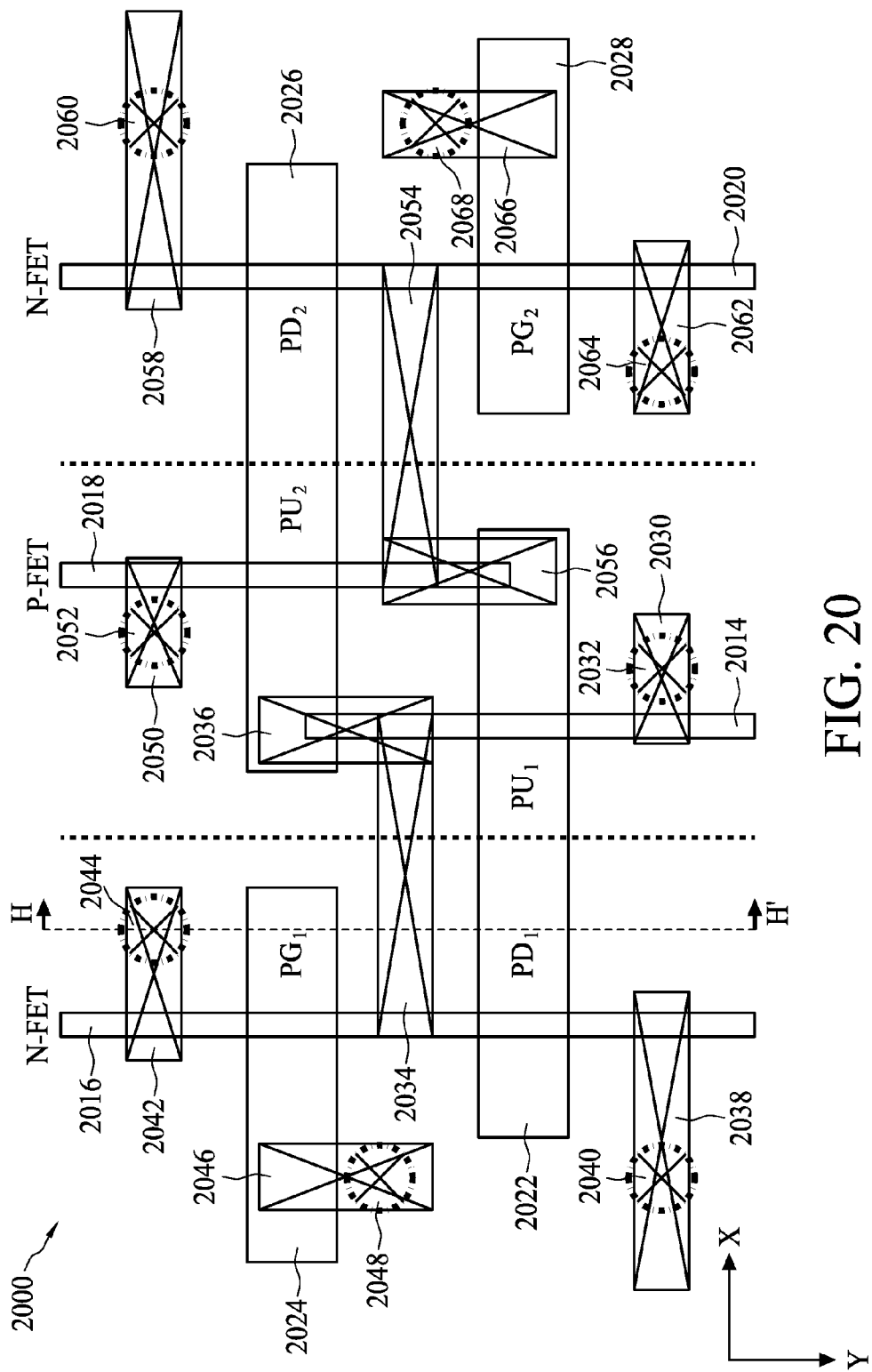
FIG. 20 is a diagram of the layout including the layers of the array cell in the FEOL portion and the via layer via0 of the array cell in the BEOL portion shown in FIG. 23, in accordance with some embodiments.
Figure 23:
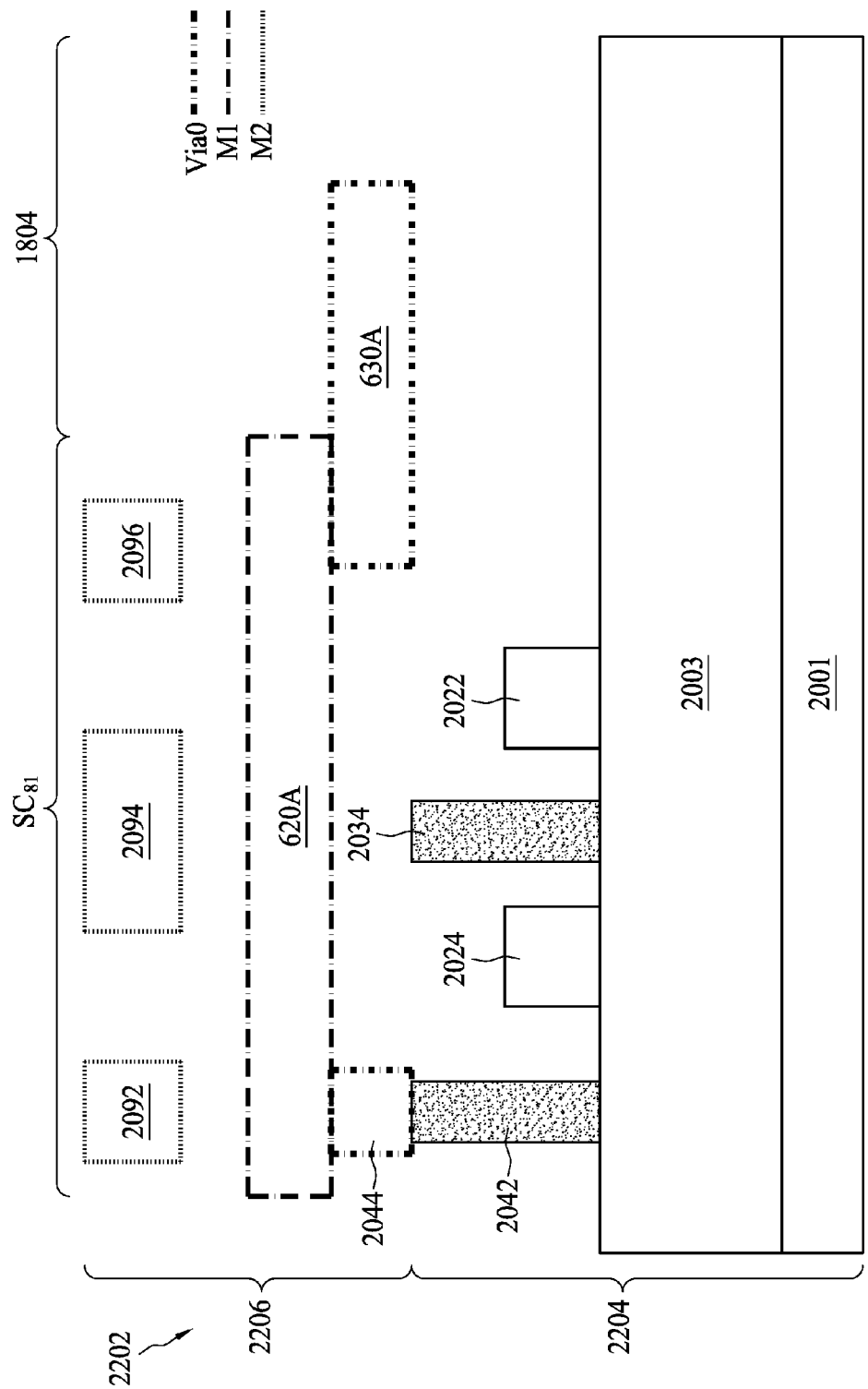
FIG. 23 is a diagram of the cross-section of the circuit taken corresponding to line H-H' shown in FIG. 20, line I-I' shown in FIG. 21 and line J-J' shown in 22A, in accordance with some embodiments.

FIG. 20 is a diagram of the layout 2000 including the layers of the array cell $SC_{81}$ (indicated in FIG. 19) in the FEOL portion 2204 and the via layer via0 of the array cell $SC_{81}$ in the BEOL portion 2206 shown in FIG. 23, in accordance with some embodiments. FIG. 20 illustrates the array cell $SC_{81}$ implemented by single-finned FinFETs. In some embodiments, the FEOL portion is the portion of IC fabrication where devices such as transistors are patterned and includes, for example, device layers and a contact layer before the layer via0. The formation of the layer via0 is considered the beginning of a back-end of line (BEOL) portion of the IC fabrication. The BEOL portion includes a stack of interconnect layers over the FEOL portion. The stack of interconnect layers is formed with stacked metal layers and a respective via layer interposed between each pair of stacked metal layers. The layer via0 is the via layer between the FEOL contact layer and a BEOL metal layer M1. To facilitate the following description, shapes in the layouts are referred to by names of corresponding structural elements in the semiconductor chip.

The layout diagram 2000 includes a plurality of fin structures 2014, 2016, 2018 and 2020 extending in length substantially along a Y direction, a plurality of gate structures 2022, 2024, 2026 and 2028 extending in length substantially along an X direction, a plurality of source or drain contacts 2030, 2034, 2038, 2042, 2050, 2054, 2058 and 2062 extending in length along the X direction, a plurality of gate contacts 2036, 2046, 2056 and 2066 extending in length along the Y direction, and a plurality of vias 2032, 2040, 2044, 2048, 2052, 2060, 2064 and 2068 in the layer via0. In some embodiments, the X direction is along rows of array cells such as the row of array cells $SC_{11}$, $SC_{12}$ . . . and $SC_{14}$ shown in FIG. 18, and the Y direction is along columns of array cells such as the column of array cells $SC_{11}$, $SC_{21}$ . . . and $SC_{81}$.

The FETs $PU_1$, $PD_1$, $PG_1$, $PU_2$, $PD_2$ and $PG_2$ shown in FIG. 19 are arranged in three portions in the layout diagram 2000. The middle portion is dedicated to the P-FETs $PU_1$ and $PU_2$, the left portion corresponds to the N-FETs $PD_1$ and $PG_1$ and the right portion belongs to the N-FETs $PD_2$ and $PG_2$. For the P-FET $PU_1$, the gate includes the gate structure 2022 wrapping around a channel region in the fin structure 2014, and the source and drain include a corresponding source region and a drain region in the fin structure 2014 on opposite sides of the gate structure 2022. For the N-FET $PD_1$, the gate includes the gate structure 2022 wrapping around a first channel region in the fin structure 2016, and the source and drain include a corresponding source region and a drain region in the fin structure 2016 on opposite sides of the gate structure 2022. Since the gate structure 2022 traverses both the fin structure 2014 and the fin structure 2016, the gates of the P-FET $PU_1$ and the N-FET $PD_1$ are coupled together. For the N-FET $PG_1$, the gate includes the gate structure 2024 wrapping around a second channel region in the fin structure 2016, and the first source or drain and the second source or drain include a corresponding first source or drain region and a second source or drain region in the fin structure 2016 on opposite sides of the gate structure 2024. The drain region for the N-FET $PD_1$ and the first source or drain region for the N-FET $PG_1$ are shared in the fin structure 2016. Since the drain region for the N-FET $PD_1$ and the first source or drain region for the N-FET $PG_1$ are shared in the fin structure 2016, the drain of the N-FET $PD_1$ is coupled to the first source or drain of the N-FET $PG_1$.

For the P-FET $PU_2$, the gate includes the gate structure 2026 wrapping around a channel region in the fin structure 2018, and the source and drain include a corresponding source region and a drain region in the fin structure 2018 on opposite sides of the gate structure 2026. For the N-FET $PD_2$, the gate includes the gate structure 2026 wrapping around a first channel region in the fin structure 2020, and the source and drain include a corresponding source region and a drain region in the fin structure 2020 on opposite sides of the gate structure 2026. Since the gate structure 2026 traverses both the fin structure 2018 and the fin structure 2020, the gates of the P-FET $PU_2$ and the N-FET $PD_2$ are coupled together. For the N-FET $PG_2$, the gate includes the gate structure 2028 wrapping around a second channel region in the fin structure 2020, and the first source or drain and the second source or drain include a corresponding first source or drain region and a second source or drain region in the fin structure 2020 on opposite sides of the gate structure 2028. The drain region for the N-FET $PD_2$ and the first source or drain region for the N-FET $PG_2$ are shared in the fin structure 2020. Since the drain region for the N-FET $PD_2$ and the first source or drain region for the N-FET $PG_2$ are shared in the fin structure 2020, the drain of the N-FET $PD_2$ is coupled to the first source or drain of the N-FET $PG_2$.

The source of the P-FET $PU_1$ is coupled to the higher power supply node CVdd shown in FIG. 19. The higher power supply node CVdd is coupled to the via 2032 which in turn is coupled to the contact 2030. The contact 2030 is in contact with the source region for the P-FET $PU_1$ in the fin structure 2014. The via 2032 couples the contact 2030 to a metal line 2070 in the BEOL portion to be described with reference to FIG. 21. The source of the N-FET $PD_1$ is coupled to the lower power supply node CVss shown in FIG. 19. The lower power supply node CVss is coupled to the via 2040 which in turn is coupled to the contact 2038. The contact 2038 is in contact with the source region for the N-FET $PD_1$ in the fin structure 2016. The via 2040 couples the contact 2038 to a landing pad 2074 in the BEOL portion to be described with reference to FIG. 21. The drain of the P-FET $PU_1$, the drain of the N-FET $PD_1$, the first source or drain of the N-FET $PG_1$ and the gates of the P-FET $PU_2$ and the N-FET $PD_2$ are coupled to the storage node SN shown in FIG. 19. The storage node SN includes the contact 2034 and the contact 2036 coupled to the contact 2034. The contact 2034 is in contact with the drain region for the P-FET $PU_1$ in the fin structure 2014 and the drain region for the N-FET $PD_1$ shared with the first source or drain region for the N-FET $PG_1$ in the fin structure 2016. The contact 2036 is in contact with the gate structure 2026 for the P-FET $PU_2$ and the N-FET $PD_2$. The second source or drain of the N-FET $PG_1$ is coupled to the bit line $BL_1$ shown in FIG. 19. The bit line $BL_1$ is coupled to the via 2044 which in turn is coupled to the contact 2042. The contact 2042 is in contact with the second source or drain region for the N-FET $PG_1$ in the fin structure 2016. The via 2044 couples the contact 2042 to a metal line 620A in the BEOL portion to be described with reference to FIG. 21. The gate of the N-FET $PG_1$ is coupled to the word line $WL_8$ shown in FIG. 19. The word line $WL_8$ is coupled to the via 2048 which in turn is coupled to the contact 2046. The contact 2046 is in contact with the gate structure 2024 for the N-FET $PG_1$. The via 2048 couples the contact 2046 to a landing pad 2072 in the BEOL portion to be described with reference to FIG. 21.

The source of the P-FET $PU_2$ is coupled to the higher power supply node CVdd shown in FIG. 19. The higher power supply node CVdd is further coupled to the via 2052 which in turn is coupled to the contact 2050. The contact 2050 is in contact with the source region for the P-FET $PU_2$ in the fin structure 2018. The via 2052 couples the contact 2050 to the metal line 2070 in the BEOL portion to be described with reference to FIG. 21. The drain of the N-FET $PD_2$ is coupled to the lower power supply node CVss shown in FIG. 19. The lower power supply node CVss is further coupled to the via 2060 which in turn is coupled to the contact 2058. The contact 2058 is in contact with the second source or drain region for the N-FET $PD_2$ in the fin structure 2020. The via 2060 couples the contact 2058 to a landing pad 2076 in the BEOL portion to be described with reference to FIG. 21. The drain of the P-FET $PU_2$, the drain of the N-FET $PD_2$, the first source or drain of the N-FET $PG_2$ and the gates of the P-FET $PU_1$ and the N-FET $PD_1$ are coupled to the complementary storage node SNB shown in FIG. 19. The complementary storage node SNB includes the contact 2054 and the contact 2056 coupled to the contact 2054. The contact 2054 is in contact with the drain region for the P-FET $PU_2$ in the fin structure 2018 and the drain region for the N-FET $PD_2$ shared with the first source or drain region for the N-FET $PG_2$ in the fin structure 2020. The contact 2056 is in contact with the gate structure 2022 for the P-FET $PU_1$ and the N-FET $PD_1$. The second source or drain of the N-FET $PG_2$ is coupled to the complementary bit line $BLB_1$ shown in FIG. 19. The complementary bit line $BLB_1$ is coupled to the via 2064 which in turn is coupled to the contact 2062. The contact 2062 is in contact with the second source or drain region for the N-FET $PG_2$ in the fin structure 2020. The via 2064 couples the contact 2062 to a metal line 620B in the BEOL portion to be described with reference to FIG. 21. The gate of the N-FET $PG_2$ is coupled to the word line $WL_8$ shown in FIG. 19. The word line $WL_8$ is further coupled to the via 2068 which in turn is coupled to the contact 2066. The contact 2066 is in contact with the gate structure 2028 for the N-FET $PG_2$. The via 2068 couples the contact 2066 to a landing pad 2078 in the BEOL portion to be described with reference to FIG. 21.

Figure 21:
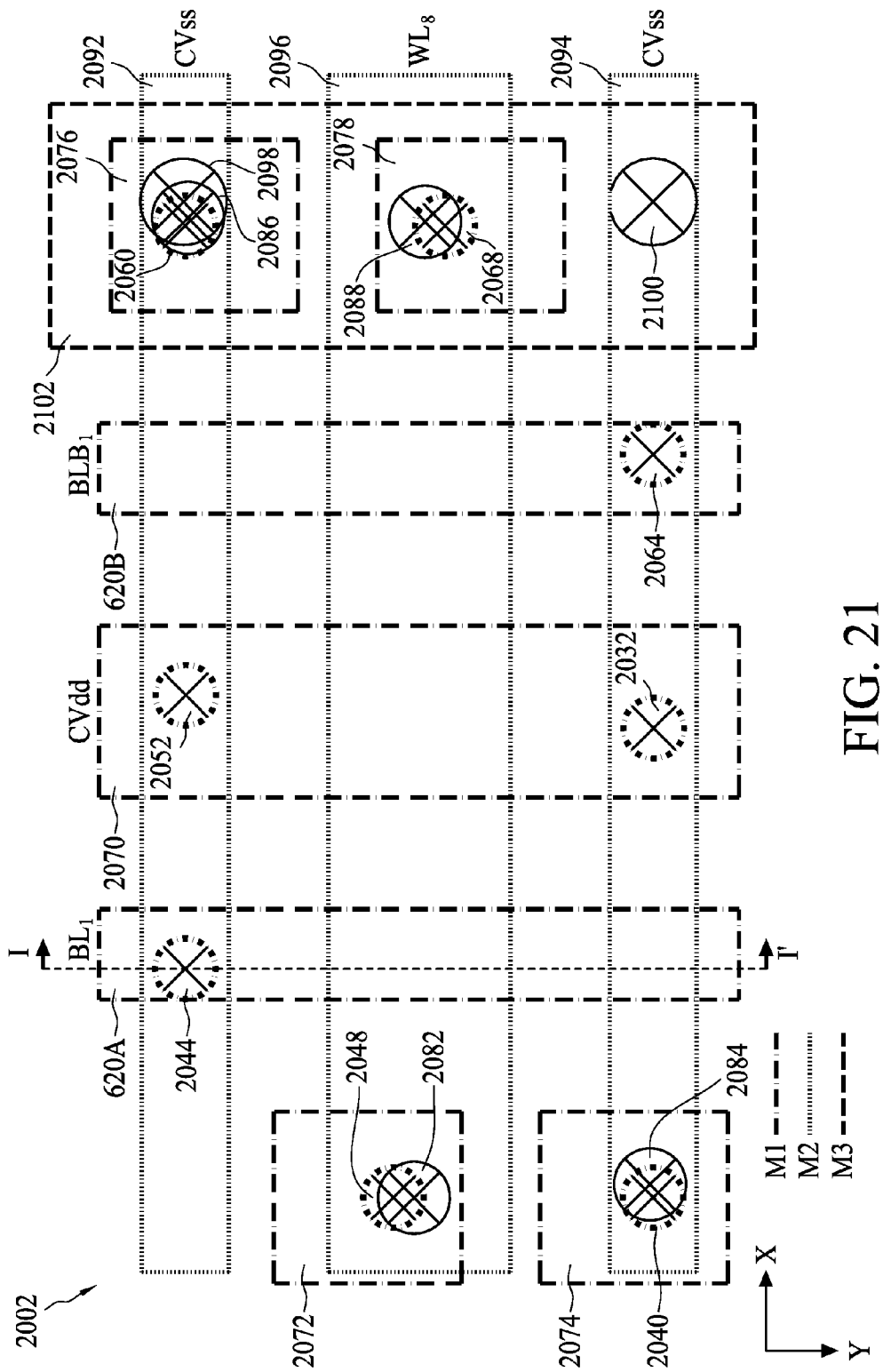
FIG. 21 is a diagram of the layout including layers of the array cell in the BEOL portion in FIG. 23 and the metal layer M3 of the array cell not visible in the cross-section shown in FIG. 23, in accordance with some embodiments.

FIG. 21 is a diagram of the layout 2002 including layers of the array cell $SC_{81}$ (indicated in FIG. 19) in the BEOL portion 2206 shown in FIG. 23 and the metal layer M3 of the array cell $SC_{81}$ not visible in the cross-section 2202 shown in FIG. 23, in accordance with some embodiments. In IC fabrication, the BEOL portion includes the stack of interconnect layers over the FEOL portion. FIG. 21 illustrates metal lines and landing pads in the metal layers M1 to M3, and vias interposed between layers. In FIG. 21, the metal line 620A for the bit line $BL_1$ and the metal line 620B for the bit line $BLB_1$ are running in parallel along the Y direction and are located on opposite sides of the metal line 2070 for the higher power supply node CVdd.

The layout diagram 2002 includes a plurality of metal lines 620A, 2070 and 620B and a plurality of landing pads 2072, 2074, 2076 and 2078 in the metal layer M1, a plurality of metal lines 2092, 2094 and 2096 in the metal layer M2, a metal line 2102 in the metal layer M3, the plurality of vias 2032, 2040, 2044, 2048, 2052, 2060 (not labeled), 2064 and 2068 in the layer via0, a plurality of vias 2082, 2084, 2086 (not labeled) and 2088 in the via1 layer and a plurality of vias 2098 (not labeled) and 2100 in the via1 layer. The vias 2060, 2086 and 2098 overlap in the layout diagram 2002. The metal lines 620A, 2070 and 620B in the metal layer M1 extend in length substantially along the Y direction. The metal lines 2092, 2094 and 2096 in the metal layer M2 extend in length substantially along the X direction and the metal line 2102 in the metal layer M3 extends in length substantially along the Y direction.

The higher power supply node CVdd includes the metal line 2070. The metal line 2070 extends across the column of array cells $SC_{11}$, $SC_{21}$, . . . and $SC_{81}$ and is coupled to the vias 2032 and 2052. The bit line $BL_1$ includes the metal line 620A. The metal line 620A extends across the column of array cells $SC_{11}$, $SC_{21}$, . . . and $SC_{81}$ and is coupled to the via 2044. The complementary bit line $BLB_1$ includes the metal line 620B. The metal line 620B extends across the column of array cells $SC_{11}$, $SC_{21}$, . . . and $SC_{81}$ and is coupled to the via 2064. The metal line 620A for the bit line $BL_1$ and the metal line 620B for the complementary bit line $BLB_1$ are located on opposite sides of the metal line 2070 for the higher power supply node CVdd.

The word line WL includes the landing pad 2072, the via 2082, the landing pad 2078, the via 2088 and the metal line 2096. The metal line 2096 extends across the row of array cells $SC_{81}$, $SC_{82}$, . . . and $SC_{84}$. The metal line 2096 is coupled to the via 2048 through the via 2082 and the landing pad 2072 and is coupled to the via 2068 through the via 2088 and the landing pad 2078. The lower power supply node CVss includes the landing pad 2076, the via 2086, the metal line 2092, the landing pad 2074, the via 2084, the metal line 2094, the via 2098, the via 2100 and metal line 2102. The metal line 2092 extends across the row of array cells $SC_{81}$, $SC_{82}$, . . . and $SC_{84}$ and is coupled to the via 2060 through the via 2086 and the landing pad 2076. The metal line 2094 extends across the row of array cells $SC_{81}$, $SC_{82}$, . . . and $SC_{84}$ and is coupled to the via 2040 through the via 2084 and the landing pad 2074. The metal line 2102 extends across the column of array cells $SC_{11}$, $SC_{12}$, . . . and $SC_{18}$. The metal line 2102 is coupled to the metal line 2092 through the via 2098. The metal line 2102 is coupled to the metal line 2094 through the via 2100. The metal lines 2092 and 2094 for the lower power supply node CVss are located on opposite sides of the metal line 2096 for the word line $WL_8$.

Figure 22A:
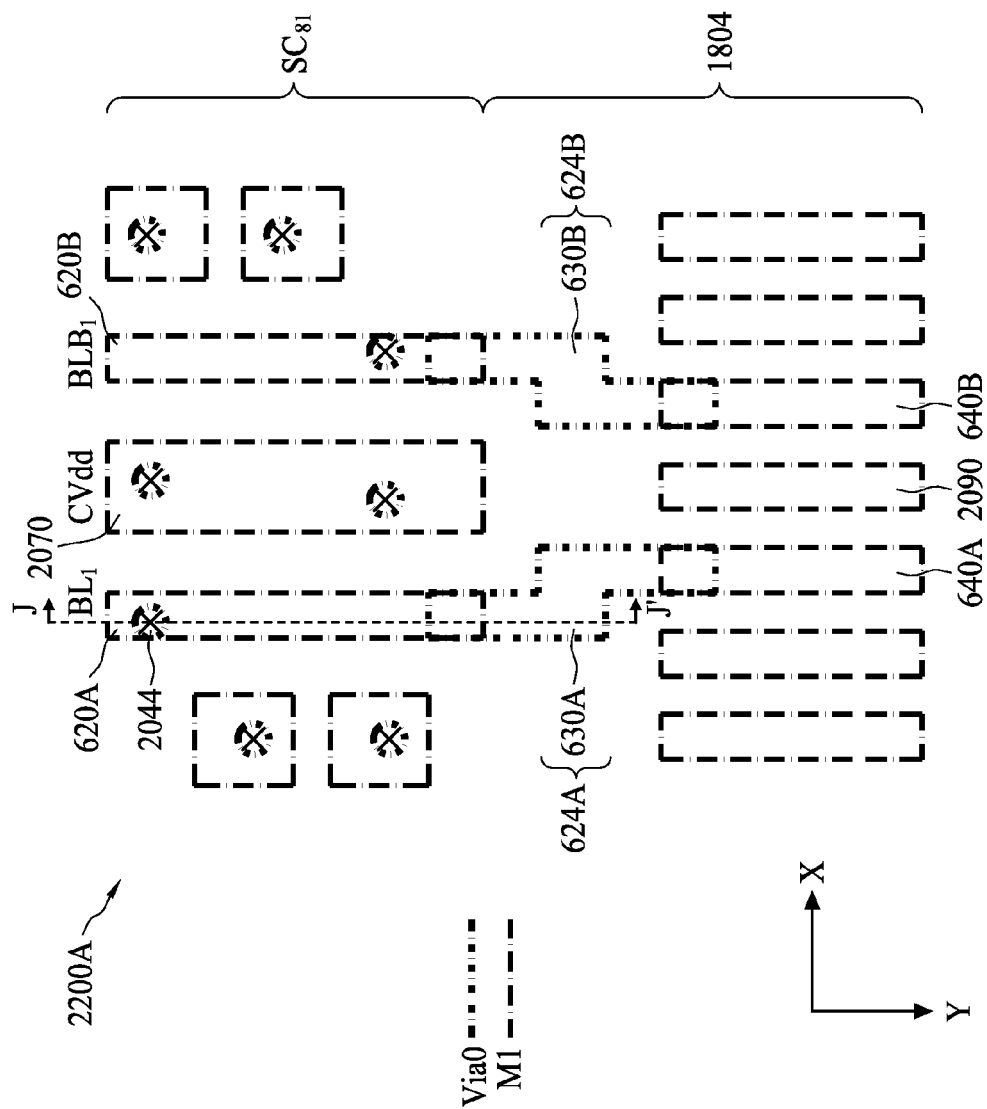
FIG. 22A is a diagram of the layout including the layers of the circuit upto the metal layer M1 in the BEOL portion shown in FIG. 23, in accordance with some embodiments.
Figure 22B:
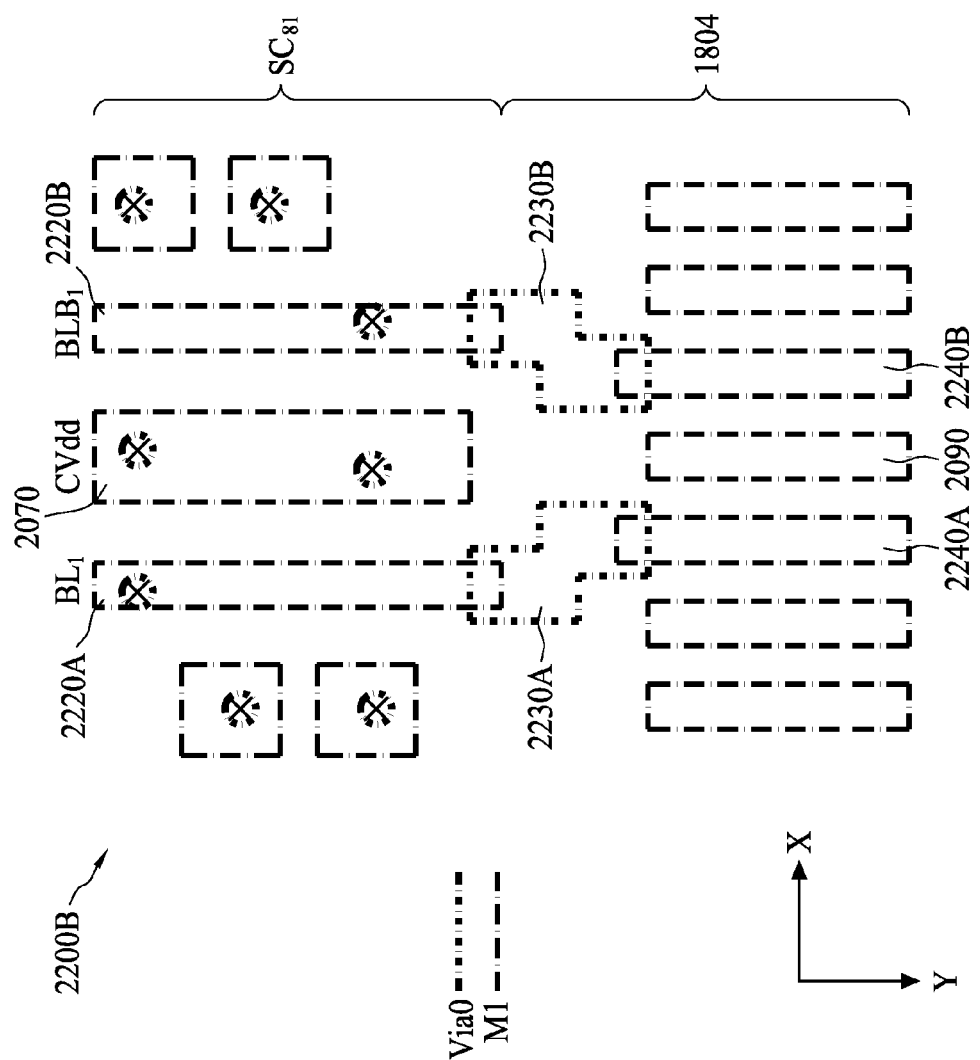
FIG. 22B is a diagram of another layout including the layers upto the metal layer M1 of the circuit in the BEOL portion shown in FIG. 23, in accordance with some embodiments.
Figure 22D:
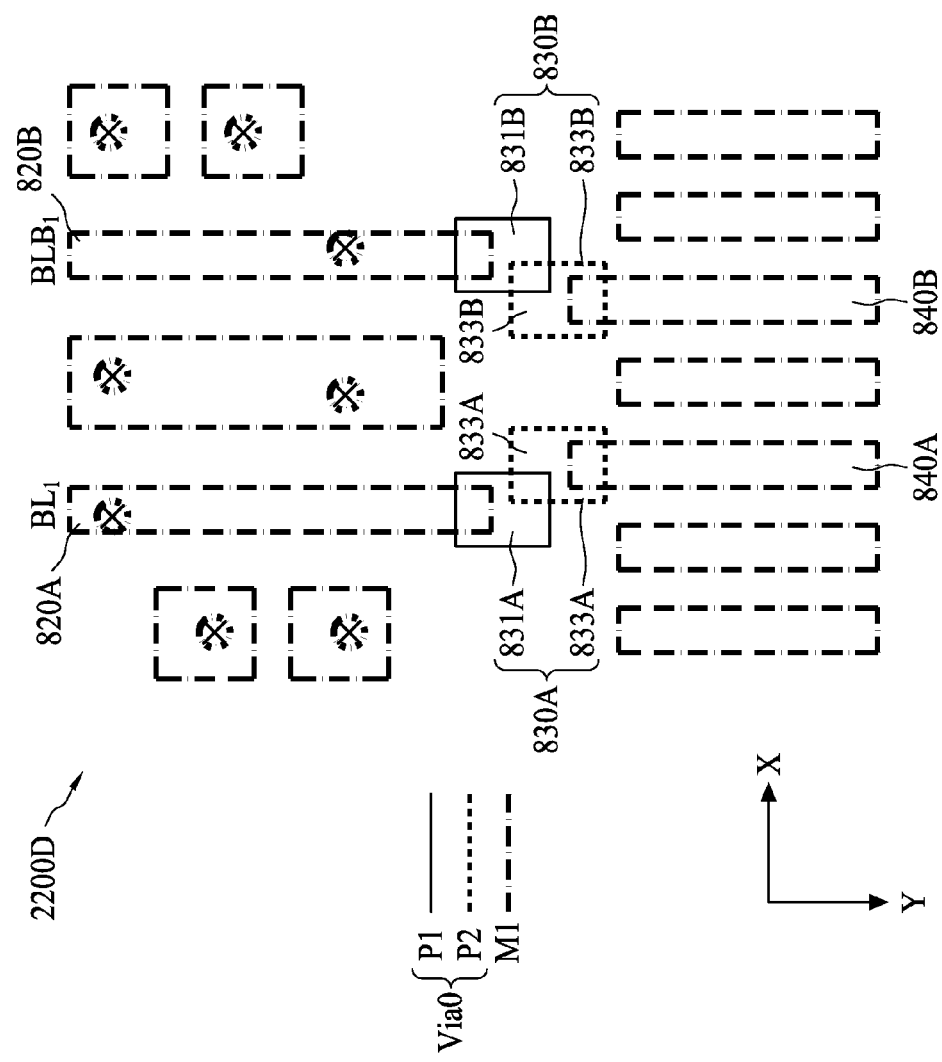
FIG. 22D is a diagram of another layout including the layers upto the metal layer M1 of the circuit in the BEOL portion shown in FIG. 23, in accordance with some embodiments.

FIG. 22A is a diagram of the layout 2200A including the layers of the circuit 1806 (indicated in FIG. 19) upto the metal layer M1 in the BEOL portion 2206 shown in FIG. 23, in accordance with some embodiments. FIG. 22A illustrates misaligned metal lines 620A and 640A in the metal layer M1 for the bit line $BL_1$ coupled using an end-to-end portion 630A in the via layer via0, and misaligned metal lines 620B and 640B in the metal layer M1 for the complementary bit line $BLB_1$ coupled using an end-to-end portion 630B in the via layer via0. In some embodiments, the end-to-end portion 630A is comprised in a connection structure 624A which couples the metal line 620A to the metal line 640A, and the end-to-end portion 630B is comprised in a connection structure 624B which couples the metal line 620B to the metal line 640B. In some embodiments, the metal lines 620A and 640A of the bit line $BL_1$ and the metal lines 620B and 640B of the complementary bit line $BLB_1$ are implemented in the metal layer M1 or the lowest level metal that is thinner among interconnect layers for reducing capacitance on the bit line $BL_1$ and the complementary bit line $BLB_1$.

In some embodiments, the layout 2200A includes a portion for the array cell $SC_{81}$ described with reference to FIG. 21 and a portion for the IO circuit 1804. In addition to the BEOL portion of the array cell $SC_{81}$, the bit line $BL_1$ further includes the metal line 640A in a corresponding BEOL portion of the IO circuit 1804 and an end-to-end portion 630A across the BEOL portion of the array cell $SC_{81}$ and the BEOL portion of the IO circuit 1804. The metal line 640A is in the metal layer M1 and extends in length substantially along the Y direction. The metal line 640A is shifted substantially along the X direction with respect to the metal line 620A and is therefore misaligned with the metal line 620A in the Y direction. The end-to-end portion 630A is formed in the via layer via0 and is overlapped with the metal line 620A and the metal line 640A. The structural elements formed by the metal lines 620A and 640A, the end-to-end portion 630A and the metal lines 2070 and 2090 are similar to the corresponding metal lines 120 and 140, end-to-end portion 130 and metal lines 170 and 190 described with reference to FIGS. 2A and 4A. The via layer via0 serves as a local interconnection layer for the array cell $SC_{81}$ and the IO circuit 1804.

In addition to the BEOL portion of the array cell $SC_{81}$, the complementary bit line $BLB_1$ further includes the metal line 640B in the corresponding BEOL portion of the IO circuit 1804 and an end-to-end portion 630B across the BEOL portion of the array cell $SC_{81}$ and the BEOL portion of the IO circuit 1804. The metal line 640B is in the metal layer M1 and extends in length substantially along the Y direction. The metal line 640B is shifted substantially along a direction opposite the X direction with respect to the metal line 640B and is therefore misaligned with the metal line 620B in the Y direction. The end-to-end portion 630B is formed in the via layer via0 and is overlapped with the metal line 620B and the metal line 640B. The structural elements formed by the metal lines 620B and 640B, the end-to-end portion 630B and the metal lines 2070 and 2090 are similar to the corresponding metal lines 120 and 140, end-to-end portion 130 and metal lines 170 and 190 described with reference to FIGS. 2A and 4A except inverted in the X direction.

FIG. 22B is a diagram of another layout 2200B including the layers upto the metal layer M1 of the circuit 1806 (shown in FIG. 19) in the BEOL portion 2206 shown in FIG. 23, in accordance with some embodiments. Compared to the layout 2200A shown in FIG. 22A, metal lines 2220A and 2220B extend beyond the metal line 2070 in the Y direction and metal lines 2240A and 2240B start behind the metal line 2090 in the Y direction. In addition, an end-to-end portion 2230A is wider than the end-to-end portion 630A shown in FIG. 22A at where the end-to-end portion 2230A is overlapped with the metal lines 2220A and 2240A. An end-to-end portion 2230B is wider than the end-to-end portion 630B shown in FIG. 22A at where the end-to-end portion 2230B is overlapped with the metal lines 2220B and 2240B. The structural elements formed by the metal lines 2220A and 2240A, the end-to-end portion 2230A and the metal lines 2070 and 2090 are similar to the corresponding metal lines 220 and 240, end-to-end portion 230 and metal lines 170 and 190 described with reference to FIGS. 2B and 4B. The structural elements formed by the metal lines 2220B and 2240B, the end-to-end portion 2230B and the metal lines 2070 and 2090 are similar to the corresponding metal lines 220 and 240, end-to-end portion 230 and metal lines 170 and 190 described with reference to FIGS. 2B and 4B except inverted in the X direction.

FIG. 22C is a diagram of another layout 2200C including the layers up to the metal layer M1 of the circuit 1806 (shown in FIG. 19) in the BEOL portion 2206 shown in FIG. 23, in accordance with some embodiments. Compared to the layout 2200B shown in FIG. 22B, the end-to-end portions 2330A and 2330B have substantially rectangular shapes instead of twice bent shapes. The structural elements formed by the metal lines 2220A and 2240A, the end-to-end portion 2330A and the metal lines 2070 and 2090 are similar to the corresponding metal lines 220 and 240, end-to-end portion 330 and metal lines 170 and 190 described with reference to FIGS. 2C and 4C. The structural elements formed by the metal lines 2220B and 2240B, the end-to-end portion 2330B and the metal lines 2070 and 2090 are similar to the corresponding metal lines 220 and 240, end-to-end portion 330 and metal lines 170 and 190 described with reference to FIGS. 2C and 4C except inverted in the X direction.

FIG. 22D is a diagram of another layout 2200D including the layers upto the metal layer M1 of the circuit 1806 (shown in FIG. 19) in the BEOL portion 2206 shown in FIG. 23, in accordance with some embodiments. Compared to end-to-end portions 230A and 230B in the layout 2200B shown in FIG. 22B for single patterning, an end-to-end portion 830A is a union of shapes 831A and 833A for multiple patterning, and an end-to-end portion 830B is a union of shapes 831B and 833B for multiple patterning. The metal lines 820A and 840A, the end-to-end portion 830A are similar to the corresponding metal lines 820 and 840, the union 830 described with reference to FIG. 8. The metal lines 820B and 840B, the end-to-end portion 830B are similar to the corresponding metal lines 820 and 840, union 830 described with reference to FIG. 8 except inverted in the X direction.

FIG. 23 is a diagram of the cross-section 2202 of the circuit 1806 (shown in FIG. 19) taken corresponding to line H-H' shown in FIG. 20, line I-I' shown in FIG. 21 and line J-J' shown in 22A, in accordance with some embodiments. FIG. 23 illustrates the cross-section 2202 including both the FEOL portion 2204 and the BEOL portion 2206 of the circuit 1806. For simplicity, the structural elements in the cross section 2202 are labeled using the same reference numerals as the corresponding shapes in the layouts 2000, 2002 and 2200A in the corresponding FIGS. 20, 21 and 22A.

The FEOL portion 2204 includes a substrate 2001, a dielectric isolation structure 2003, the gate structures 2022 and 2024 and the source or drain contacts 2034 and 2042. The dielectric isolation structure 2003 is formed over the substrate 2001. The gate structures 2022 and 2024 are formed over the dielectric isolation structure 2003. The source or drain contacts 2034 and 2042 are formed over the dielectric isolation structure 2003. The BEOL portion 2206 includes the via 2044 and the end-to-end portion 630A in the via layer via0, the metal line 620A in the metal layer M1 and the metal lines 2092, 2094 and 2096 in the metal layer M2. The via 2044 couples the metal line 620A to the contact 2042. The metal line 620A and the end-to-end portion 630A are similar to the corresponding metal line 120 and the end-to-end portion 130 described with reference to FIG. 3.

Figure 24:
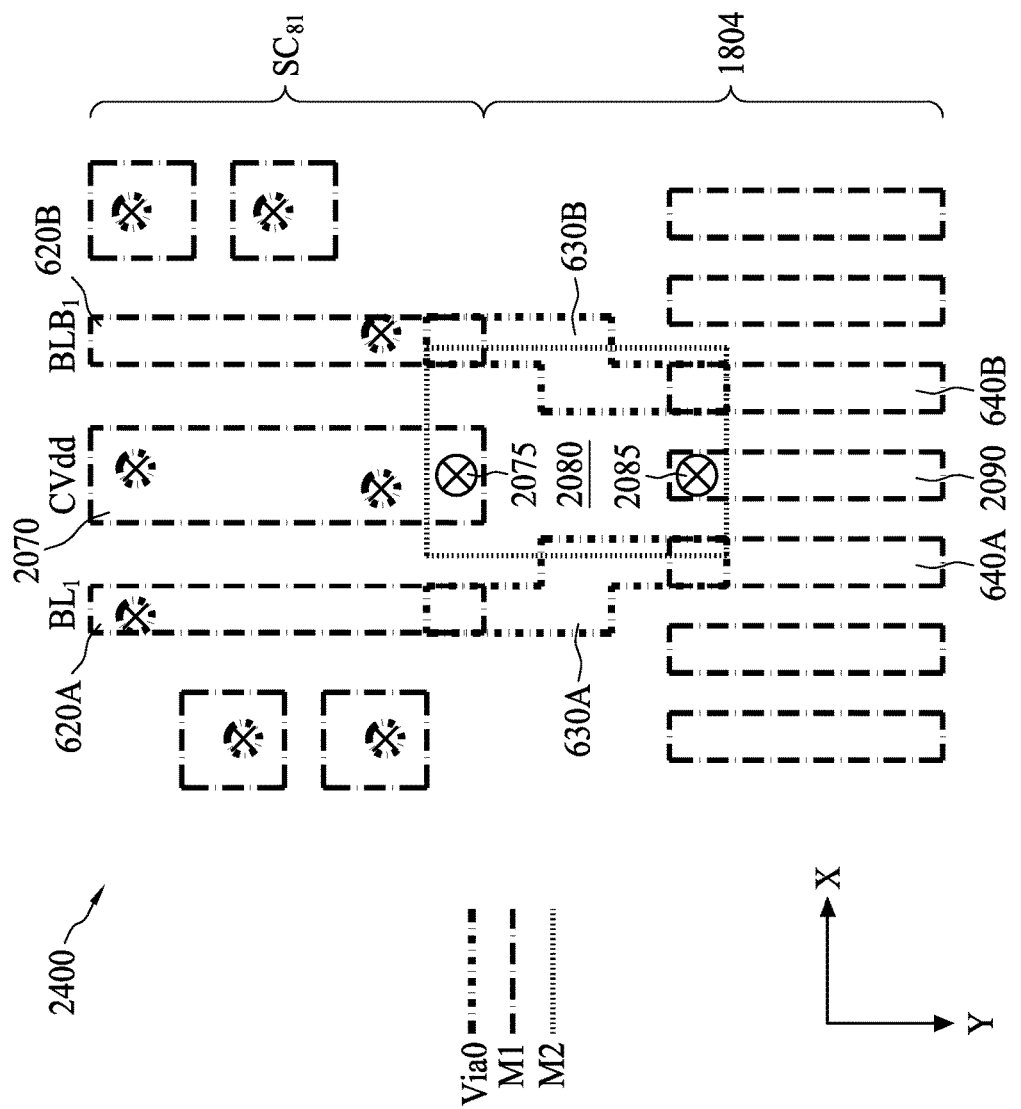
FIG. 24 is a diagram of the layout including the layers of the circuit upto the metal layer M1 and an end-to-end portion of the circuit in the metal layer M2 in the BEOL portion shown in FIG. 23, in accordance with some embodiments.

FIG. 24 is a diagram of the layout 2400 including the layers of the circuit 1806 (shown in FIG. 19) upto the metal layer M1 and an end-to-end portion 2080 of the circuit 1806 in the metal layer M2 in the BEOL portion 2206 shown in FIG. 23, in accordance with some embodiments. FIG. 24 illustrates the metal lines 2070 and 2090 for the higher power supply node CVdd coupled using the end-to-end portion 2080 in a metal layer M2 and vias 2075 and 2085 in the via layer via1. In addition to the BEOL portion of the array cell SC$_{81}$, the higher power supply node CVdd further includes the metal line 2090 in the corresponding BEOL portion of the IO circuit 1804 and the end-to-end portion 2080 and the vias 2075 and 2085 across the BEOL portion of the array cell SC$_{81}$ and the BEOL portion of the IO circuit 1804. The structural elements formed by the metal lines 620A and 640A, the end-to-end portion 630A, the metal lines 2070 and 2090, the end-to-end portion 2080 and the vias 2075 and 2085 are similar to the corresponding metal lines 120 and 140, end-to-end portion 130, metal lines 170 and 190, end-to-end portion 1080 and vias 1075 and 1085 described with reference to FIG. 16. The structural elements formed by the metal lines 620B and 640B, the end-to-end portion 630B, the metal lines 2070 and 2090, the end-to-end portion 2080 and the vias 2075 and 2085 are similar to the corresponding metal lines 120 and 140, end-to-end portion 130, metal lines 170 and 190, end-to-end portion 1080 and vias 1075 and 1085 described with reference to FIG. 16 except inverted in the X direction.

Figure 25:
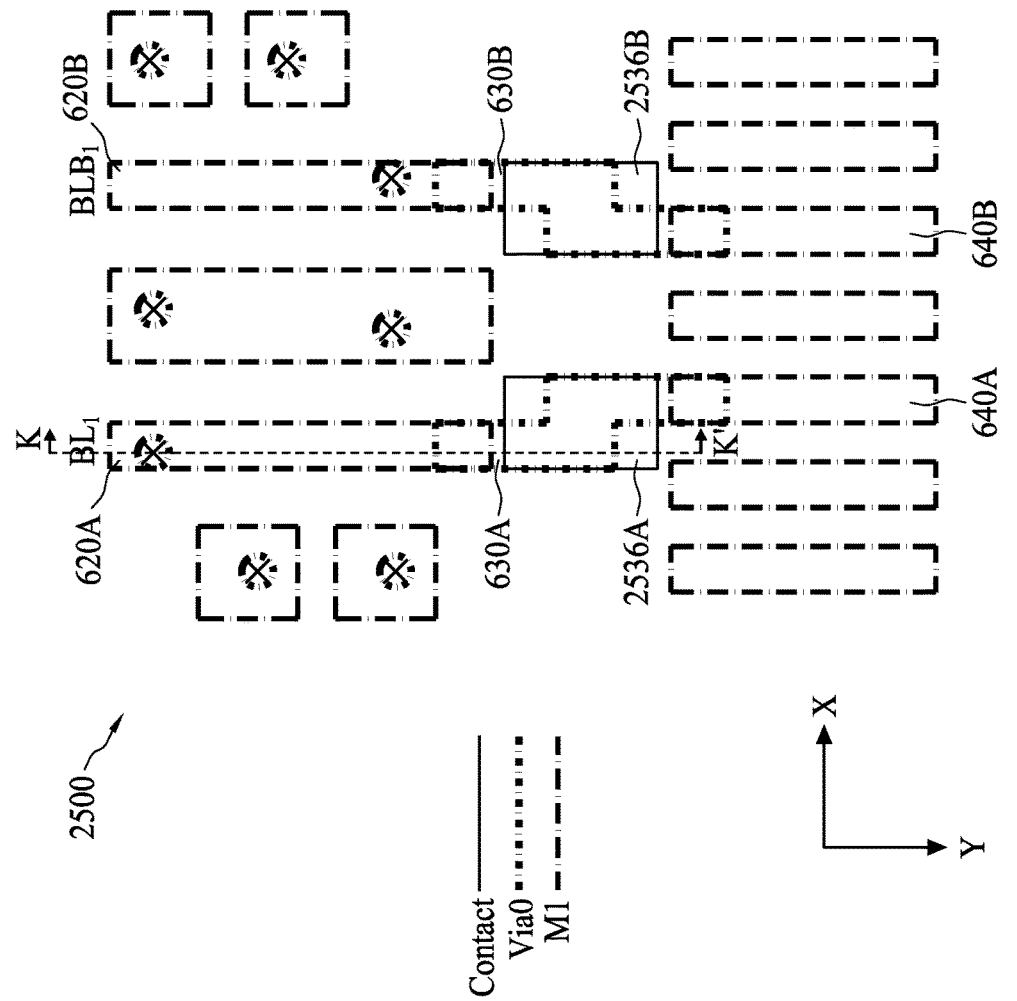
FIG. 25 is a diagram of the layout including the layers of the circuit upto the metal layer M1 in the BEOL portion shown in FIG. 26, and additional portions in the contact layer in the FEOL portion shown in FIG. 26, in accordance with some embodiments.
Figure 26:
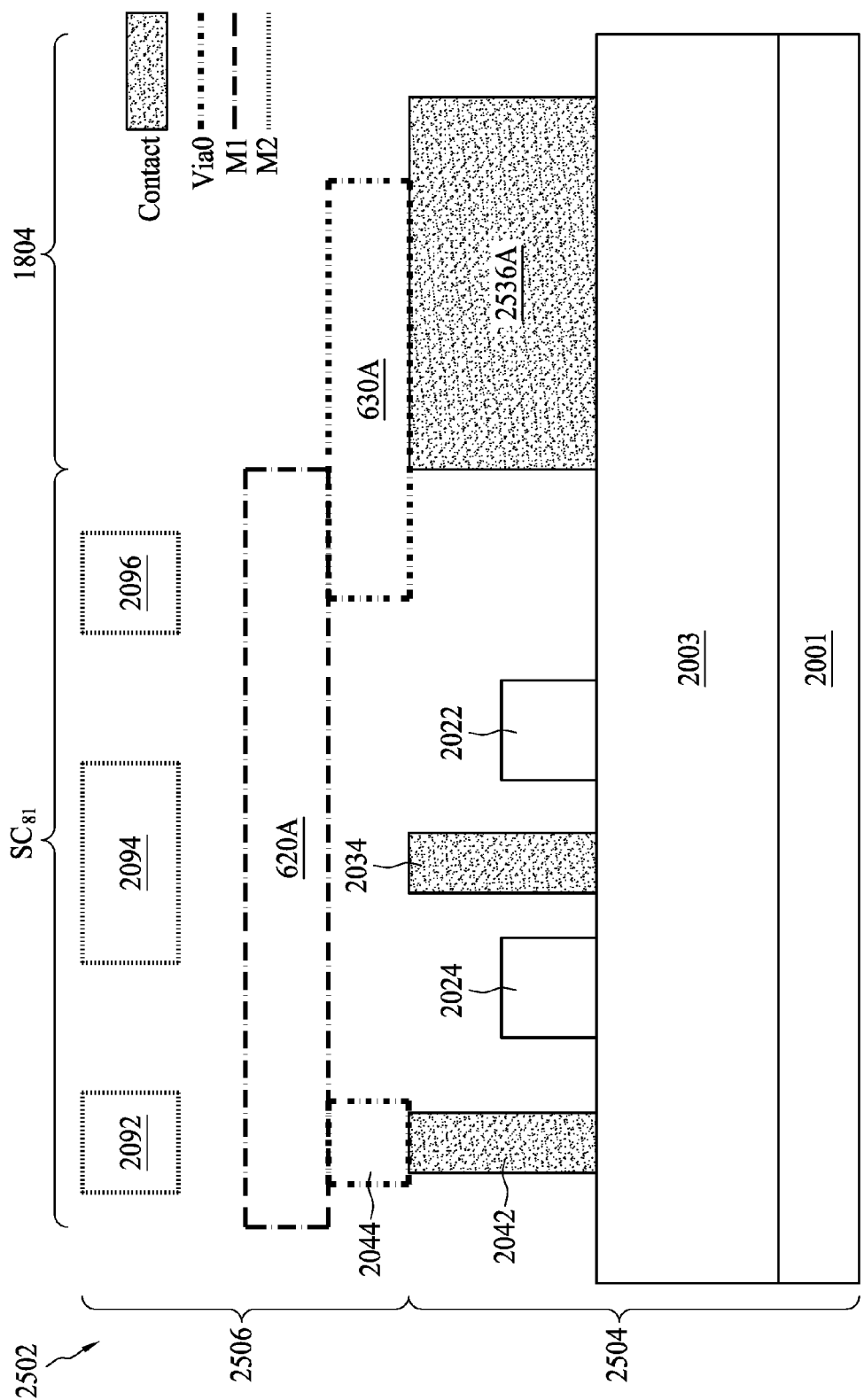
FIG. 26 is a diagram of the cross-section of the circuit taken corresponding to line H-H' shown in FIG. 20, line I-I' shown in FIG. 21 and K-K' shown in FIG. 25, in accordance with some embodiments.

FIG. 25 is a diagram of the layout 2500 including the layers of the circuit 1806 (shown in FIG. 19) upto the metal layer M1 in the BEOL portion 2506 shown in FIG. 26, and additional portions 2536A and 2536B in the contact layer in the FEOL portion 2504 shown in FIG. 26, in accordance with some embodiments. Compared to the layout 2200A shown in FIG. 22A, the layout 2500 further includes the additional portion 2536A in the contact layer and coupled to the end-to-end portion 630A, and the additional portion 2536B in the contact layer and coupled to the end-to-end portion 630B. In some embodiments, the additional portion 2536A is not extended to the metal lines 620A and 640A and the additional portion 2536B is not extended to the metal lines 620B and 640B to avoid interfering with other structures in the contact layer. The end-to-end portion 630A and the additional portion 2536A are similar to the end-to-end portion 130 and the additional portion 536 described with reference to FIG. 5. The end-to-end portion 630B and the additional portion 2536B are similar to the end-to-end portion 130 and the additional portion 536 described with reference to FIG. 5 except inverted in the X direction except inverted in the X direction.

FIG. 26 is a diagram of the cross-section 2502 of the circuit 1806 (shown in FIG. 19) taken corresponding to line H-H' shown in FIG. 20, line I-I' shown in FIG. 21 and K-K' shown in FIG. 25, in accordance with some embodiments. Compared to the cross-section 2202 in FIG. 23, the cross-section 2502 further includes the additional portion 2536A in the contact layer. The additional portion 2536A is formed over the dielectric isolation structure 2003 and under the end-to-end portion 630A, and is coupled to the end-to-end portion 630A.

Figure 27:
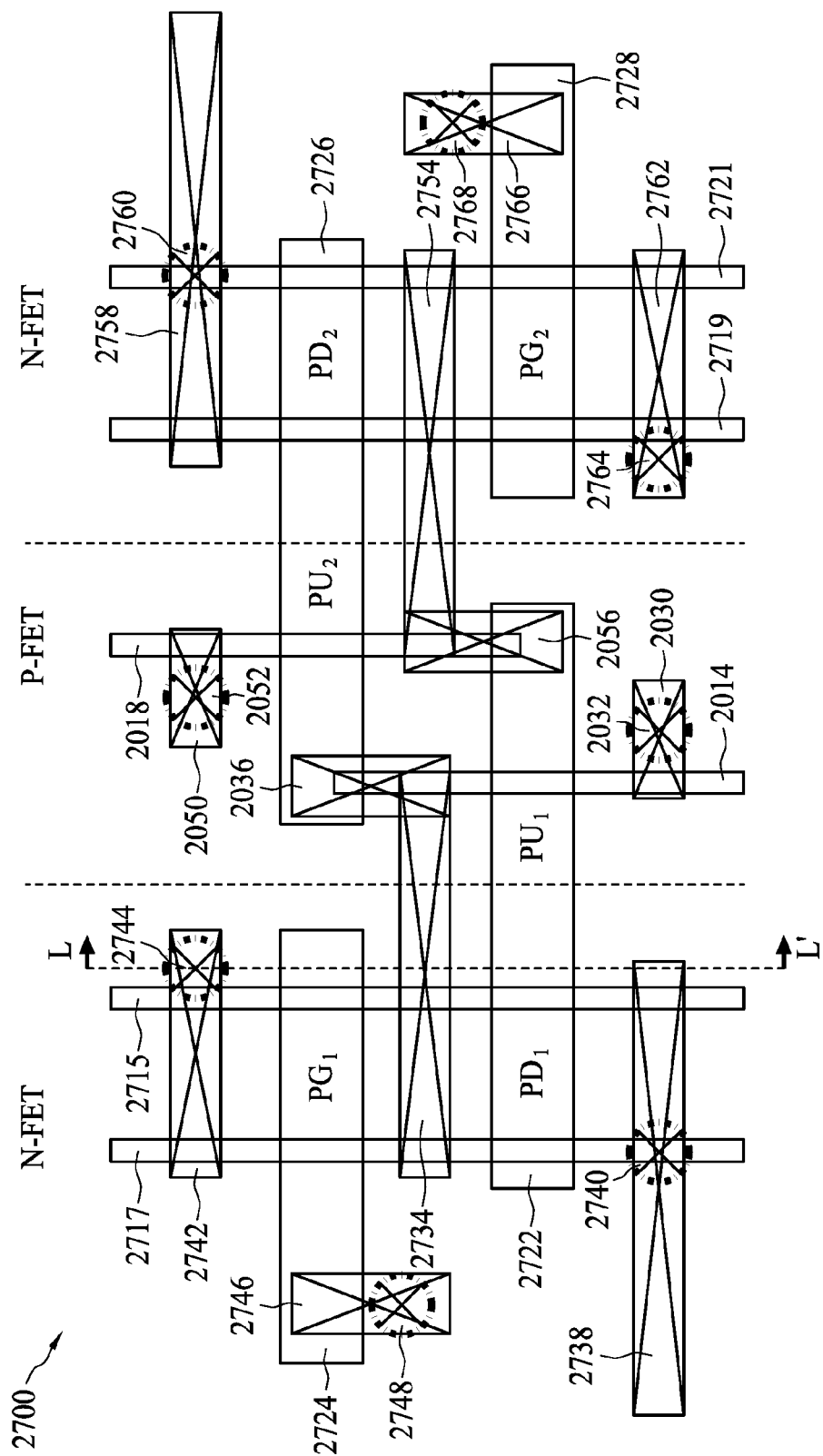
FIG. 27 is a diagram of the layout including the layers of the array cell in the FEOL portion and the via layer via0 of the array cell in the BEOL portion shown in FIG. 30, in accordance with some embodiments.
Figure 30:
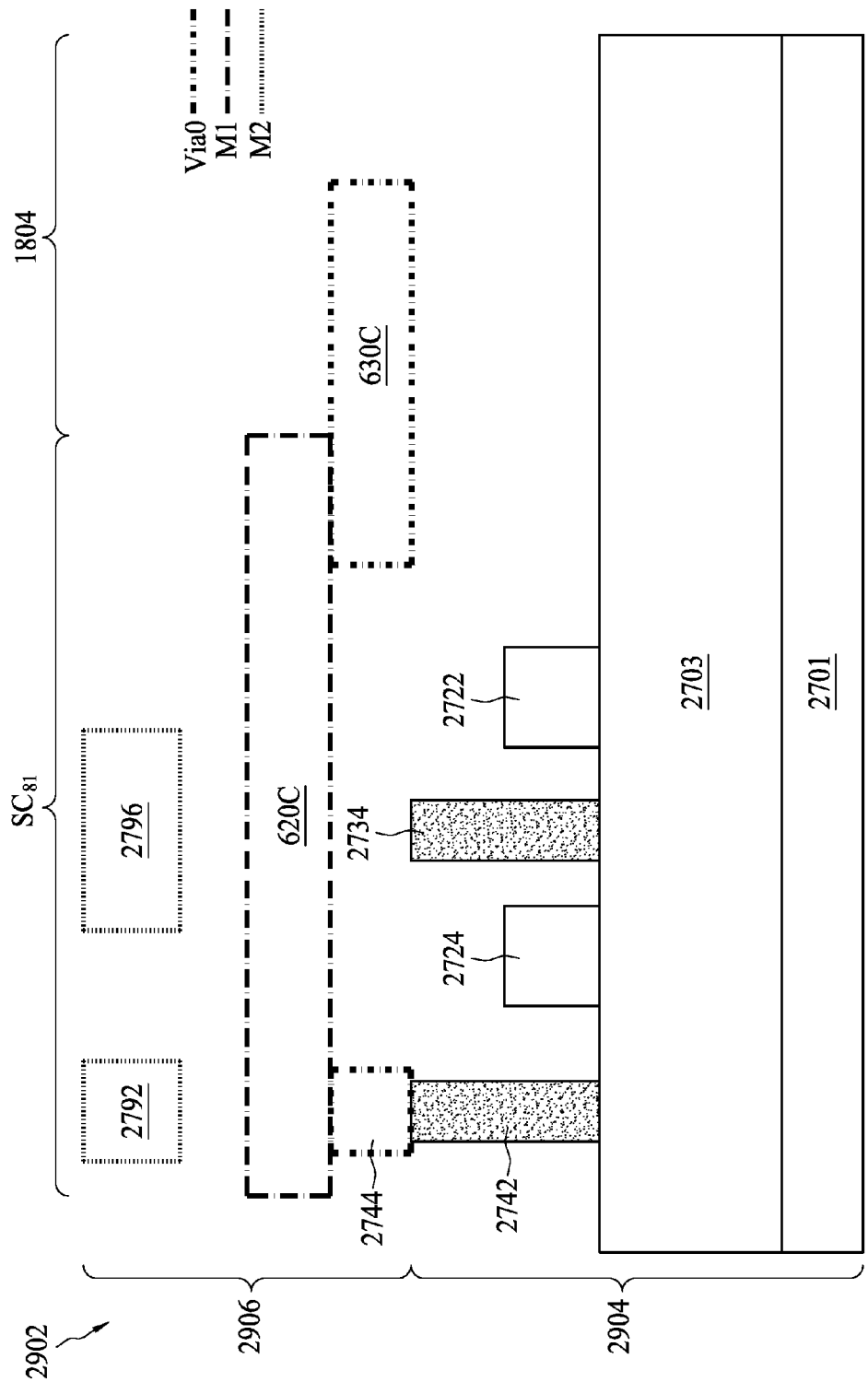
FIG. 30 is a diagram of a cross-section of the circuit taken corresponding to line L-L' shown in FIG. 27, line M-M' shown in FIG. 28 and line N-N' shown in FIG. 29, in accordance with some embodiments.

FIG. 27 is a diagram of the layout 2700 including the layers of the array cell SC$_{81}$ (indicated in FIG. 19) in the FEOL portion 2904 and the via layer via0 of the array cell SC$_{81}$ in the BEOL portion 2906 shown in FIG. 30, in accordance with some embodiments. Compared to the layout 2000 shown in FIG. 20 in which the N-FETs PG$_1$ and PD$_1$ and the N-FETs PG$_2$ and PD$_2$ are single-finned, the N-FETs PG$_1$ and PD$_1$ and the N-FETs PG$_2$ and PD$_2$ in the layout 2700 are double-finned. The P-FETs PU$_1$ and PU$_2$ shown in FIG. 27 have the same structure as the corresponding P-FETs PU$_1$ and PU$_2$ shown in FIG. 20 and are labeled using the same reference numerals as the elements of the P-FETs PU$_1$ and PU$_2$ shown in FIG. 20. For illustration purpose, the number of fin structures for the N-FETs SPG$_1$ and SPD$_1$ or the N-FETs SPG$_2$ and SPD$_2$ are two. The number of fin structures for the P-FETs SPU$_1$ and SPU$_2$ is one. Another number of fin structures for the N-FETs SPG$_1$ and SPD$_1$ or N-FETs SPG$_2$ and SPD$_2$, and another number of fin structures for the P-FETs SPU$_1$ and SPU$_2$ are within the contemplated scope of the present disclosure.

For the N-FET PG$_1$, the gate includes a gate structure 2724 wrapping around a channel region of the N-FET PG$_1$ in the fin structure 2715 and a channel region of the N-FET PG$_1$ in the fin structure 2717. The gate structure 2724 corresponds to the gate structure 2024 shown in FIG. 20. The fin structures 2715 and 2717 correspond to the fin structure 2016 shown in FIG. 20. The word line WL$_8$ is coupled to a via 2748 which in turn is coupled to a gate contact 2746 in contact with the gate structure 2724. The via 2748 and the gate contact 2746 correspond to the corresponding via 2048 and gate contact 2046 shown in FIG. 20. Further, the first source or drain of the N-FET PG$_1$ includes first source or drain regions in the fin structures 2715 and 2717 formed on one side of the gate structure 2724 and coupled together using a contact 2734. The second source or drain of the N-FET PG$_1$ includes second source or drain regions in the fin structures 2715 and 2717 formed on the other side of the gate structure 2724 and coupled together using a contact 2742. The contacts 2734 and 2742 correspond to the corresponding contacts 2034 and 2042 shown in FIG. 20. The bit line BL$_1$ is coupled to a via 2744 which in turn is coupled to the contact 2742 in contact with the second source or drain regions in the fin structures 2715 and 2717. The via 2744 corresponds to the via 2044 shown in FIG. 20.

For the N-FET PD$_1$, the gate includes a gate structure 2722 wrapping around a channel region of the N-FET PD$_1$ in the fin structure 2715 and a channel region of the N-FET PD$_1$ in the fin structure 2717. The gate structure 2722 corresponds to the gate structure 2022 shown in FIG. 20. Further, the source of the N-FET PD$_1$ includes source regions in the fin structures 2715 and 2717 formed on one side of the gate structure 2722 and coupled together using a contact 2738. The contact 2738 corresponds to the contact 2038 shown in FIG. 20. The drain of the N-FET PD$_1$ includes drain regions in the fin structures 2715 and 2717 formed on the other side of the gate structure 2722 and coupled together using the contact 2734. The first source or drain regions for the N-FET $PG_1$ in the fin structures 2715 and 2717 are shared with the drain regions for the N-FET $PD_1$ in the fin structures 2715 and 2717. The contact 2734 is also shared between the N-FET $PG_1$ and N-FET $PD_1$. The lower power supply node CVss is coupled to a via 2740 which in turn is coupled to the contact 2738 in contact with the source regions of the N-FET $PD_1$ in the fin structures 2715 and 2717. The via 2740 corresponds to the via 2040 shown in FIG. 20.

For the N-FET $PG_2$, the gate includes a gate structure 2728 wrapping around a channel region of the N-FET $PG_2$ in the fin structure 2719 and a channel region of the N-FET $PG_2$ in the fin structure 2721. The gate structure 2728 corresponds to the gate structure 2028 shown in FIG. 20. The fin structures 2719 and 2721 correspond to the fin structure 2020 shown in FIG. 20. The word line $WL_8$ is coupled to a via 2768 which in turn is coupled to a gate contact 2766 in contact with the gate structure 2728. The via 2768 and the gate contact 2766 correspond to the corresponding via 2068 and gate contact 2066 shown in FIG. 20. Further, the first source or drain of the N-FET $PG_2$ includes first source or drain regions in the fin structures 2719 and 2721 formed on one side of the gate structure 2728 and coupled together using a contact 2754. The second source or drain of the N-FET $PG_2$ includes second source or drain regions in the fin structures 2719 and 2721 formed on the other side of the gate structure 2728 and coupled together using a contact 2762. The contacts 2754 and 2762 correspond to the corresponding contacts 2054 and 2062 shown in FIG. 20. The complementary bit line $BLB_1$ is coupled to a via 2764 which in turn is coupled to the contact 2762 in contact with the second source or drain regions in the fin structures 2719 and 2721. The via 2764 corresponds to the via 2064 shown in FIG. 20.

For the N-FET $PD_2$, the gate includes a gate structure 2726 wrapping around a channel region of the N-FET $PD_2$ in the fin structure 2719 and a channel region of the N-FET $PD_2$ in the fin structure 2721. The gate structure 2726 corresponds to the gate structure 2026 shown in FIG. 20. Further, the source of the N-FET $PD_2$ includes source regions in the fin structures 2719 and 2721 formed on one side of the gate structure 2726 and coupled together using a contact 2758. The contact 2758 corresponds to the contact 2058 shown in FIG. 20. The drain of the N-FET $PD_2$ includes drain regions in the fin structures 2719 and 2721 formed on the other side of the gate structure 2726 and coupled together using the contact 2754. The first source or drain regions for the N-FET $PG_2$ in the fin structures 2719 and 2721 are shared with the drain regions for the N-FET $PD_2$ in the fin structures 2719 and 2721. The contact 2754 is also shared between the N-FET $PG_2$ and N-FET $PD_2$. The lower power supply node CVss is coupled to a via 2760 which in turn is coupled to the contact 2758 in contact with the source regions of the N-FET $PD_2$ in the fin structures 2719 and 2721. The via 2760 corresponds to the via 2060 shown in FIG. 20.

Figure 28:
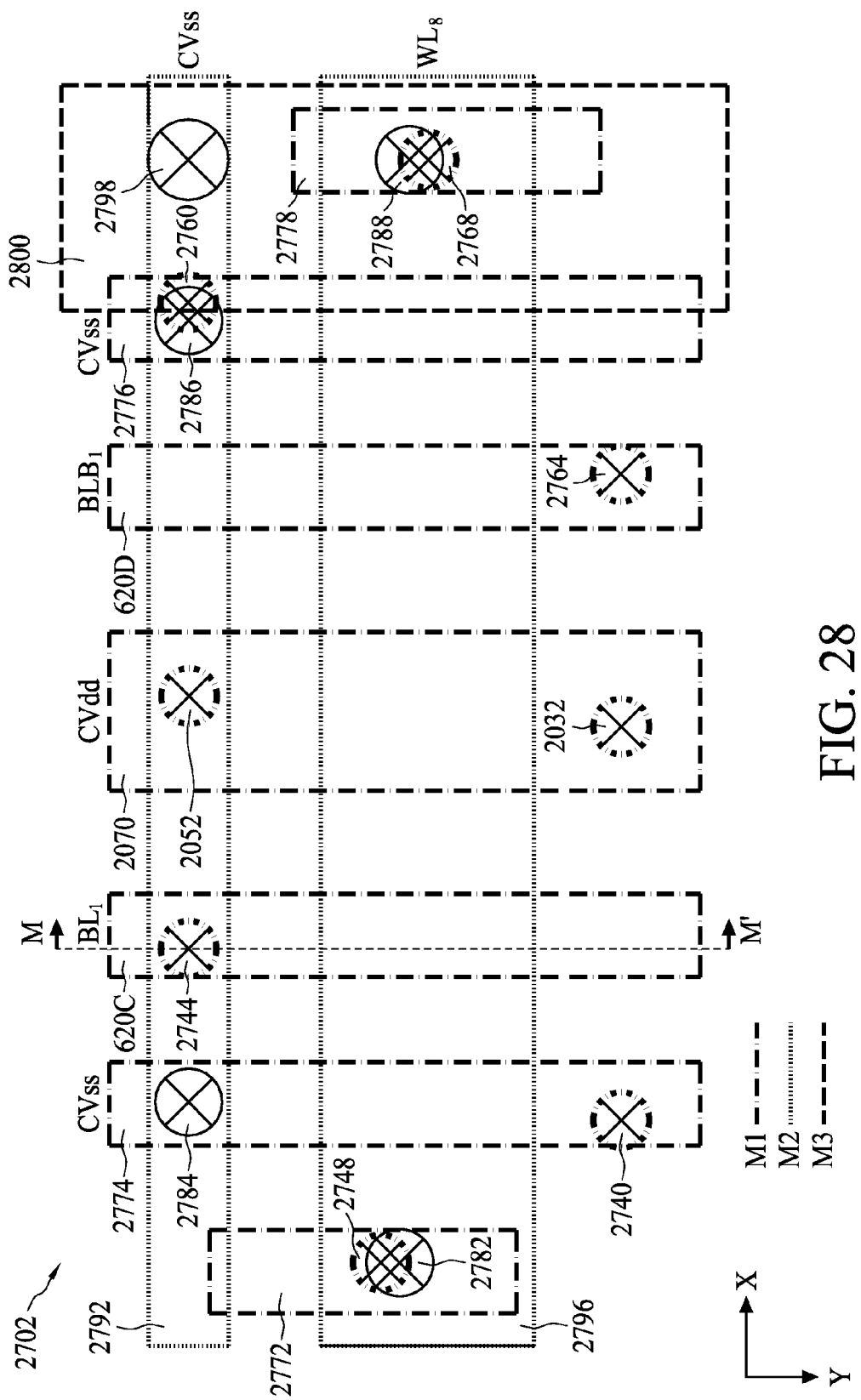
FIG. 28 is a diagram of the layout 2702 including layers of the array cell in the BEOL portion shown in FIG. 30 and the metal layer M3 of the array cell not visible in the cross-section shown in FIG. 30, in accordance with some embodiments.

FIG. 28 is a diagram of the layout 2702 including layers of the array cell $SC_{81}$ (indicated in FIG. 19) in the BEOL portion 2906 shown in FIG. 30 and the metal layer M3 of the array cell $SC_{81}$ not visible in the cross-section 2902 shown in FIG. 30, in accordance with some embodiments. The lower power supply node CVss includes metal lines 2774 and 2776 in the metal layer M1, vias 2784 and 2786 in the via layer via1 and a metal line 2792 in the metal layer M2, a via 2798 in the via layer via1 and a metal line 2800 in the metal layer M3. The metal line 2774, the via 2784, the metal line 2792 and the via 2798 correspond to the landing pad 2074, the via 2084, the metal line 2094 and the via 2100 shown in FIG. 20. The metal line 2776, the via 2786, the metal line 2792 and the via 2798 correspond to the landing pad 2076, the via 2086, the metal line 2092 and the via 2098 shown in FIG. 20. The metal line 2800 corresponds to the metal line 2102 shown in FIG. 20. Compared to the layout 2002 shown in FIG. 21, instead of the landing pads 2074 and 2076 in the metal layer M1 coupled to the corresponding metal lines 2092 and 2094 in the metal layer M2 extend in length substantially along the X direction, the metal lines 2774 and 2776 extend in length substantially along the Y direction in the metal layer M1 and are coupled to one metal line 2792 extending in length substantially along the X direction in the metal layer M2. Due to the arrangement of the metal lines 2774 and 2776 for the lower power supply node CVss, one metal line 2792 for the lower power supply node CVss exists in the metal layer M2 instead of two metal lines 2092 and 2094 in the layout 2002 shown in FIG. 21.

The bit line $BL_1$ includes the metal line 620C extending in length substantially along the Y direction in the metal layer M1. The complementary bit line $BLB_1$ includes the metal line 620D extending in length substantially along the Y direction in the metal layer M1. The metal lines 620C and 620D correspond to the corresponding metal lines 620A and 620B shown in FIG. 20. The word line $WL_8$ includes landing pads 2772 and 2778 in the metal layer M1, vias 2782 and 2788 in the via layer via1 and a metal line 2796 in the metal layer M2. The metal line 2796 extends in length substantially along the X direction and is coupled to the vias 2748 and 2768 in the via layer via0 through the corresponding vias 2748 and 2788 and the corresponding landing pads 2772 and 2778. The landing pads 2772 and 2778, the vias 2782 and 2788 and the metal line 2796 correspond to the corresponding landing pads 2072 and 2078, vias 2082 and 2088 and metal line 2096 shown in FIG. 20. In some embodiments, the metal line 2070 of the higher power supply node CVdd is located in the metal layer M1, and the metal lines 2774 and 2776 of the lower power supply node CVss are located in the metal layer M1 to achieve capacitance reduction for the bit line $BL_1$ and the complementary bit line $BLB_1$.

Figure 29:
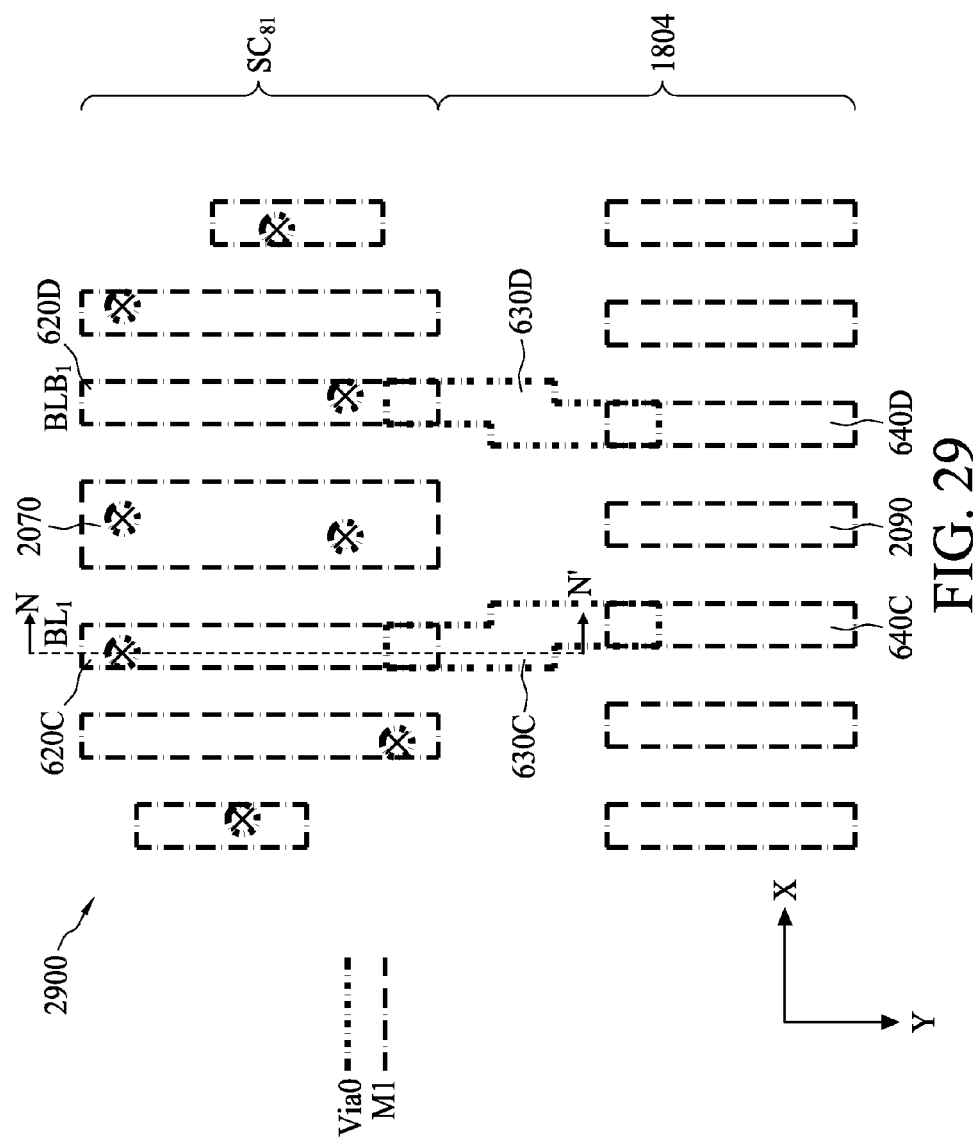
FIG. 29 is a diagram of the layout including the layers of the circuit upto the metal layer M1 in the BEOL portion shown in FIG. 30, in accordance with some embodiments.

FIG. 29 is a diagram of the layout 2900 including the layers of the circuit 1806 (shown in FIG. 19) upto the metal layer M1 in the BEOL portion 2906 shown in FIG. 30, in accordance with some embodiments. Compared to the layout 2200A shown in FIG. 22A, the BEOL portion for the array cell $SC_{81}$ of the layout 2900 is the obtained from the layout 2702 shown in FIG. 28 instead of from the layout 2002 shown in FIG. 21. The bit line $BL_1$ includes the metal line 620C, an end-to-end portion 630C and a metal line 640C. The metal line 620C, the end-to-end portion 630C and the metal line 640C correspond to the corresponding metal line 620A, end-to-end portion 630A and metal line 640A shown in FIG. 22A. The complementary bit line $BLB_1$ includes the metal line 620D, an end-to-end portion 630D and a metal line 640D. The metal line 620D, the end-to-end portion 630D and the metal line 640D correspond to the corresponding metal line 620B, the end-to-end portion 630B and the metal line 640B shown in FIG. 22A.

FIG. 30 is a diagram of a cross-section 2902 of the circuit 1806 (shown in FIG. 19) taken corresponding to line L-L' shown in FIG. 27, line M-M' shown in FIG. 28 and line N-N' shown in FIG. 29, in accordance with some embodiments. FIG. 30 illustrates the cross-section 2902 including both the FEOL portion 2904 and the BEOL portion 2906 of the circuit 1806. For simplicity, the structural elements in the cross section 2902 are labeled using the same reference numerals as the corresponding shapes in the layouts 2700, 2702 and 2900 in the corresponding FIGS. 27, 28 and 29.

The FEOL portion 2904 includes a substrate 2701, a dielectric isolation structure 2703, the gate structures 2722 and 2724 and the source or drain contacts 2734 and 2742. The dielectric isolation structure 2703 is formed over the substrate 2701. The gate structures 2722 and 2724 are formed over the dielectric isolation structure 2703. The source or drain contacts 2734 and 2742 are formed over the dielectric isolation structure 2703. The BEOL portion 2906 includes the via 2744 and the end-to-end portion 630C in the via layer via0, the metal line 620C in the metal layer M1 and the metal lines 2792 and 2796 in the metal layer M2. The via 2744 couples the metal line 620C to the contact 2742. The metal line 620C and the end-to-end portion 630C are similar to the corresponding metal line 120 and the end-to-end portion 130 described with reference to FIG. 3.

Figure 31:
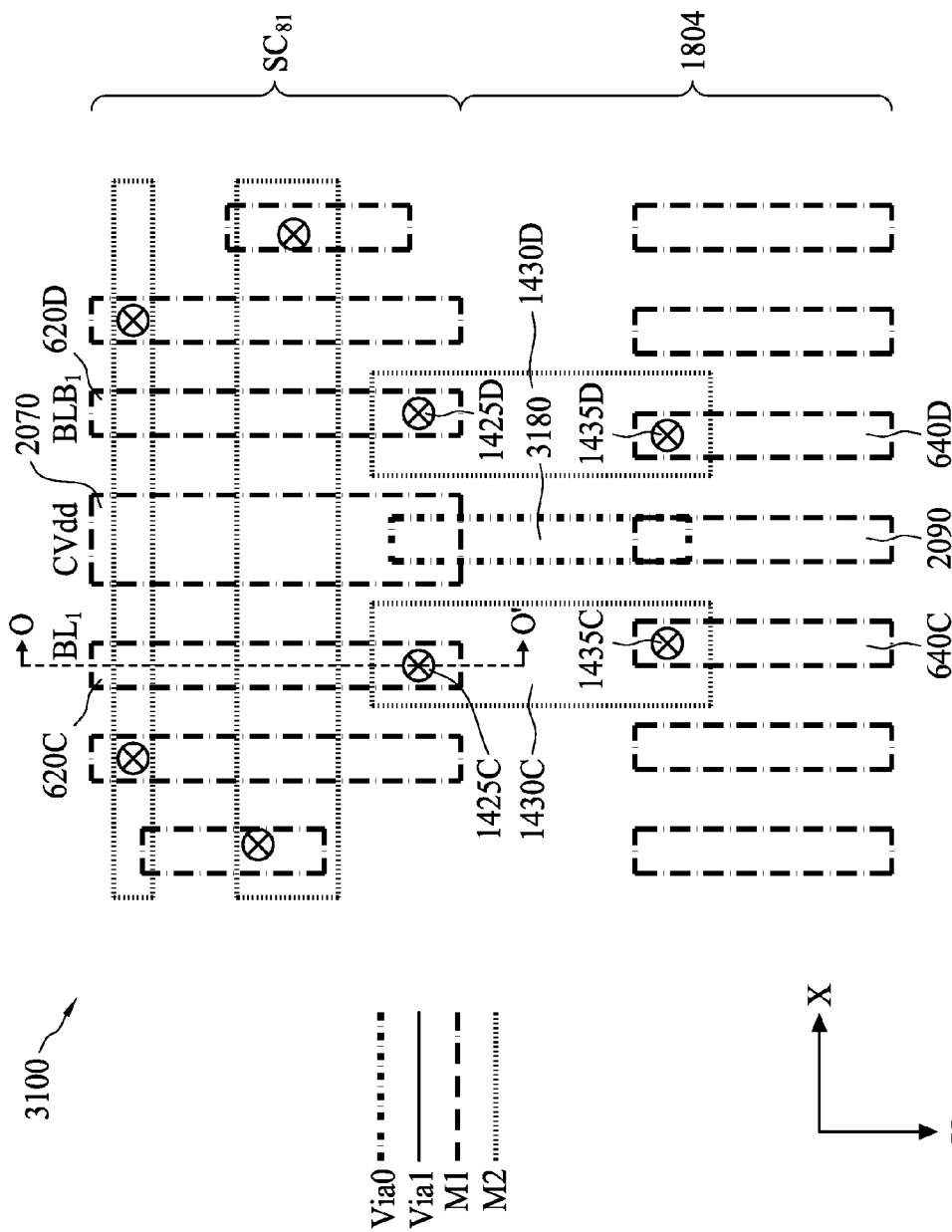
FIG. 31 is a diagram of an effective layout including the layers of the circuit upto the metal layer M2 in the BEOL portion shown in FIG. 33, in accordance with some embodiments.
Figure 32:
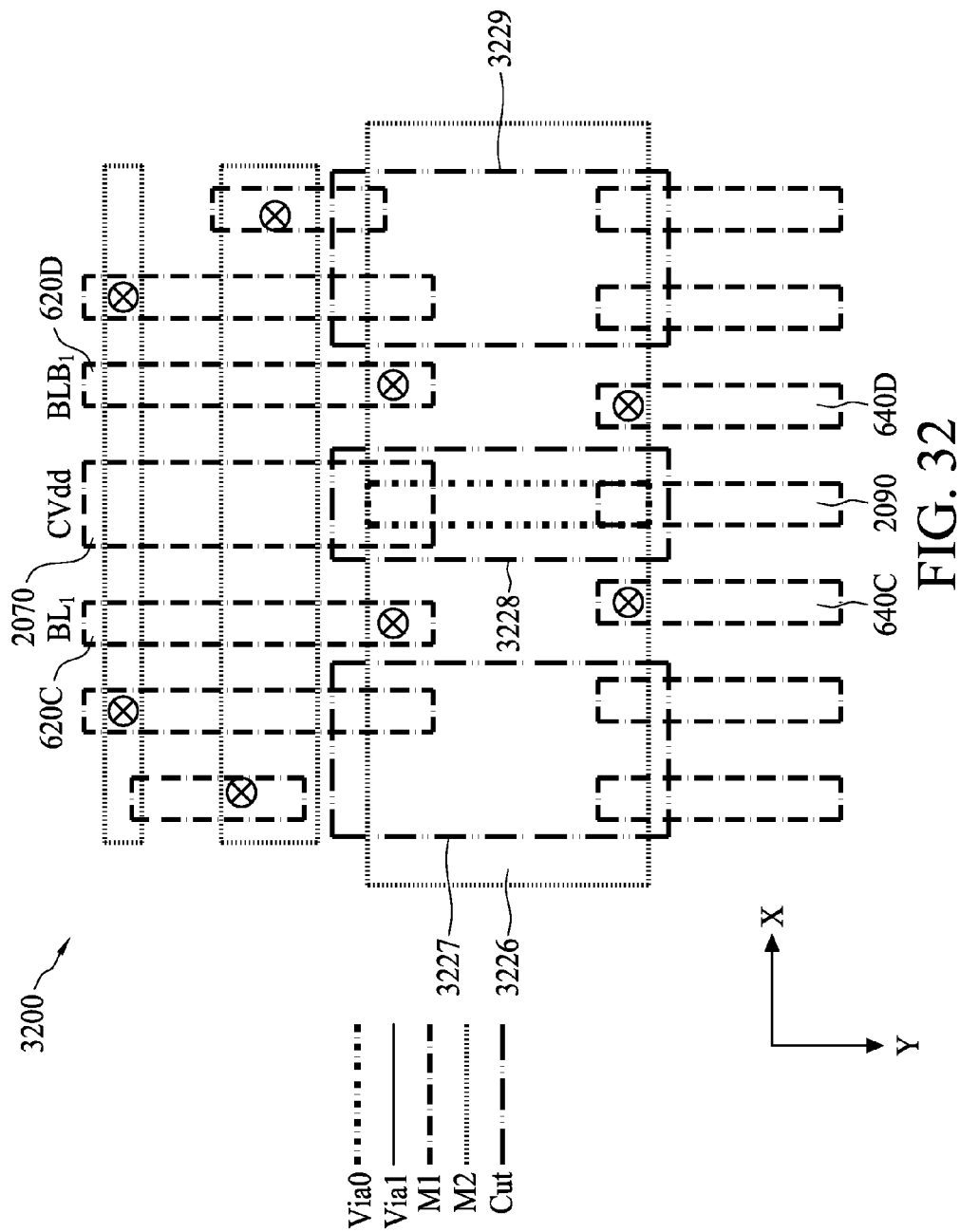
FIG. 32 is a diagram of an actual layout from which the effective layout shown in FIG. 31 is obtained, in accordance with some embodiments.
Figure 33:
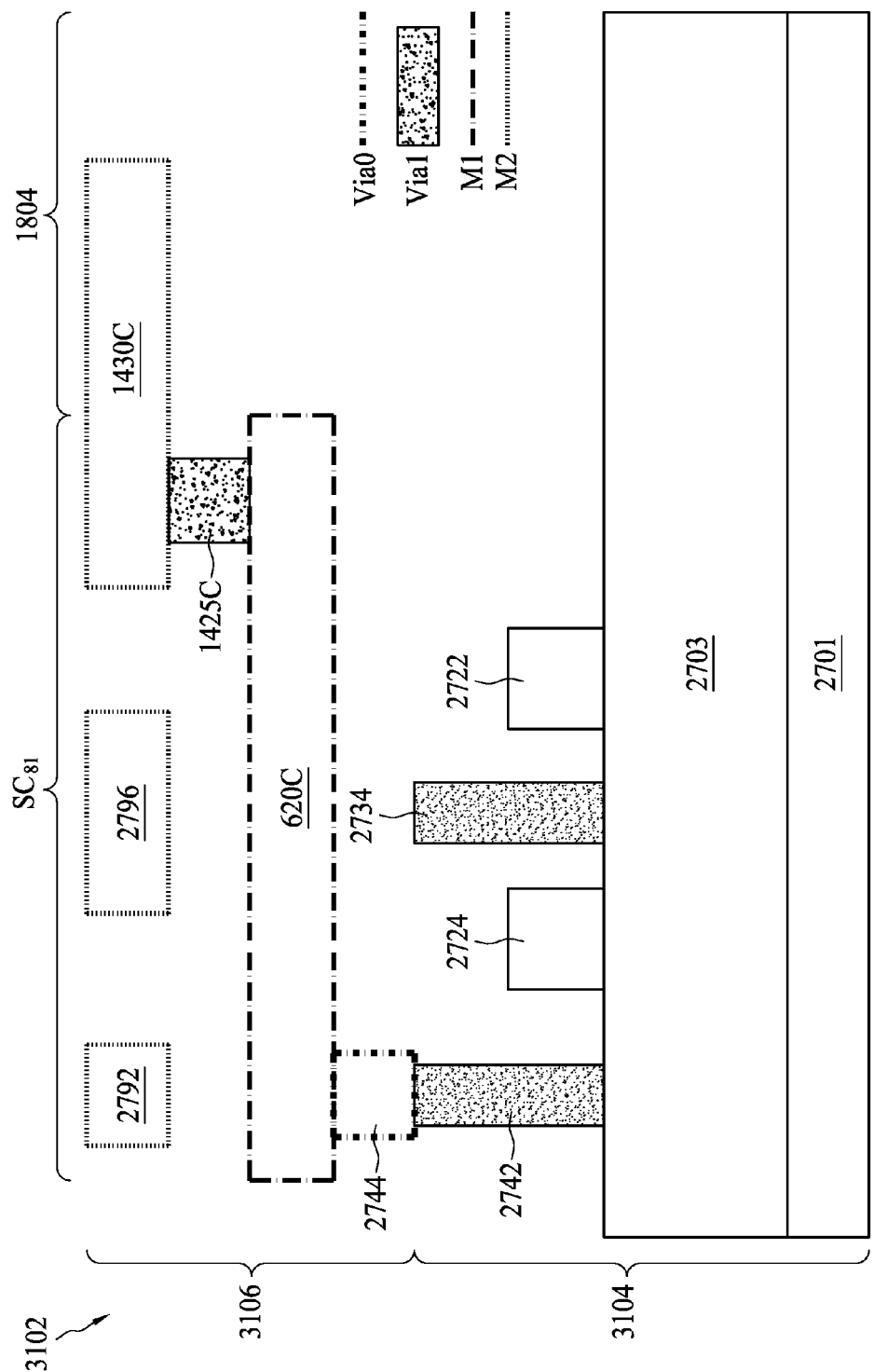
FIG. 33 is a diagram of the cross-section of the circuit taken corresponding to line L-L' shown in FIG. 27, line M-M' shown in FIG. 28 and line O-O' shown in FIG. 31, in accordance with some embodiments.

FIG. 31 is a diagram of an effective layout 3100 including the layers of the circuit 1806 (shown in FIG. 19) upto the metal layer M2 in the BEOL portion 3106 shown in FIG. 33, in accordance with some embodiments. The effective layout 3100 shows the metal layer M2 as a difference result of a metal layer M2 and a cut layer in an actual layout shown in FIG. 32. Compared to the layout 2900 shown in FIG. 29, the bit line $BL_1$ includes an end-to-end portion 1430C in the metal layer M2 and vias 1425C and 1435C in the via layer via1 for coupling the metal lines 620C and 640C together. The complementary bit line $BLB_1$ includes an end-to-end portion 1430D in the metal layer M2 and vias 1425D and 1435D in the via layer via1 for coupling the metal lines 620D and 640D together. Furthermore, the higher power supply node CVdd includes the metal lines 2070 and 2090 in the metal layer M1, and an end-to-end portion 3180 in the via layer via0 overlapping with the metal lines 2070 and 2090. The structural elements formed by the metal lines 620C and 640C, the end-to-end portion 1430C, the vias 1425C and 1435C, the metal lines 2070 and 2090, and the end-to-end portion 3180 are similar to the corresponding metal lines 120 and 140, end-to-end portion 1030, vias 1025 and 1035, metal lines 170 and 190 and end-to-end portion 180 described with reference to FIG. 17. The structural elements formed by the metal lines 620D and 640D, the end-to-end portion 1430D, the vias 1425D and 1435D, the metal lines 2070 and 2090, and the end-to-end portion 3180 are similar to the corresponding metal lines 120 and 140, end-to-end portion 1030, vias 1025 and 1035, metal lines 170 and 190 and end-to-end portion 180 described with reference to FIG. 17 except inverted in the X direction. In some embodiments, the metal lines 620C and 640C of the bit line $BL_1$ and the metal lines 620D and 640D of the complementary bit line $BLB_1$ are implemented in the metal layer M1 or the lowest level metal layer that is thinner among interconnect layers for reducing capacitance on the bit line $BL_1$ and the complementary bit line $BLB_1$.

FIG. 32 is a diagram of an actual layout 3200 from which the effective layout 3100 shown in FIG. 31 is obtained, in accordance with some embodiments. A metal line 3226 extending in length substantially along the X direction to overlap with the metal lines 620C and 620D and cut by cut lines 3227 and 3228 on opposite sides of the metal lines 620C and 640C effectively constitute the end-to-end portion 1430C. Similarly, the metal line 3226 cut by the cut line 3228 and a cut line 3229 on opposite sides of the metal lines 620D and 640D effectively constitute the end-to-end portion 1430D. The metal lines 620C and 640C, the metal line 3226, and the cut lines 3227 and 3228 are similar to the corresponding metal lines 620 and 640, metal line 1426 and cut lines 1427 and 1428 shown in FIG. 14. The metal lines 620D and 640D, the metal line 3226, and the cut lines 3228 and 3229 are similar to the corresponding metal lines 620 and 640, metal line 1426 and cut lines 1427 and 1428 shown in FIG. 14 except inverted in the X direction.

FIG. 33 is a diagram of the cross-section 3102 of the circuit 1806 (shown in FIG. 19) taken corresponding to line L-L' shown in FIG. 27, line M-M' shown in FIG. 28 and line O-O' shown in FIG. 31, in accordance with some embodiments. Compared to the cross-section 2902 shown in FIG. 30, the cross-section 3102 includes the end-to-end portion 1430C over and coupled to the metal line 620C with a via 1425C instead of the end-to-end portion 630C under and coupled to the metal line 620C directly. The metal line 620C, the via 1425C and the end-to-end portion 1430C are similar to the corresponding metal line 120, via 1025 and end-to-end portion 1030 described with reference to FIG. 12.

Dual-Port SRAM Macro

Figure 34:
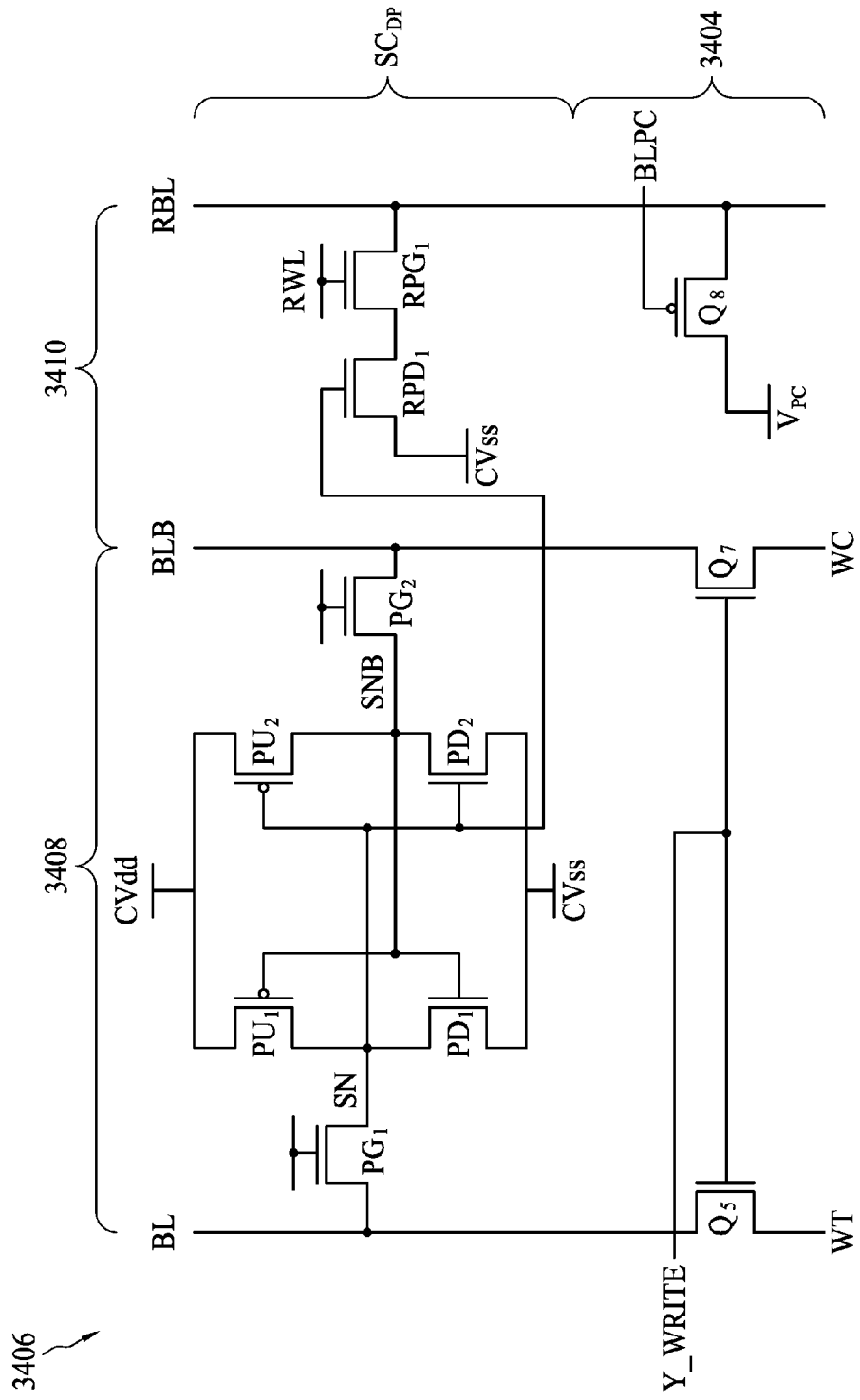
FIG. 34 is a circuit diagram of a circuit that includes a dual-port SRAM cell and a corresponding portion of an IO circuit, in accordance with some embodiments.

FIG. 34 is a circuit diagram of a circuit 3406 that includes a dual-port SRAM cell $SC_{DP}$ and a corresponding portion of an IO circuit 3404, in accordance with some embodiments. Compared to the single-port cell $SC_{S1}$ in the circuit 1806 shown in FIG. 19, the dual-port SRAM cell $SC_{DP}$ includes a portion 3408 which is substantially similar to the single-port cell $SC_{S1}$ in the circuit 1806 and a portion 3410 which is not included in the circuit 1806. The portion 3408 includes an input data line WT and a complementary input data line WC for writing and the portion 3410 includes a read bit line RBL for reading Types of an accessing line also includes the read bit line such as the read bit line RBL. Elements in the portion 3408 that are the same as the elements in the circuit 1806 are labeled using the same reference numerals. The portion 3410 of the array cell $SC_{DP}$ further includes an N-FET $RPD_1$ and an N-FET $RPG_1$. The N-FET $RPD_1$ has a gate coupled to the storage node SN, a source coupled to the lower power supply node CVss and a drain coupled to a first source or drain of the N-FET $RPG_1$. The N-FET $RPG_1$ has a gate coupled to a read word line RWL, the first source or drain coupled to the drain of the N-FET $RPD_1$ and the second source or drain coupled to the read bit line RBL. Compared to the IO circuit 1804 in the circuit 1806, the IO circuit 3404 in the circuit 3406 does not include the P-FETs $Q_1$ to $Q_6$ for the portion 3408 and includes a P-FET $Q_8$ for the portion 3410. A gate of the P-FET $Q_8$ is coupled to a control line BLPC, a source of the P-FET $Q_8$ is coupled to a pre-charge voltage $V_{PC}$ and a drain of the P-FET $Q_8$ is coupled to the read bit line RBL. During a pre-charge operation before a read operation, a signal at the control line BLPC turns on the P-FET $Q_8$ to pre-charge the read bit line RBL.

Figure 35:
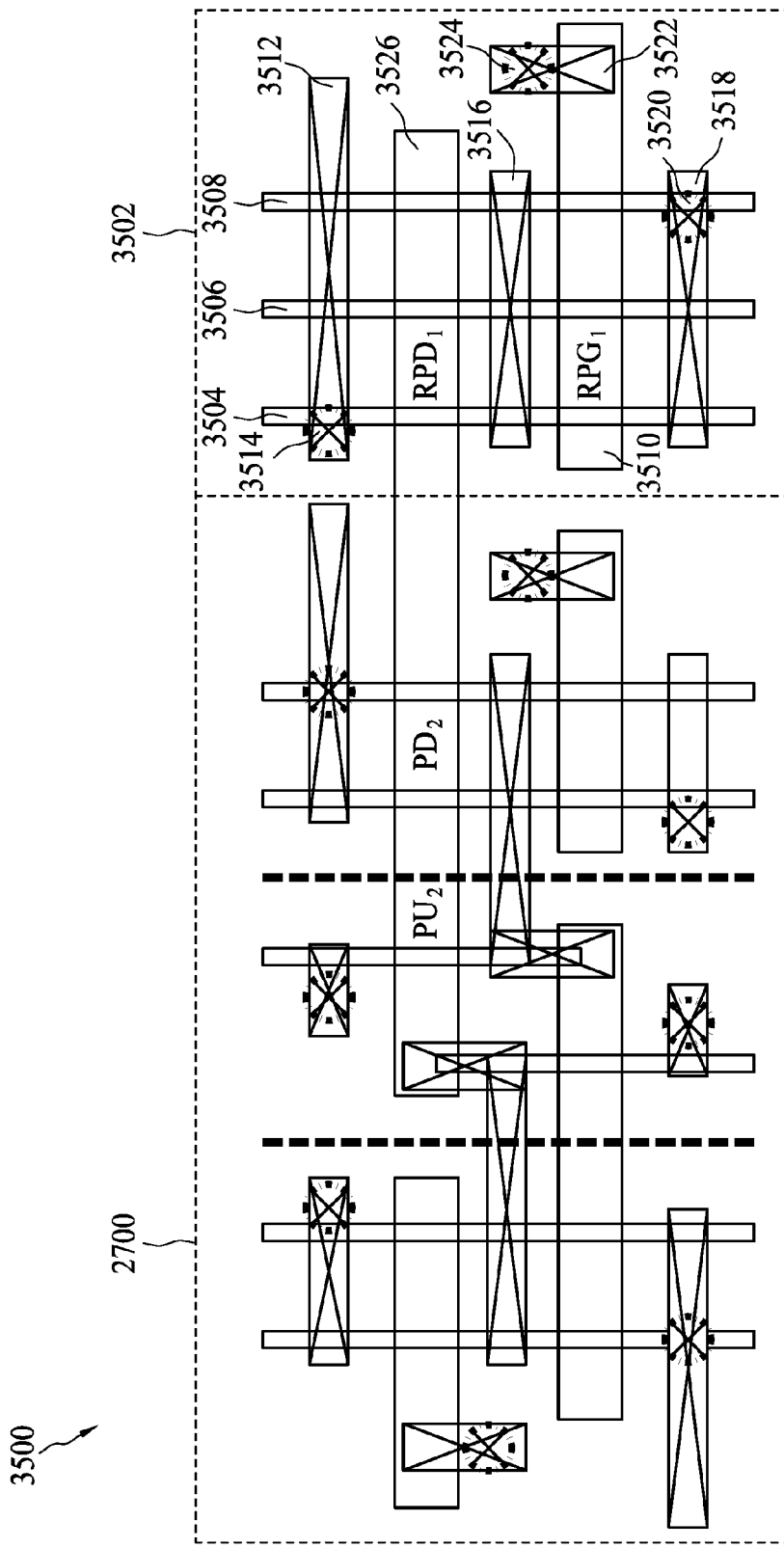
FIG. 35 is a diagram of a layout including layers of the array cell in the FEOL portion shown in FIG. 30 and the via layer via0 of the array cell in the BEOL portion shown in FIG. 30, in accordance with some embodiments.

FIG. 35 is a diagram of a layout 3500 including layers of the array cell $SC_{DP}$ (indicated in FIG. 34) in an FEOL portion similar to the FEOL portion 2904 shown in FIG. 30 and a via layer via0 of the array cell $SC_{DP}$ in a BEOL portion similar to the BEOL portion 2906 shown in FIG. 30, in accordance with some embodiments. The layout 3500 includes a layout 2700 as shown in FIG. 27 for the portion 3408 of the array cell $SC_{DP}$ and a layout 3502 for the portion 3410 of the array cell $SC_{DP}$. In the layout 3500, a gate structure 3526 corresponding to the gate structure 2726 for the P-FET $PU_2$ and the N-FET $PD_2$ is extended in length from the layout 2700 into the layout 3502 to serve also as a gate structure for the N-FET $RPD_1$. In the layout 3502, for the N-FET $RPD_1$, the gate is formed by the gate structure 3526 traversing the fin structures 3504, 3506 and 3508. The source is formed by source regions for the N-FET $RPD_1$ in the fin structures 3504, 3506 and 3508 that are on one side of the gate structure 3526 and are coupled by a contact 3512. The drain is formed by drain regions for the N-FET $RPD_1$ in the fin structures 3504, 3506 and 3508 that are on the other side of the gate structure 3526 and are coupled by a contact 3516. The lower power supply node CVss is coupled to a via 3514 in the via layer via0 which in turn is coupled to the contact 3512. For the N-FET $RPG_1$, the gate is formed by the gate structure 3510 traversing the fin structures 3504, 3506 and 3508. The read word line RWL is coupled to the gate structure 3510 through a via 3524 in the via layer via0 and a contact 3522. The first source or drain is formed by first source or drain regions for the N-FET $RPG_1$ in the fin structures 3504, 3506 and 3508 that are on one side of the gate structure 3510 and are shared with the drain regions for the N-FET $RPD_1$ in the fin structures 3504, 3506 and 3508. The second source or drain is formed by second source or drain regions for the N-FET $RPG_1$ in the fin structures 3504, 3506 and 3508 that are on the other side of the gate structure 3510 and are coupled together by the contact 3518. The read bit line RBL is coupled to a via 3520 in the via layer via0 which in turn is coupled to the contact 3518.

Figure 36:
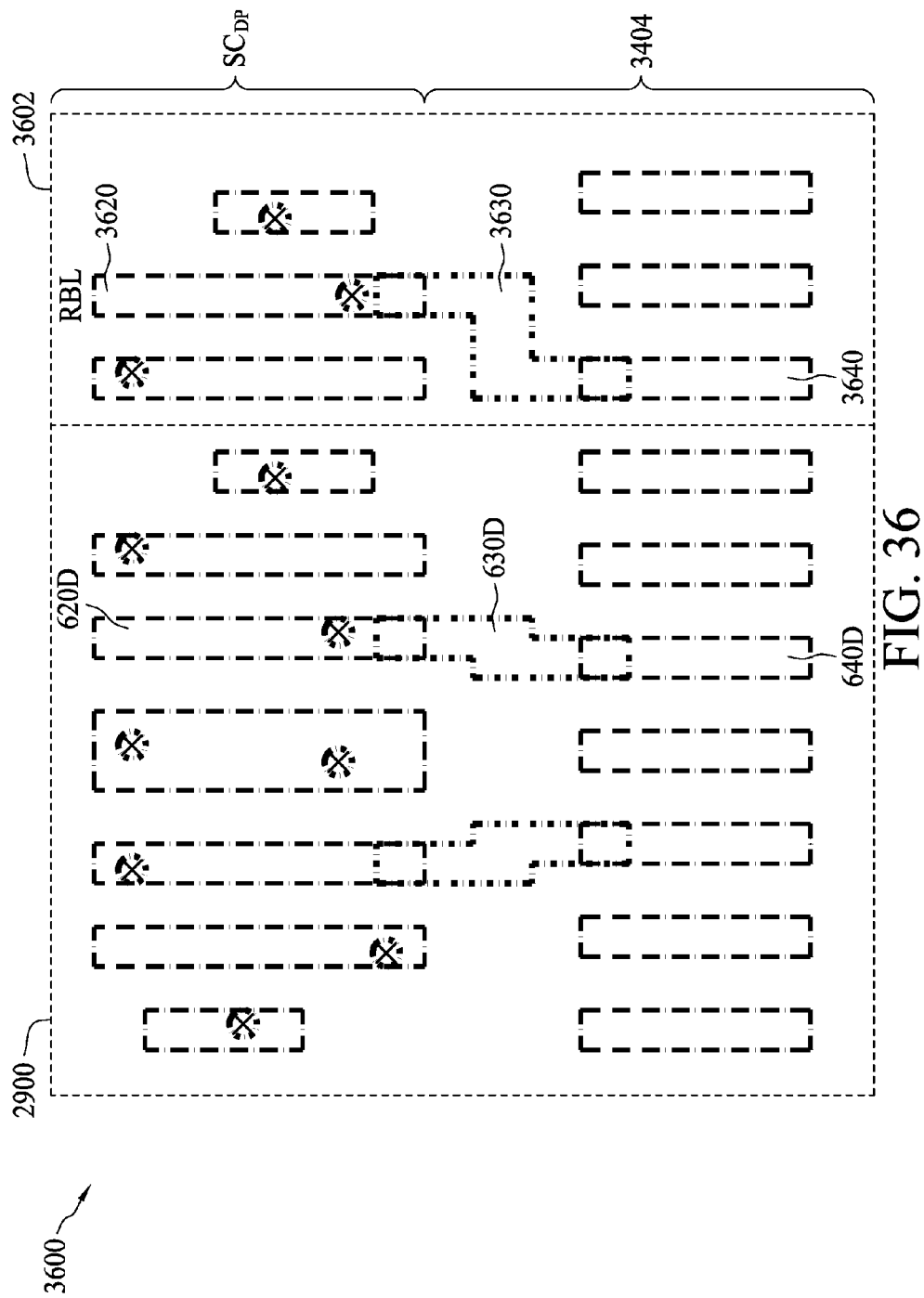
FIG. 36 is a diagram of a layout of the circuit shown in FIG. 34, in accordance with some embodiments.

FIG. 36 is a diagram of a layout 3600 of the circuit 3406 shown in FIG. 34, in accordance with some embodiments. The layout 3600 includes a layout 2900 as shown in FIG. 29 for the portion 3408 and a layout 3602 for the portion 3410. The layout 3410 includes a portion for the array cell $SC_{EP}$ and a portion for the IO circuit 3404. The read bit line RBL includes a metal line 3620 in the portion for the array cell $SC_{EP}$, a metal line 3640 in the portion for the IO circuit 3404 and an end-to-end portion 3630. The metal lines 3620 and 3640 and the end-to-end portion 3630 are similar to the corresponding metal lines 620D and 640D and the end-to-end portion 630D in the layout 2900 in FIG. 29.

Figure 37:
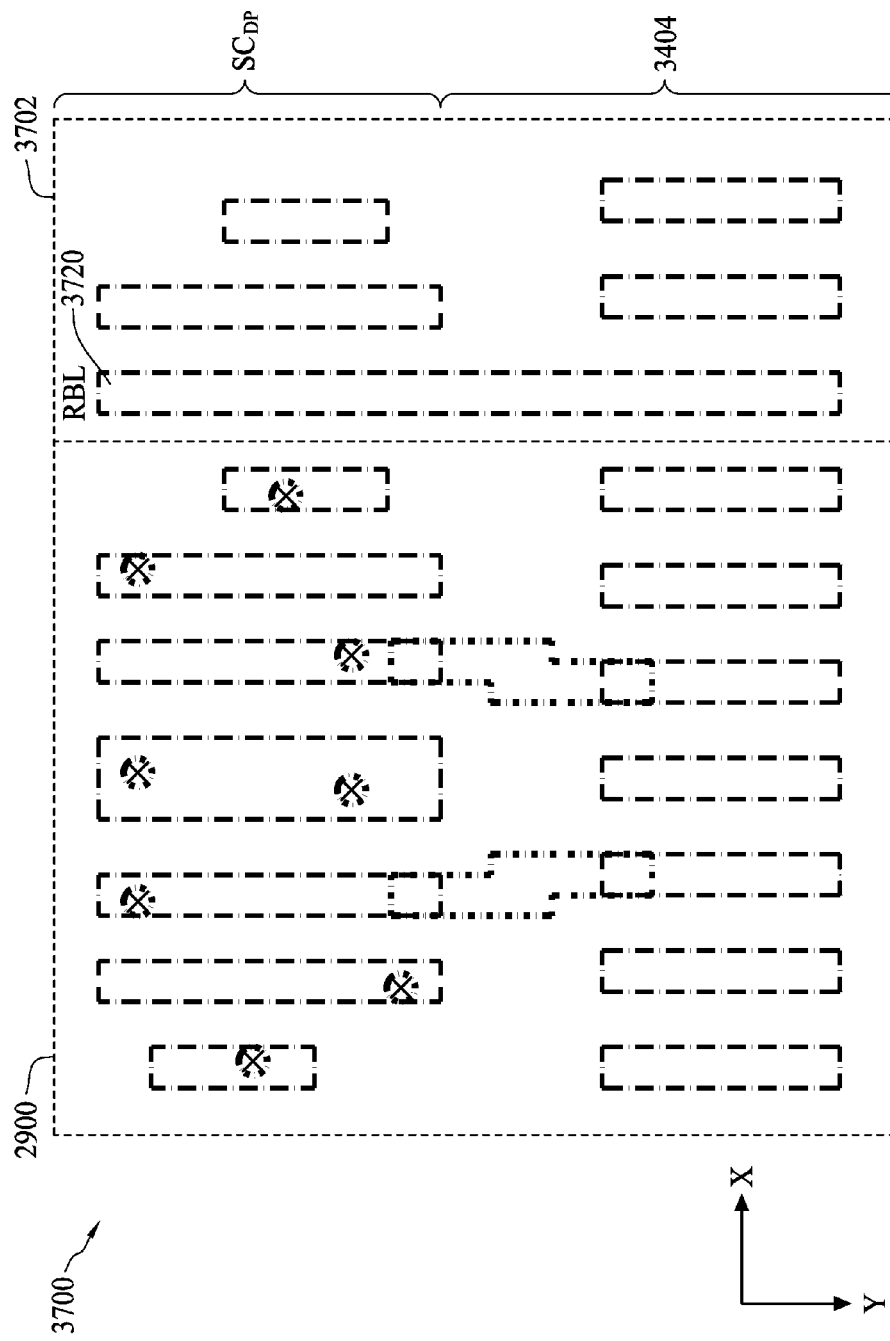
FIG. 37 is a diagram of a layout of the circuit shown in FIG. 34, in accordance with other embodiments.

FIG. 37 is a diagram of a layout 3700 of the circuit 3406 shown in FIG. 34, in accordance with other embodiments. Compared to the layout 3600 shown in FIG. 36, a layout 3702 for the portion 3410 has the read bit line RBL that includes a metal line 3720 extending substantially along the Y direction from the portion for the array cell $SC_{DP}$ to the portion for the IO circuit 3404.

Each SRAM macro has a vertical line implemented using any interconnect structure described with reference to FIGS. 1 to 15D. For example, a vertical line is a bit line $BL_1$, a complementary bit line $BLB_1$ or a read bit line RBL. The vertical line includes misaligned metal lines in a portion of an array cell and a portion of an IO circuit. Other SRAM macros with horizontal lines implemented using an interconnect structure similar to any interconnect structure described with reference to FIGS. 1 to 15D are within the contemplated scope of the present disclosure. For example, a horizontal line is a word line $WL_8$ described with reference to FIGS. 18 and 19. The horizontal line includes misaligned metal lines in a portion of array cells and a portion of a word line decoding circuit. Furthermore, each SRAM macro has P-FETs and N-FETs formed using the FinFETs having the horizontal running fin structures. Other SRAM macros such as those using gate-all-around FETs with horizontal or vertical running nanowires are within the contemplated scope of the present disclosure. In addition, other circuits having vertical lines or horizontal lines using any interconnect structure described with reference to FIGS. 1 to 17 are within the contemplated scope of the present disclosure.

Other circuits include, for example, circuit arrays having a logic array, a dynamic random access memory (DRAM) macro, a pixel array, etc.

Some embodiments have one or a combination of the features and/or advantages described. A layout of a circuit such as an SRAM macro includes an on-grid portion such as an accessing circuit with metal lines routed on-grid to save execution time of OPC and an not on-grid portion such as an array of array cells with metal line routed not on-grid to save chip area. In addition, the metal lines routed on-grid can achieve optimized circuit speed or circuit density. Examples of metal lines in the SRAM macro extending across the on-grid portion and the not on-grid portion include bit line pairs and word lines. In other approaches, to connect metal lines misaligned due to routed on-grid and routed not on-grid, bent or jog metal routing is used. However, for advanced technology nodes, because of spacer lithography process limitations, the metal lines for the not on-grid portion are routed based on restrictive routing rules that require the metal lines to be unidirectional with a fixed and tight metal pitch, and prohibit bent or jog metal routing. Therefore, the metal lines for the on-grid portion are unable to be directly connected to the metal lines for the not on-grid portion. As a result, in some embodiments, misaligned metal lines in a first interconnect layer are coupled by a connection structure including an end-to-end portion in a second interconnect layer under or over the first interconnect layer. Therefore, the misaligned metal lines in the first interconnect layer still comply with the restrictive routing rules to accommodate to the limitations in the lithography tools while the benefit of area saving by not on-grid routing in the first interconnect layer is preserved. Furthermore, in some embodiments, the end-to-end portion implemented under the first interconnect layer is a single damascene via. In some embodiments, the end-to-end portion has a bent shape. In some embodiments, the resistance of the end-to-end portion is reduced by extending the misaligned metal lines toward each other such that the end-to-end portion is overlapped with portions of the misaligned metal lines extended beyond corresponding adjacent metal lines, and widening widths of the end-to-end portion at where it overlapped with the misaligned metal lines. In some embodiments, the resistance of the end-to-end portion is reduced by adding an additional portion in an interconnect layer different from the first interconnect layer and the second interconnect layer and coupling the additional portion to the end-to-end portion. In some embodiments, the end-to-end portion has a rectangular shape. In some embodiments, the end-to-end portion implemented over the interconnect layer is a metal line coupled to the misaligned metal lines with vias interposed therebetween.

In some embodiments, an interconnect structure includes a first metal line, a second metal line and a first connection structure. The first metal line is formed in a first interconnect layer, extends in length substantially along a first direction and ends at a first end portion. The second metal line is formed in the first interconnect layer, starts from a second end portion and extends in length substantially along the first direction. The second metal line is misaligned with the first metal line in the first direction. The first connection structure couples the first metal line to the second metal line. The first connection structure includes a first end-to-end portion formed in a second interconnect layer different from the first interconnect layer, and is overlapped with the first end portion and the second end portion.

In some embodiments, a circuit includes an array cell, an accessing circuit and a first connection structure. The array cell includes a first metal line formed in a first interconnect layer and extending substantially along a first direction. The accessing circuit is configured to access the array cell and includes a second metal line formed in the first interconnect layer and extending substantially along the first direction. The first connection structure coupling the first metal line to the second metal line using a second interconnect layer different from the first interconnect layer. The coupled first metal line, second metal line and first connection structure serve as an accessing line of the array cell.

In some embodiments, a layout includes a first interconnect layer and a second interconnect layer. The first interconnect layer includes a first metal line and a second metal line. The first metal line extends in length substantially along a first direction and ends at a first end portion. The second metal line starts from a second end portion, extends in length substantially along the first direction. The second metal line is misaligned with the first metal line in the first direction. The second interconnect layer is different from the first interconnect layer. The second interconnect layer includes a first shape overlapping with the first end portion and the second end portion.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. An interconnect structure, comprising:
   a first metal line formed in a first interconnect layer, extending in length substantially along a first direction and ending at a first end portion;
   a second metal line formed in the first interconnect layer, starting from a second end portion, extending in length substantially along the first direction and misaligned with the first metal line in the first direction; and
   a first connection structure coupling the first metal line to the second metal line,
   wherein
      the first connection structure comprises a first end-to-end portion formed in a second interconnect layer different from the first interconnect layer, and being overlapped with the first end portion and the second end portion.

2. The interconnect structure of claim 1, wherein the first end-to-end portion is a single damascene via.

3. The interconnect structure of claim 1, wherein the first connection structure further comprises an additional portion formed in a layer different from the first interconnect layer and the second interconnect layer and coupled to the first end-to-end portion.

4. The interconnect structure of claim 3, wherein the additional portion has a rectangular shape having width across a width of the first metal line and a width of the second metal line.

5. The interconnect structure of claim 1, wherein
   the first end-to-end portion has a shape comprising a first edge and a second edge opposite to each other;
   the first edge has a first corner and the second edge has a second corner;
   the first corner being bent from substantially along the first direction to substantially along a second direction substantially orthogonal to the first direction; and
   the second corner being bent from substantially along the first direction to substantially along the second direction.

6. The interconnect structure of claim 5, wherein
   the first edge further has a third corner and the second edge further has a fourth corner;
   the third corner being bent from substantially along the second direction to substantially along the first direction; and
   the fourth corner being bent from substantially along the second direction to substantially along the first direction.

7. The interconnect structure of claim 5, wherein
   a width between portions of the first edge and the second edge along the first direction is not substantially wider than a width of one of the first end portion and the second end portion overlapped with a portion of the shape defined by the portions of the first edge and the second edge.

8. The interconnect structure of claim 5, further comprising:
   a third metal line formed in the first interconnect layer, extending in length substantially along the first direction and adjacent to one of the first metal line and the second metal line,
   wherein
      one of the first end portion and the second end portion corresponding to the one of the first metal line and the second metal line and overlapped with a portion of the shape defined by portions of the first edge and the second edge along the first direction is not beyond the third metal line in the first direction.

9. The interconnection structure of claim 1, further comprising:
   a third metal line formed in the first interconnect layer and adjacent to the first metal line, and extending in length substantially along the first direction;
   a fourth metal line formed in the first interconnect layer and adjacent to the second metal line, extending in length substantially along the first direction and aligned to the third metal line in the first direction; and
   a second connection structure coupling the third metal line to the fourth metal line using a third interconnect layer different from the first interconnect layer and the second interconnect layer.

10. A semiconductor chip, comprising:
    an array cell comprising:
       a first metal line formed in a first interconnect layer and extending substantially along a first direction;
    an accessing circuit configured to access the array cell and comprising:
       a second metal line formed in the first interconnect layer and extending substantially along the first direction; and
    a first connection structure coupling the first metal line to the second metal line using a second interconnect layer different from the first interconnect layer, wherein the coupled first metal line, second metal line and first connection structure serve as an accessing line of the array cell.

11. The semiconductor chip of claim 10, wherein
the first connection structure comprises a first end-to-end portion formed in the second interconnect layer; and
the first end-to-end portion is overlapped with the first metal line and the second metal line.

12. The semiconductor chip of claim 11, wherein
the first connection structure further comprises an additional portion formed in a layer different from the first interconnect layer and the second interconnect layer and coupled to the first end-to-end portion.

13. The semiconductor chip of claim 12, wherein
the additional portion has a rectangular shape having width across a width of the first metal line and a width of the second metal line.

14. The semiconductor chip of claim 11, wherein the first end-to-end portion has a shape comprising a first edge and a second edge opposite to each other;
the first edge has a first corner and the second edge has a second corner;
the first corner being bent from substantially along the first direction to substantially along a second direction substantially orthogonal to the first direction; and
the second corner being bent from substantially along the first direction to substantially along the second direction.

15. The semiconductor chip of claim 14, wherein
the first edge further has a third corner and the second edge further has a fourth corner;
the third corner being bent from substantially along the second direction to substantially along the first direction; and
the fourth corner being bent from substantially along the second direction to substantially along the first direction.

16. The semiconductor chip of claim 14, wherein
a width between portions of the first edge and the second edge along the first direction is not substantially wider than a width at where one of the first metal line and the second metal line is overlapped with a portion of the shape defined by the portions of the first edge and the second edge.

17. The semiconductor chip of claim 14, wherein
a third metal line formed in the first interconnect layer, extending in length substantially along the first direction and adjacent to one of the first metal line and the second metal line,
wherein
a portion of the one of the first metal line and the second metal line at where the one of the first metal line and the second metal line is overlapped with a portion of the shape defined by portions of the first edge and the second edge along the first direction is not beyond the third metal line in the first direction.

18. The semiconductor chip of claim 10, wherein
the first connection structure comprises a single damascene via which is overlapped with the first metal line and the second metal line.

19. The semiconductor chip of claim 10, wherein
the array cell further comprises a third metal line formed in the first interconnect layer and extending substantially along the first direction;
the accessing circuit further comprises a fourth metal line formed in the first interconnect layer and extending substantially along the first direction; and
the circuit further comprises a second connection structure coupling the third metal line to the fourth metal line using a third interconnect layer different from the first interconnect layer and the second interconnect layer for forming a power supply node for the array cell.

20. A layout, comprising:
a first interconnect layer comprising:
a first metal line extending in length substantially along a first direction and ending at a first end portion;
a second metal line starting from a second end portion, extending in length substantially along the first direction and misaligned with the first metal line in the first direction; and
a second interconnect layer different from the first interconnect layer, wherein the second interconnect layer comprises:
a first shape overlapping with the first end portion and the second end portion.

21. The layout of claim 20, wherein
the first shape is a single shape overlapping with both the first end portion and the second end portion.

22. The layout of claim 20, further comprising:
an additional shape formed in a layer different from the first interconnect layer and the second interconnect layer and overlapped with the first shape.

23. The layout of claim 20, wherein
the first shape comprises a first edge and a second edge opposite to each other;
the first edge has a first corner and the second edge has a second corner;
the first corner being bent from substantially along the first direction to substantially along a second direction substantially orthogonal to the first direction; and
the second corner being bent from substantially along the first direction to substantially along the second direction.

24. The layout of claim 20, wherein
the first edge further has a third corner and the second edge further has a fourth corner;
the third corner being bent from substantially along the second direction to substantially along the first direction; and
the fourth corner being bent from substantially along the second direction to substantially along the first direction.

* * * * *